(12) United States Patent
Sasaki et al.

(10) Patent No.: US 7,108,951 B2
(45) Date of Patent: Sep. 19, 2006

(54) PHOTOSENSITIVE RESIN COMPOSITION

(75) Inventors: Tomoya Sasaki, Shizuoka (JP); Kazuyoshi Mizutani, Shizuoka (JP); Shinichi Kanna, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/373,170

(22) Filed: Feb. 26, 2003

(65) Prior Publication Data

US 2004/0175645 A1    Sep. 9, 2004

(30) Foreign Application Priority Data

Feb. 26, 2002    (JP) ............... P. 2002-050031

(51) Int. Cl.
*G03F 7/039* (2006.01)
*G03F 7/038* (2006.01)

(52) U.S. Cl. .................. 430/270.1; 430/278.1; 430/176; 430/192; 430/197; 430/907; 430/914; 430/964

(58) Field of Classification Search ............... 430/907, 430/914, 270.1, 278.1, 176, 192, 197, 964
See application file for complete search history.

(56) References Cited

U.S. PATENT DOCUMENTS

| 5,039,594 | A | * | 8/1991 | Durham |
| 6,203,965 | B1 | * | 3/2001 | Cameron et al. |
| 6,468,712 | B1 | * | 10/2002 | Fedynyshyn ............ 430/270.1 |
| 6,509,134 | B1 | * | 1/2003 | Ito et al. ............... 430/907 |
| 6,756,179 | B1 | * | 6/2004 | Fujimori et al. |
| 2002/0081520 | A1 | * | 6/2002 | Soorlyakumaran et al. ...... 430/270.1 |

FOREIGN PATENT DOCUMENTS

| JP | 2002-322217 A | 11/2002 |
| WO | WO 00/17712 A1 | 3/2000 |
| WO | WO 01/37047 A | 5/2001 |
| WO | WO 03/006413 A1 | 1/2003 |

OTHER PUBLICATIONS

Kunz et al., "Experimental VUV Absorbance Study of Fluorine-Functionalized Polystyrenes", SPIE vol. 4345 (2001) pp. 285-295.
Ito et al., "Polymer design for 157 nm chemically amplified resists" SPIE vol. 4345 (2001) pp. 273-284.
H. Ito et al., "Novel Fluoropolymers for Use in 157 nm Lithography" vol. 14 (2001) pp. 583-593.
Fender et al., "Characterization of New Aromatic Polymers for 157 nm Photoresist Applications" SPIE vol. 4345 (2001) pp. 417-427.
Crawford et al., "New Materials for 157 nm Photoresists: Characterization and Properties" SPIE vol. 3999 (Feb. 28, 2000) pp. 357-364.
Bae et al., "Fluorocarbinol Containing Acrylic (CO)Polymers With High Transparency at 157 NM" (2001) Polymer Properties, 42(2) pp. 403-404.
European Search Report dated Nov. 5, 2003.

* cited by examiner

*Primary Examiner*—Richard L. Schilling
(74) *Attorney, Agent, or Firm*—Sughrue Mion, PLLC

(57) ABSTRACT

The photosensitive resin composition comprising:
 (A) a resin containing (A1) a repeating unit having at least two groups represented by the specific general formula; and
 (B) a compound capable of generating an acid by the action with one of an actinic ray and a radiation.

59 Claims, No Drawings

PHOTOSENSITIVE RESIN COMPOSITION

FIELD OF THE INVENTION

The present invention relates to a photosensitive resin composition that is suitably used for the micro-lithography process such as the manufacture of ULSIs and high-capacity microchips and other photo-fabrication processes. More particularly, the invention relates to a photosensitive resin composition capable of forming superfine patterns using vacuum ultraviolet light of 160 nm or less.

BACKGROUND OF THE INVENTION

In integrated circuits, the degree of integration increases more and more. In the manufacture of semiconductor substrates of ULSIs, etc., it has become necessary to undergo processing of hyperfine patterns having a line width of quarter microns or less. As means for making patterns fine, it is known to shorten the wavelength of an exposure light source to be used for the formation of resist patterns.

For example, in the manufacture of semiconductor elements having a degree of integration of up to 64 Mbits, i-rays (365 nm) of a high-pressure mercury vapor lamp have been used as a light source up to date. As a positive-working resist corresponding to this light source, many compositions containing a novolak resin and a naphthoquinone diazide compound as a photosensitive material have been developed, and sufficient results have been produced in fabrication of line widths of about 0.3 μm or more. Further, in the manufacture of semiconductor elements having a degree of integration of 256 Mbits or more, KrF excimer laser beams (248 nm) have been employed as the exposure light source in place of the i-rays.

In addition, for the purpose of manufacturing semiconductor elements having a degree of integration of 1 Gbits or more, in recent years, the use of ArF excimer laser beams (193 nm) and the use of $F_2$ excimer laser beams (157 nm) for the formation of patterns of 0.1 μm or less, both of which are a light source of shorter wavelengths, are being investigated.

Adaptive to shortening of the wavelengths of these light sources, the constitutional components of the resist materials and their chemical structures largely change.

As resist compositions for exposure by KrF excimer laser beams, there have been developed so-called chemically amplified resists that are a composition comprising a combination of, as a major component, a resin having poly(hydroxystyrene) having low absorption in a region of 248 nm as a basic skeleton and being protected by an acid-decomposable group and a compound capable of generating an acid upon irradiation with far ultraviolet rays (photo acid generator).

Further, as resist compositions for exposure by ArF excimer laser beams (193 nm), there have been developed chemically amplified resists using an acid-decomposable resin in which an alicyclic structure not having absorption at 193 nm is introduced into a main chain or side chains of the polymer.

It has become clear that as to $F_2$ excimer layer beams (157 nm), the foregoing alicyclic type resins have large absorption in a region of 157 nm and are insufficient for obtaining the desired patterns of 0.1 μm or less. On the other hand, *Proc. SPIE.*, Vol. 3678, p.13 (1999) reports that resins having a fluorine atom (perfluoro structure) introduced thereinto have sufficient transparency at 157 nm. Structures of effective fluorocarbon resins are proposed in, for example, *Proc. SPIE.*, Vol. 3999, p. 330 (2000), ibid., p. 357 (2000) and ibid., p. 365 (2000), and WO 00/17712, and resist compositions containing a fluorine-containing resin are being investigated.

However, these resins were not satisfactory in transparency at 157 nm and various other properties such as sensitivity and resolving power. Further, these resins involved a problem such that the coating properties are poor.

SUMMARY OF THE INVENTION

Accordingly, an object of the invention is to provide a photosensitive resin composition suitable for use of an exposure light source of 160 nm or less, especially $F_2$ excimer laser beams (157 nm) Specifically, an object of the invention is to provide a positive-working resin composition showing sufficient transparency during the use of a light source of 157 nm, having high sensitivity and high resolution, and having superior coating properties.

The present inventors paid to these various properties and made extensive and intensive investigations. As a result, it has been found that the object of the invention can be successfully achieved by the use of a composition as specified below, leading to accomplishment of the invention.

Specifically, the invention is configured as follows.

(1) The photosensitive resin composition comprising:
(A) a resin containing (A1) a repeating unit having at least two groups represented by the following general formula (Z), wherein the resin is alkali-soluble, or the resin is decomposed by the action of an acid to increase its solubility in an alkaline aqueous solution; and
(B) a compound capable of generating an acid by the action with one of an actinic ray and a radiation:

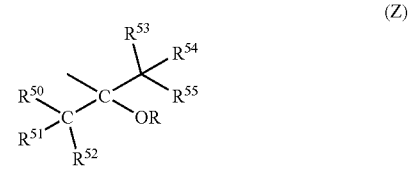

wherein $R^{50}$ to $R^{55}$ each independently represents a hydrogen atom, a fluorine atom, or an optionally substituted alkyl group, provided that at least one of $R^{50}$ to $R^{55}$ represents a fluorine atom or an alkyl group in which at least one hydrogen atom is substituted with a fluorine atom; and R represents a hydrogen atom or an organic group.

(2) The photosensitive resin composition according to (1) as above, wherein the repeating unit (A1) is represented by the following general formula (1), (2) or (3):

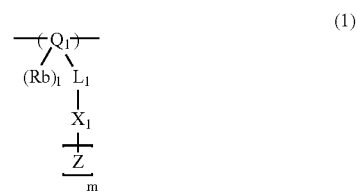

wherein $Q_1$ represents an alicyclic hydrocarbon group; $L_1$ represents a single bond or a connecting group; $X_1$ represents a connecting group having a valence of (m+1); $R_b$ represents a hydrogen atom, an optionally substituted organic group, or a halogen atom; l represents an integer of from 0 to 3; m represents an integer of 2 or more; and Z represents the group represented by the general formula (Z):

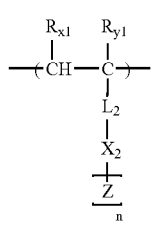
(2)

wherein, $R_{x1}$ and $R_{y1}$ each independently represents a hydrogen atom, a halogen atom, a cyano group, or an optionally substituted alkyl group; $L_2$ represents a single bond or a connecting group; $X_2$ represents a connecting group having a valence of (n+1); n represents an integer of 2 or more; and Z represents the group represented by the general formula (Z):

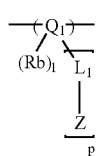
(3)

wherein, $Q_1$, $L_1$, Rb and l have the same meaning as shown in the general formula (1), p represents an integer of 2 or more; and Z represents the group represented by the general formula (Z).

(3) The photosensitive resin composition according to (1) as above, wherein the repeating unit (A1) is represented by the following general formula (2a):

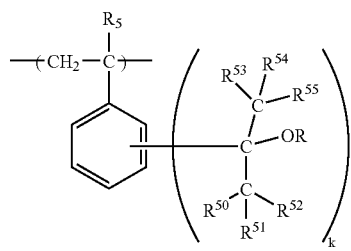
(2a)

wherein $R_5$ represents a hydrogen atom, a halogen atom, a cyano group, or an optionally substituted alkyl group; $R^{50}$ to $R^{55}$ each independently represents a hydrogen atom, a fluorine atom, or an optionally substituted alkyl group, provided that at least one of $R^{50}$ to $R^{55}$ represents a fluorine atom or an alkyl group in which at least one hydrogen atom is substituted with a fluorine atom; R independently represents a hydrogen atom or an organic group, provided that all of R do not represent a hydrogen atom simultaneously; and k represents an integer of from 2 to 5.

(4) The photosensitive resin composition according to (3) as above, wherein in the general formula (2a), at least one of the groups represented by R is an acid-decomposable group.

(5) The photosensitive resin composition according to (1) as above, wherein the repeating unit (A1) is represented by the following general formula (2a'):

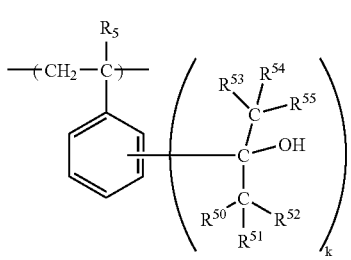
(2a')

wherein, $R_5$ represents a hydrogen atom, a halogen atom, a cyano group, or an optionally substituted alkyl group; $R^{50}$ to $R^{55}$ each independently represents a hydrogen atom, a fluorine atom, or an optionally substituted alkyl group, provided that at least one of $R^{50}$ to $R^{55}$ represents a fluorine atom or an alkyl group in which at least one hydrogen atom is substituted with a fluorine atom; and k represents an integer of from 2 to 5.

(6) The photosensitive resin composition according to (1) as above, comprising:

(X) a non-polymer type dissolution inhibitor; wherein the compound (B) is (B1) a compound capable of generating an aliphatic or aromatic sulfonic acid by the action with one of an actinic ray and a radiation, in which the aliphatic or aromatic sulfonic acid is substituted with at least one fluorine atom.

(7) The photosensitive resin composition according to (1) as above, wherein the resin (A) is a resin that is decomposed by the action of an acid to increase its solubility in an alkaline developing liquid, and the resin contains the repeating unit (A1) and a repeating unit having a group that is decomposed by the action of an acid to become alkali-soluble; and wherein the compound (B) is (B1) a compound capable of generating an aliphatic or aromatic sulfonic acid by the action with one of an actinic ray and a radiation, in which the aliphatic or aromatic sulfonic acid is substituted with at least one fluorine atom.

(8) The photosensitive resin composition according to (4) as above, wherein the compound (B) is (B1) a compound capable of generating an aliphatic or aromatic sulfonic acid by the action with one of an actinic ray and a radiation, in which the aliphatic or aromatic sulfonic acid is substituted with at least one fluorine atom.

(9) The photosensitive resin composition according to (1) as above, further comprising (C) a solvent.

(10) The photosensitive resin composition according to (6) as above, wherein the resin (A) is a resin containing a repeating unit represented by the following general formula (2a) and at least one of repeating units represented by the following general formulae (I) and (VI):

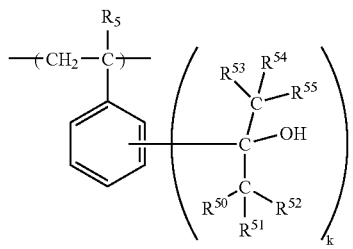

(2a')

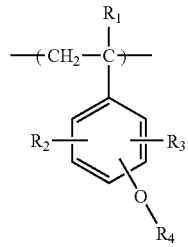

(I)

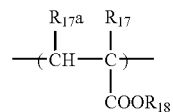

(VI)

wherein $R_5$ represents a hydrogen atom, a halogen atom, a cyano group, or an optionally substituted alkyl group; $R^{50}$ to $R^{55}$ each independently represents a hydrogen atom, a fluorine atom, or an optionally substituted alkyl group, provided that at least one of $R^{50}$ to $R^{55}$ represents a fluorine atom or an alkyl group in which at least one hydrogen atom is substituted with a fluorine atom; R independently represents a hydrogen atom or an organic group, provided that all of R do not represent a hydrogen atom simultaneously; and k represents an integer of from 2 to 5, $R_1$ represents a hydrogen atom, a halogen atom, a cyano group, or an optionally substituted alkyl group; $R_2$ and $R_3$ each independently represents a hydrogen atom, a halogen atom, a cyano group, a hydroxyl group, an optionally substituted alkyl group, an optionally substituted cycloalkyl group, an optionally substituted alkoxy group, an optionally substituted acyl group, an optionally substituted acyloxy group, an optionally substituted alkenyl group, an optionally substituted aryl group, or an optionally substituted aralkyl group; and R4 represents a group of the following general formula (IV) or (V):

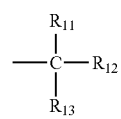

(IV)

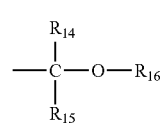

(V)

wherein $R_{11}$, $R_{12}$, and $R_{13}$ each independently represents an optionally substituted alkyl group, an optionally substituted cycloalkyl group, an optionally substituted alkenyl group, an optionally substituted aralkyl group, or an optionally substituted aryl group.

In the formula (V), $R_{14}$ and $R_{15}$ each independently represents a hydrogen atom or an optionally substituted alkyl group; $R_{16}$ represents an optionally substituted alkyl group, an optionally substituted cycloalkyl group, an optionally substituted aralkyl group, or an optionally substituted aryl group; and two of $R_{14}$ to $R_{16}$ may be combined together to form a ring, wherein, $R_{17}$ and $R_{17a}$ each independently represents a hydrogen atom, a halogen atom, or an optionally substituted alkyl group; $R_{18}$ represents $-C(R_{18d})(R_{18e})(R_{18f})$ or $-C(R_{18d'})(R_{18e'})(OR_{18g})$; $R_{18d}$ to $R_{18f}$ of each independently represents an optionally substituted alkyl group, an optionally substituted cycloalkyl group, an optionally substituted alkenyl group, an optionally substituted aralkyl group, or an optionally substituted aryl group; $R_{18d'}$ and $R_{18e'}$ each represents a hydrogen atom, an optionally substituted alkyl group, an optionally substituted cycloalkyl group, an optionally substituted alkenyl group, an optionally substituted aralkyl group, or an optionally substituted aryl group; $R_{18g}$ represents an optionally substituted alkyl group, an optionally substituted cycloalkyl group, an optionally substituted aralkyl group, or an optionally substituted aryl group; and two of $R_{18d}$, $R_{18e}$ and $R_{18f}$ or two of $R_{18d'}$, $R_{18e'}$ and $R_{18g}$, may be combined together to form a ring.

(11) The photosensitive resin composition according to (10) as above, wherein in the general formula (2a), at least of the groups represented by R is represented by $-C(CH_3)_3$, $-C(=O)-O-C(CH_3)_3$, $-CH_2-C(=O)-O-C(CH_3)_3$, $-CH_2-OR_{16}$, or $-CH(CH_3)-OR_{16}$, wherein $R_{16}$ represents an optionally substituted alkyl group, an optionally substituted cycloalkyl group, an optionally substituted aralkyl group, or an optionally substituted aryl group.

(12) The photosensitive resin composition according to (6) as above, wherein the resin (A) is a resin containing at least one repeating unit represented by the following general formula (2a'), at least one repeating unit represented by the following general formula (I) and at least one repeating unit represented by the following general formula (VI):

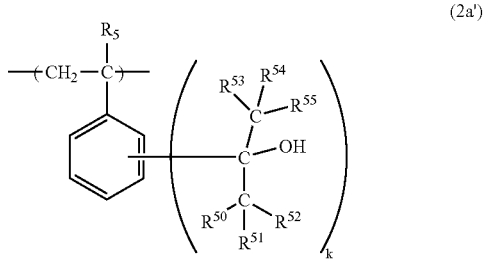

(2a')

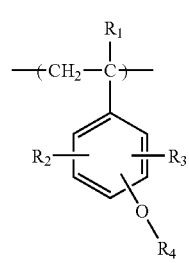

(I)

-continued

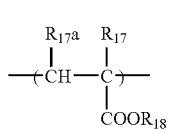
(VI)

wherein $R_5$ represents a hydrogen atom, a halogen atom, a cyano group, or an optionally substituted alkyl group; $R^{50}$ to $R^{55}$ each independently represents a hydrogen atom, a fluorine atom, or an optionally substituted alkyl group, provided that at least one of $R^{50}$ to $R^{55}$ represents a fluorine atom or an alkyl group in which at least one hydrogen atom is substituted with a fluorine atom; and k represents an integer of from 2 to 5, wherein $R_1$ represents a hydrogen atom, a halogen atom, a cyano group, or an optionally substituted alkyl group; $R_2$ and $R_3$ each independently represents a hydrogen atom, a halogen atom, a cyano group, a hydroxyl group, an optionally substituted alkyl group, an optionally substituted cycloalkyl group, an optionally substituted alkoxy group, an optionally substituted acyl group, an optionally substituted acyloxy group, an optionally substituted alkenyl group, an optionally substituted aryl group, or an optionally substituted aralkyl group; and $R_4$ represents a group of the following general formula (IV) or (V):

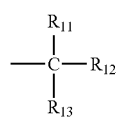
(IV)

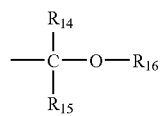
(V)

wherein $R_{11}$, $R_{12}$, and $R_{13}$ each independently represents an optionally substituted alkyl group, an optionally substituted cycloalkyl group, an optionally substituted alkenyl group, an optionally substituted aralkyl group, or an optionally substituted aryl group, wherein $R_{14}$ and $R_{15}$ each independently represents a hydrogen atom or an optionally substituted alkyl group; $R_{16}$ represents an optionally substituted alkyl group, an optionally substituted cycloalkyl group, an optionally substituted aralkyl group, or an optionally substituted aryl group; and two of $R_{14}$ to $R_{16}$ may be combined together to form a ring, wherein $R_{17}$ and $R_{17a}$ each independently represents a hydrogen atom, a halogen atom, a cyano group, or an optionally substituted alkyl group; $R_{18}$ represents —C($R_{18d}$)($R_{18e}$)($R_{18f}$) or —C($R_{18d'}$)($R_{18e'}$)(O$R_{18g}$); $R_{18d}$ to $R_{18f}$ each independently represents an optionally substituted alkyl group, an optionally substituted cycloalkyl group, an optionally substituted alkenyl group, an optionally substituted aralkyl group, or an optionally substituted aryl group; $R_{18d'}$ and $R_{18e'}$ each represents a hydrogen atom, an optionally substituted alkyl group, an optionally substituted cycloalkyl group, an optionally substituted alkenyl group, an optionally substituted aralkyl group, or an optionally substituted aryl group; $R_{18g}$ represents an optionally substituted alkyl group, an optionally substituted cycloalkyl group, an optionally substituted aralkyl group, or an optionally substituted aryl group; and two of $R_{18d}$, $R_{18e}$ and $R_{18f}$, or two of $R_{18d'}$, $R_{18e'}$ and $R_{18g}$, may be combined together to form a ring.

(13) The photosensitive resin composition according to (6) as above, wherein the resin (A) further has at least one repeating unit represented by the following general formula (III) and (VII):

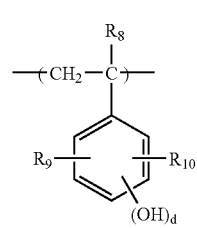
(III)

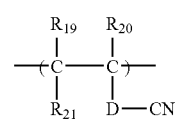
(VII)

wherein $R_8$ represents a hydrogen atom, a halogen atom, a cyano group, or an optionally substituted alkyl group, $R_9$ and $R_{10}$ each independently represents a hydrogen atom, a halogen atom, a cyano group, an optionally substituted alkyl group, an optionally substituted cycloalkyl group, an optionally substituted alkoxy group, an optionally substituted acyl group, an optionally substituted acyloxy group, an optionally substituted alkenyl group, an optionally substituted aryl group, or an optionally substituted aralkyl group; and d represents 0 or 1, wherein $R_{19}$ and $R_{20}$ each independently represents a hydrogen atom, a halogen atom, a cyano group, or an optionally substituted alkyl group; $R_{21}$ represents a hydrogen atom, a halogen atom, a cyano group, an optionally substituted alkyl group, or a -D-CN group; and D represents a single bond or a divalent connecting group.

(14) The photosensitive resin composition according to (6) as above, wherein the resin (A) further has at least one of repeating units represented by the following general formulae (VIII) to (XVII):

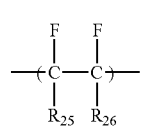
(VIII)

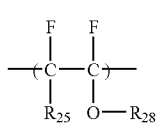
(IX)

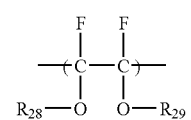
(X)

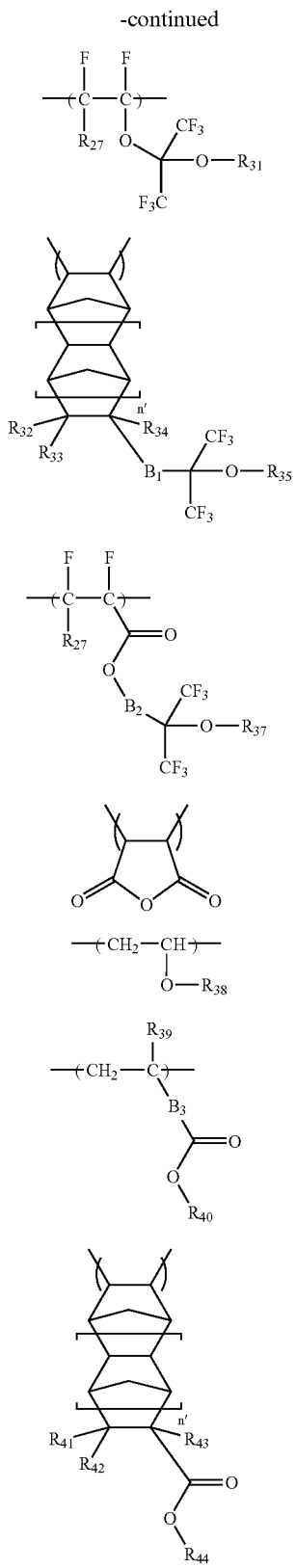

wherein $R_{25}$, $R_{26}$, and $R_{27}$ each independently represents a hydrogen atom, a fluorine atom, an optionally substituted alkyl group, an optionally substituted cycloalkyl group, or an optionally substituted aryl group; $R_{28}$, $R_{29}$, and $R_{30}$ each independently represents an optionally substituted alkyl group, an optionally substituted cycloalkyl group, or an optionally substituted aryl group; $R_{25}$ and $R_{26}$, $R_{27}$ and $R_{28}$, and $R_{29}$ and $R_{30}$ may be respectively taken together to form a ring; $R_{31}$, $R_{35}$, $R_{37}$, $R_{40}$, and $R_{44}$ each independently represents a hydrogen atom, an optionally substituted alkyl group, an optionally substituted cycloalkyl group, an optionally substituted acyl group, or an optionally substituted alkoxycarbonyl group; $R_{32}$, $R_{33}$, $R_{34}$, $R_{41}$, $R_{42}$, and $R_{43}$ each independently represents a hydrogen atom, a halogen atom, an optionally substituted alkyl group, or an optionally substituted alkoxy group; $R_{39}$ represents a hydrogen atom, a halogen atom, a cyano group, or an optionally substituted alkyl group; $R_{38}$ represents an optionally substituted alkyl group, an optionally substituted cycloalkyl group, an optionally substituted aralkyl group, or an optionally substituted aryl group; $B_1$ and $B_2$ each represents a single bond or a divalent connecting group; $B_3$ represents a divalent connecting group; and n' represents 0 or 1.

(15) The photosensitive resin composition according to (1) as above, wherein a metal content in the resin is 100 ppb or less with respect to each metal.

(16) The photosensitive resin composition according to (6) as above, wherein the component (B1) is a compound capable of generating an aliphatic or aromatic sulfonic acid having from 3 to 12 carbon atoms upon irradiation with one of an actinic ray and a radiation, in which the aliphatic or aromatic sulfonic acid is substituted with at least one fluorine atom.

(17) The photosensitive resin composition according to (6) as above, further comprising (B2) a compound capable of generating a fluorine atom-free aliphatic or aromatic sulfonic acid, or an aliphatic or aromatic carboxylic acid upon irradiation with one of an actinic ray and a radiation.

(18) The photosensitive resin composition according to (6) as above, further comprising (Y) an amphoteric ion compound.

(19) The photosensitive resin composition according to (1) as above, wherein the resin has an acid value of from $0.2 \times 10^{-3}$ to $4.4 \times 10^{-3}$ mol/g.

(20) The photosensitive resin composition according to (1) as above, wherein the resin has a weight average molecular weight of from 3,000 to 50,000.

(21) The photosensitive resin composition according to (1) as above, wherein the resin has a degree of distribution of 1.7 or less.

(22) The photosensitive resin composition according to (1) as above, wherein the resin contains residual non-reacted monomers in amount of 5% by weight or less.

(23) The photosensitive resin composition according to (1) as above, wherein the resin has a resin of a molecular weight of 1,000 or less in an amount of 10% or less.

(24) The photosensitive resin composition according to (6) as above, further comprising (D) a surfactant.

DETAILED DESCRIPTION OF THE INVENTION

The compounds that are used for the composition according to the invention will be described below in detail.

[1] Resin (A) of the Invention:

The resin (A) of the invention contains the repeating unit (A1) having at least two groups represented by the general formula (Z). Incidentally, (A1) may have a group that is decomposed by the action of an acid to become an alkali-soluble group.

In the general formula (Z), as the organic group represented by R are preferable an optionally substituted alkyl group, an optionally substituted cycloalkyl group, an optionally substituted acyl group, an optionally substituted alkoxycarbonyl group, an optionally substituted alkoxy-carbonyl-methyl group, an optionally substituted alkoxymethyl group, and an optionally substituted 1-alkoxyethyl group.

Examples of the substituent include ones having active hydrogen (such as an amino group, an amide group, a ureide group, a urethane group, a hydroxyl group, and a carboxyl group), a halogen atom (such as a fluorine atom, a chlorine atom, a bromine atom, and an iodine atom), an alkoxy group (such as a methoxy group, an ethoxy group, a propoxy group, and a butoxy group), a thioether group, an acyl group (such as an acetyl group, a propanoyl group, and a benzoyl group), an acyloxy group (such as acetoxy group, a propanoyloxy group, and a benzoyloxy group), an alkoxycarbonyl group (such as a methoxycarbonyl group, an ethoxycarbonyl group, and a butoxycarbonyl group), an alkyl group (such as a methyl group, an ethyl group, a propyl group, and a butyl group), a cycloalkyl group (such as a cyclohexyl group), an aryl group (such as a phenyl group), a cyano group, and a nitro group.

As the repeating unit (A1) having the groups represented by the general formula (Z) are preferable repeating units represented by the foregoing general formulae (1), (2) and (3).

In the formulae (1) and (3), $Q_1$ represents an alicyclic hydrocarbon group. In the formulae (1) and (2), $L_1$ and $L_2$ each represents a single bond or a connecting group; $X_1$ and $X_2$ each represents a connecting group; and in the formulae (1) to (3), Z represents the group represented by the general formula (Z).

The number of the group represented by the general formula (Z), which is included in the repeating unit (A1), is preferably 2 or 3.

The alicyclic hydrocarbon group represented by $Q_1$ is a group in which at least one atom constituting the alicyclic ring is contained and present in the main chain of the resin, and another atom constituting the alicyclic ring is bound to $L_1$.

The alicyclic hydrocarbon group represented by $Q_1$ may be monocyclic or polycyclic. The monocyclic hydrocarbon group preferably has from 3 to 8 carbon atoms, and examples thereof include a cyclopropyl group, a cyclopentyl group, a cyclohexyl group, a cycloheptyl group, and a cyclooctyl group. The polycyclic hydrocarbon group preferably has 6 to 20 carbon atoms, and examples thereof include an adamantyl group, a norbornyl group, an isobornyl group, a camphanyl group, a dicyclopentyl group, an α-pinel group, a tricyclodecanyl group, a tetracyclodecanyl group, and an androstanyl group. Incidentally, the cycloalkyl group includes ones in which a part of the carbon atoms constituting the ring is substituted with a hetero atom such as an oxygen atom, a sulfur atom, and a nitrogen atom.

The connecting group represented by $L_1$ and $L_2$ represents a divalent alkylene group, cycloalkylene group, alkenylene group, or arylene group, each of which may be substituted, or —O—C—O—$R_{22a}$—, —CO—O—$R_{22b}$—, or —CO—N($R_{22c}$)—$R_{22d}$—. Here, $R_{22a}$, $R_{22b}$, and $R_{22d}$, which may be the same or different, each represents a single bond or a divalent alkylene group, cycloalkylene group, alkenylene group, or arylene group, each of which may have an ether group, an ester group, an amide group, a urethane group, or a ureide group; and $R_{22c}$ represents a hydrogen atom, an optionally substituted alkyl group, an optionally substituted cycloalkyl group, an optionally substituted aralkyl group, or an optionally substituted aryl group.

As the alkylene group can be enumerated linear or branched alkylene groups, and examples include ones having from 1 to 8 carbon atoms such as a methylene group, an ethylene group, a propylene group, a butylene group, a hexylene group, and an octylene group.

As the cycloalkylene group are enumerated monocyclic resides such as a cyclopentylene group and a cyclohexylene group and polycyclic residues (those having from 5 to 12 carbon atoms) such as a norbornane skeleton and an adamantane skeleton.

As the alkenylene group are preferably enumerated ones having from 2 to 6 carbon atoms such as an ethenylene group, a propenylene group, and a butenylene group, each of which may be substituted.

As the arylene group are preferably enumerated ones having from 6 to 15 carbon atoms such as a phenylene group, a tolylene group, and a naphthylene group, each of which may be substituted.

Examples of the substituent include ones having active hydrogen (such as an amino group, an amide group, a ureide group, a urethane group, a hydroxyl group, and a carboxyl group), a halogen atom (such as a fluorine atom, a chlorine atom, a bromine atom, and an iodine atom), an alkoxy group (such as a methoxy group, an ethoxy group, a propoxy group, and a butoxy group), a thioether group, an acyl group (such as an acetyl group, a propanoyl group, and a benzoyl group), an acyloxy group (such as acetoxy group, a propanoyloxy group, and a benzoyloxy group), an alkoxycarbonyl group (such as a methoxycarbonyl group, an ethoxycarbonyl group, and a butoxycarbonyl group), an alkyl group (such as a methyl group, an ethyl group, a propyl group, and a butyl group), a cycloalkyl group (such as a cyclohexyl group), an aryl group (such as a phenyl group), a cyano group, and a nitro group.

As the connecting group represented by $X_1$ and $X_2$ can be enumerated those for $L_1$ and $L_2$, with the alicyclic or aromatic connecting groups being preferred.

In the general formula (1), as the organic group represented by Rb are enumerated a linear, branched or cyclic alkyl group, an aryl group, and an aralkyl group, each of which has up to 10 carbon atoms; and an ester group, an amide group, an alkoxy group, and a cyano group, each of which has up to 11 carbon atoms in total. Examples of the substituent include a halogen atom, a hydroxyl group, an alkoxy group, and a cyano group. The substituent may be bound to any carbon atom in the organic group. Preferred examples of Rb include a hydrogen atom, a fluorine atom, a chlorine atom, $CF_3$, $OCH_3$, CN, $CH_3$, and $C_2H_5$.

The alkyl group represented by $R_{x1}$ and $R_{y1}$ may be substituted with a halogen atom such as a fluorine atom, or a cyano group, and is preferably an alkyl group having from 1 to 3 carbon atoms, including a methyl group and a trifluoromethyl group.

Preferably, $Q_1$ is norbornene; $L_1$ is an alkylene group; and $L_2$ is an arylene group, an ester group (—CO—O—), an alkylene group, a cycloalkylene group, or a combination thereof. Preferably, $R_{x1}$ is a hydrogen atom; and $R_{y1}$ is a hydrogen atom, a methyl group, a trifluoromethyl group.

Specific examples of the repeating unit (A1) are repeating units represented by the general formulae (II) and (A-1-1) to (A-1-13) as described later.

In the invention, the repeating unit (A1) is preferably represented by the foregoing general formula (2a) or (2a').

In the general formula (2a), as the organic group represented by R are preferable an alkyl group, a cycloalkyl group, an acyl group, an alkoxycarbonyl group, an alkoxycarbonylmethyl group, an alkoxymethyl group, and a 1-alkoxyethyl group, each of which may be substituted.

Examples of the substituent include ones having active hydrogen (such as an amino group, an amide group, a ureide group, a urethane group, a hydroxyl group, and a carboxyl group), a halogen atom (such as a fluorine atom, a chlorine atom, a bromine atom, and an iodine atom), an alkoxy group (such as a methoxy group, an ethoxy group, a propoxy group, and a butoxy group), a thioether group, an acyl group (such as an acetyl group, a propanoyl group, and a benzoyl group), an acyloxy group (such as acetoxy group, a propanoyloxy group, and a benzoyloxy group), an alkoxycarbonyl group (such as a methoxycarbonyl group, an ethoxycarbonyl group, and a butoxycarbonyl group), an alkyl group (such as a methyl group, an ethyl group, a propyl group, and a butyl group), a cycloalkyl group (such as a cyclohexyl group), an aryl group (such as a phenyl group), a cyano group, and a nitro group.

In the general formula (2a), it is preferred that at least one of the groups represented by R is an acid-decomposable group. Examples of the acid-decomposable group include —C(CH$_3$)$_3$, —C(=O)—O—C(CH$_3$)$_3$, —CH$_2$—C(=O)—O—C(CH$_3$)$_3$, —CH$_2$—OR$_{16}$, and —CH(CH$_3$)—OR$_{16}$, wherein R$_{16}$ represents an optionally substituted alkyl group, an optionally substituted cycloalkyl group, an optionally substituted aralkyl group, or an optionally substituted aryl group.

In the general formulae (2a) and (2a'), k is preferably 2 or 3.

The resin (A) of the invention may contain (A2) a repeating unit having a group that is decomposed by the action of an acid to become an alkali-soluble group, in addition to the repeating unit (A1). As the repeating unit (A2) are preferable repeating units represented by the following formulae (4) and (5).

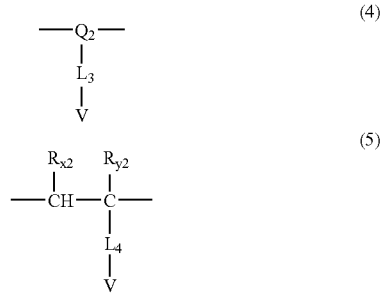

Here, Q$_2$ represents an alicyclic hydrocarbon group. L$_3$ and L$_4$ each represents a connecting group; and V represents a group that is decomposed by the action of an acid to become an alkali-soluble group. R$_{x2}$ and R$_{y2}$ each independently represents a hydrogen atom, a halogen atom, a cyano group, or an optionally substituted alkyl group.

In the formulae (4) and (5), Q$_2$, L$_3$, L$_4$, R$_{x2}$, and R$_{y2}$ are synonymous with Q$_1$, L$_1$, L$_2$, R$_{x1}$, and R$_{y1}$ in the formulae (1) and (2), respectively.

Preferably, Q$_2$ is norbornene; L$_3$ is an alkylene group, —O—, or a combination thereof; and L$_4$ is a single bond. Preferably, R$_{x2}$ is a hydrogen atom; and R$_{y2}$ is a hydrogen atom, a methyl group, or a trifluoromethyl group.

Specific examples of the repeating unit (A2) include (A-1) to (A-39) enumerated as the repeating unit of the general formula (I); (F-14) to (F-16) and (F-18) enumerated as the repeating unit of the general formula (XI); (F-20), (F-21) to (F-23), (F-25), and (F-28) enumerated as the repeating unit of the general formula (XII); (F-30), (F-33), (F-34), and (F-38) enumerated as the repeating unit of the general formula (XIII); and (F-54B) and (B-1) to (B-30) enumerated as the repeating unit of the general formulae (VI) and (XVII), all of which are described later.

Incidentally, the resin (A) of the invention is preferably a resin having the repeating unit represented by the general formula (2a) and at least one of the repeating units represented by the general formulae (I) and (VI), which is decomposed by the action of an acid to increase its solubility in an alkaline developing liquid, or a resin having at least one of the respective repeating units represented by the general formulae (2a'), (I) and (VI), which is decomposed by the action of an acid to increase its solubility in an alkaline developing liquid.

In the resin (A) of the invention, R$_{18}$ in the general formula (VI) is preferably represented by the following general formula (VI-A), (VI-B) or (VI-C).

In the general formula (VI-A), R$_{18a}$ and R$_{18b}$, which may be the same or different, each represents an optionally substituted alkyl group; and R$_{18c}$ represents an optionally substituted cycloalkyl group,

In the general formula (VI-B), R$_{18h}$ represents an alkyl group, an alkenyl group, an alkynyl group, an aralkyl group, or an aryl group, each of which may be substituted; and Z represents an atomic group constituting a monocyclic or polycyclic alicyclic group together with the carbon atoms in the general formula (VI-B).

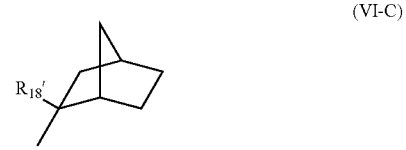

In the general formula (VI-C), R$_{18'}$ represents an alkyl group, an alkenyl group, an alkynyl group, an aralkyl group, or an aryl group, each of which may be substituted.

The resin (A) of the invention may further have at least one of the repeating units represented by the general formulae (III) and (VII) to (XVII).

The details of each of the groups are as follows.

As the alkyl group can be enumerated linear or branched alkyl groups, and examples include alkyl groups having from 1 to 8 carbon atoms such as a methyl group, an ethyl group, a propyl group, an n-butyl group, a sec-butyl group, a hexyl group, a 2-ethylhexyl group, and an octyl group.

The cycloalkyl group may be monocyclic or polycyclic. Examples of the monocyclic cycloalkyl group include those having from 3 to 8 carbon atoms such as a cyclopropyl group, a cyclopentyl group, a cyclohexyl group, a cycloheptyl group, and a cyclooctyl group. Examples of the polycyclic cycloalkyl group include those having from 6 to 20 carbon atoms such as an adamantyl group, a norbornyl group, an isobornyl group, a camphanyl group, a cyclopentyl group, an α-pinel group, a tricyclodecanyl group, a tetracyclododecyl group, and an androstanyl group. Incidentally, the cycloalkyl group includes ones in which a part of the carbon atoms constituting the ring is substituted with a hetero atom such as an oxygen atom, a sulfur atom, and a nitrogen atom.

Examples of the aryl group include aryl groups having from 6 to 15 carbon atoms such as a phenyl group, a tolyl group, a dimethylphenyl group, a 2,4,6-trimethylphenyl group, a naphthyl group, an anthryl group, and a 9,10-dimethoxyanthryl group.

Examples of the aralkyl group include aralkyl groups having from 7 to 12 carbon atoms such as a benzyl group, a phenethyl group, and a naphthylmethyl group.

Examples of the alkenyl group include alkenyl groups having from 2 to 8 carbon atoms such as a vinyl group, an allyl group, a butenyl group, and a cyclohexenyl group.

Examples of the alkoxy group include alkoxy groups having from 1 to 8 carbon atoms such as a methoxy group, an ethoxy group, an n-propoxy group, an isopropoxy group, a butoxy group, a pentoxy group, an allyoxy group, and an octoxy group.

Examples of the acyl group include acyl groups having from 1 to 10 carbon atoms such as a formyl group, an acetyl group, a propanoyl group, a butanoyl group, a pivaloyl group, an octanoyl group, and a benzoyl group.

Examples of the acyloxy group include acyloxy groups having from 2 to 12 carbon atoms such as an acetoxy group, a propionyloxy group, and a benzoyloxy group.

Examples of the alkynyl group include alkynyl groups having from 2 to 5 carbon atoms such as an ethynyl group, a propynyl group, and a butynyl group.

Examples of the alkoxycarbonyl group include tertiary alkoxycarbonyl groups such as a t-butoxycarbonyl group, a t-amyloxycarbonyl group, and a 1-methyl-1-cyclohexyloxycarbonyl group.

Examples of the halogen atom include a fluorine atom, a chlorine atom, a bromine atom, and an iodine atom.

The divalent connecting group represents a divalent alkylene group, cycloalkylene group, alkenylene group, or arylene group, each of which may be substituted, or —O—C—O—R$_{22a}$—, —CO—O—R$_{22b}$—, or —CO—N (R$_{22c}$)—R$_{22d}$—. Here, R$_{22a}$, R$_{22b}$, and R$_{22d}$, which may be the same or different, each represents a single bond or a divalent alkylene group, cycloalkylene group, alkenylene group, or arylene group, each of which may have an ether group, an ester group, an amide group, a urethane group, or a ureide group; and R$_{22c}$ represents a hydrogen atom, an optionally substituted alkyl group, an optionally substituted cycloalkyl group, an optionally substituted aralkyl group, or an optionally substituted aryl group.

As the alkylene group can be enumerated linear or branched alkylene groups, and examples include alkylene groups having from 1 to 8 carbon atoms such as a methylene group, an ethylene group, a propylene group, a butylene group, a hexylene group, and an octylene group.

Examples of the cycloalkylene group include cycloalkylene groups having from 5 to 8 carbon atoms such as a cyclopentylene group and a cyclohexylene group.

Examples of the alkenylene group include optionally substituted alkenylene groups having from 2 to 6 carbon atoms such as an ethenylene group, a propenylene group, and a butenylene group.

Examples of the arylene group include optionally substituted arylene groups having from 6 to 15 carbon atoms such as a phenylene group, a tolylene group, and a naphthylene group.

Examples of the ring formed when two of R$_{18d}$ to R$_{18f}$, two of R$_{18d}$, R$_{18e'}$ and R$_{18g'}$, two of R$_{14}$ to R$_{16}$, R$_{25}$ and R$_{26}$, R$_{27}$ and R$_{28}$, or R$_{29}$ and R$_{30}$ are taken together include from 3- to 8-membered rings such as a cyclopropane ring, a cyclopentane ring, a cyclohexane ring, a tetramethylene oxide ring, a pentamethylene oxide ring, a hexamethylene oxide ring, a furan ring, a pyran ring, a dioxonol ring, and a 1,3-dioxolan ring.

Z represents an atomic group constituting a monocyclic or polycyclic alicyclic group together with the carbon atoms in the general formula (VI-B). Preferred examples of the monocyclic alicyclic group include those having from 3 to 8 carbon atoms such as a cyclopropyl group, a cyclopentyl group, a cyclohexyl group, a cycloheptyl group, and a cyclooctyl group. Preferred examples of the polycyclic alicyclic group include those having from 6 to 20 carbon atoms such as an adamantyl group, a norbornyl group, an isobornyl group, a camphanyl group, a cyclopentyl group, an α-pinel group, a tricyclodecanyl group, a tetracyclododecyl group, and an androstanyl group.

Each of the foregoing alkyl group, cycloalkyl group, alkoxy group, acyl group, acyloxy group, alkynyl group, alkenyl group, aryl group, aralkyl group, alkoxycarbonyl group, alkylene group, cycloalkylene group, alkenylene group, and arylene group may be substituted.

Examples of the substituent include ones having active hydrogen (such as an amino group, an amide group, a ureide group, a urethane group, a hydroxyl group, and a carboxyl group), a halogen atom (such as a fluorine atom, a chlorine atom, a bromine atom, and an iodine atom), an alkoxy group (such as a methoxy group, an ethoxy group, a propoxy group, and a butoxy group), a thioether group, an acyl group (such as an acetyl group, a propanoyl group, and a benzoyl group), an acyloxy group (such as acetoxy group, a propanoyloxy group, and a benzoyloxy group), an alkoxycarbonyl group (such as a methoxycarbonyl group, an ethoxycarbonyl group, and a butoxycarbonyl group), an alkyl group (such as a methyl group, an ethyl group, a propyl group, and a butyl group), a cycloalkyl group (such as a cyclohexyl group), an aryl group (such as a phenyl group), a cyano group, and a nitro group.

In the invention, it is preferred that at least one of R$_1$ of the general formula (I), R$_5$ of the general formula (2a) or (2a'), and R$_{17}$ of the general formula (VI) is a trifluoromethyl group. It is more preferred that R$_{17}$ of the general formula (VI) is a trifluoromethyl group.

Examples of the group that is decomposed by the action of an acid to become alkali-soluble, which is contained in the resin (A) of the invention, include —O—C(R$_{18d}$)(R$_{18e}$)

$(R_{18f})$, —O—C($R_{18d}$)($R_{18e}$)(O$R_{18g}$), —O—COO—C($R_{18d}$)($R_{18e}$)($R_{18f}$), —O—C($R_{01}$)($R_{02}$)COO—C($R_{18d}$)($R_{18e}$)($R_{18f}$), —COO—C($R_{18d}$)($R_{18e}$)($R_{18f}$), and —COO—C($R_{18d}$)($R_{18e}$)(O$R_{18g}$). Here, $R_{18d}$ to $R_{18g}$ are synonymous with $R_{18d}$ to $R_{18g}$ with respect to the repeating unit of the general formula (VI); and $R_{01}$ and $R_{02}$ each represents a hydrogen atom, an optionally substituted alkyl group, an optionally substituted cycloalkyl group, an optionally substituted alkenyl group, an optionally substituted aralkyl group, or an optionally substituted aryl group.

Preferred specific examples include an ether group or ester group of a tertiary alkyl group such as a t-butyl group, a t-amyl group, a 1-alkyl-1-cyclohexyl group, a 2-alkyl-2-adamantyl group, a 2-adamantyl-2-propyl group, and a 2-(4-methylcyclohexyl)-2-propyl group; an acetal group or acetal ester group such as a 1-alkoxy-1-ethoxy group and a tetrahydropyranyl group; a t-alkylcarbonate group; and a t-alkylcarbonylmethoxy group. Of these are more preferable acetal groups such as a 1-alkoxy-1-ethoxy group and a tetrahydropyranyl group.

The acetal group is large in acid decomposability, wide in the width of selection of an acid-generating compound to be used in combination, and effective from the standpoints of enhancement of sensitivity and lapsing change in performance after exposure until heating. An acetal group containing an alkoxy group derived from the perfluoroalkyl group as the 1-alkoxy component of the acetal group is particularly preferred. In this case, it is possible to enhance the transparency to an exposure light having a short wavelength (for example, 157 nm of $F_2$ excimer laser beams).

A content of the repeating unit (A1) having the groups represented by the general formula (Z) is generally in the range of from 5 to 80 mole %, preferably from 7 to 70 mole %, and more preferably from 10 to 65 mole % in the resin (A).

A content of the repeating unit (A2) that is decomposed by the action of an acid to become an alkali-soluble group is generally in the range of from 1 to 70 mole %, preferably from 1 to 65 mole %, and more preferably from 5 to 60 mole % in the resin (A).

A content of the repeating unit represented by the general formula (I) is generally in the range of 5 to 80 mole %, preferably from 7 to 75 mole %, and more preferably from 10 to 70 mole % in the resin (A).

A content of the repeating unit represented by the general formula (2a) or (2a') is generally in the range of from 5 to 80 mole %, preferably from 7 to 70 mole %, and more preferably from 10 to 65 mole % in the resin (A).

A content of the repeating unit represented by the general formula (VI) is generally in the range of from 1 to 70 mole %, preferably from 1 to 65 mole %, and more preferably from 5 to 60 mole % in the resin (A).

A content of the repeating unit represented by the general formula (III) is generally in the range of from 1 to 40 mole %, preferably from 3 to 35 mole %, and more preferably from 5 to 30 mole % in the resin (A).

A content of the repeating unit represented by the general formula (VII) is generally in the range of from 1 to 40 mole %, preferably from 3 to 35 mole %, and more preferably from 5 to 30 mole % in the resin (A).

A content of the repeating units represented by the general formulae (VIII) to (X) is generally in the range of from 1 to 40 mole %, preferably from 3 to 35 mole %, and more preferably from 5 to 30 mole % in the resin (A).

A content of the repeating units represented by the general formulae (XI) to (XIII) is generally in the range of from 1 to 40 mole %, preferably from 3 to 35 mole %, and more preferably from 5 to 30 mole % in the resin (A).

A content of the repeating unit represented by the general formula (XIV) is generally in the range of from 1 to 40 mole %, preferably from 3 to 35 mole %, and more preferably from 5 to 30 mole % in the resin (A).

A content of the repeating unit represented by the general formula (XV) is generally in the range of from 1 to 40 mole %, preferably from 3 to 35 mole %, and more preferably from 5 to 30 mole % in the resin (A).

A content of the repeating unit represented by the general formula (XVI) is generally in the range of from 1 to 40 mole %, preferably from 3 to 35 mole %, and more preferably from 5 to 30 mole % in the resin (A).

A content of the repeating unit represented by the general formula (XVII) is generally in the range of from 1 to 40 mole %, preferably from 3 to 35 mole %, and more preferably from 5 to 30 mole % in the resin (A).

A degree of protection of all OH groups of the formula (Z) in the resin is preferably from 1 to 90 mole %, more preferably from 3 to 80 mole, and most preferably from 5 to 70 mole %.

For the purpose of further enhancing the performance of the photosensitive resin of the invention, the resin (A) of the invention maybe copolymerized with other polymerizable monomer, in addition to the foregoing repeating units.

Examples of the copolymerizable monomer that can be used include compounds having one addition polymerizable unsaturated bond, such as acrylic esters, acrylamides, methacrylic esters, methacrylamides, allyl compounds, vinyl ethers, vinyl esters, styrenes, and crotonic esters other than those described above.

Specific examples of the repeating unit represented by the general formula (I) will be shown below, but it should not be construed that the invention is limited thereto.

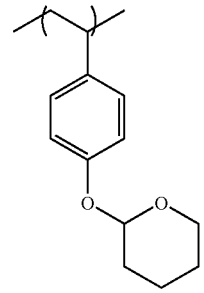

(A-1)

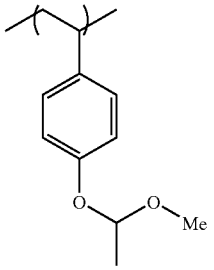

(A-2)

-continued
(A-3)
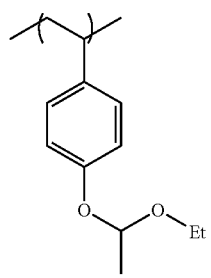
(A-4)
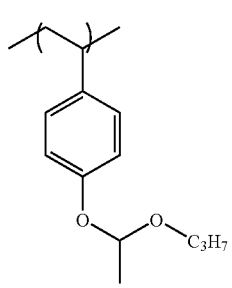
(A-5)
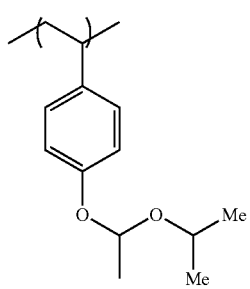
(A-6)
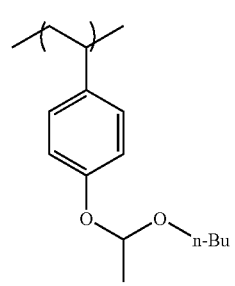
(A-7)
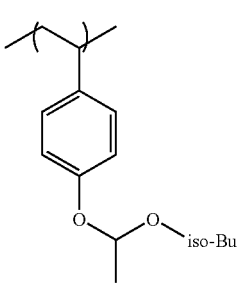
-continued
(A-8)
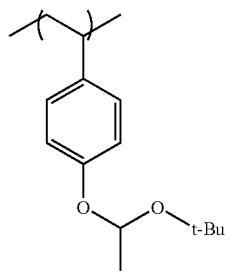
(A-9)
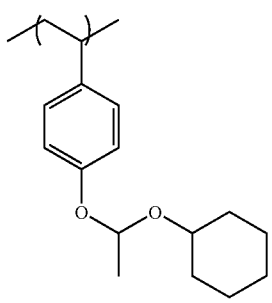
(A-3′)
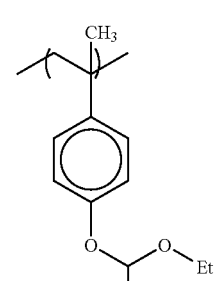
(A-3″)
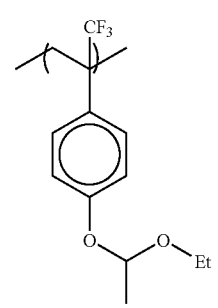
(A-10)
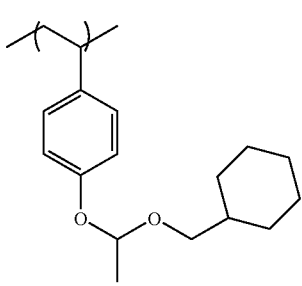

-continued
(A-11)
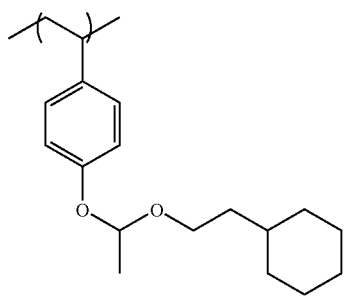
(A-12)
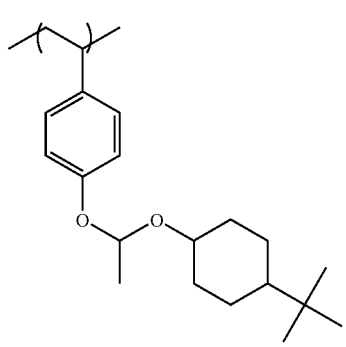
(A-13)
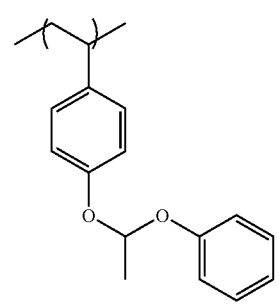
(A-14)
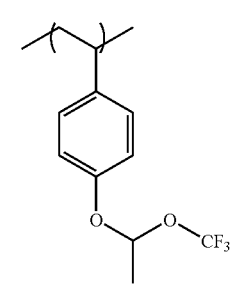
(A-15)
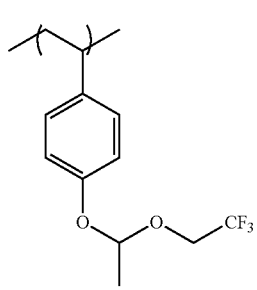
-continued
(A-16)
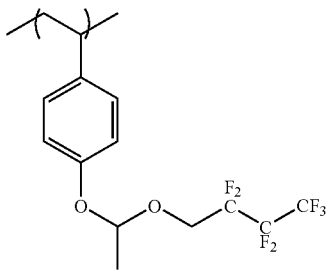
(A-17)
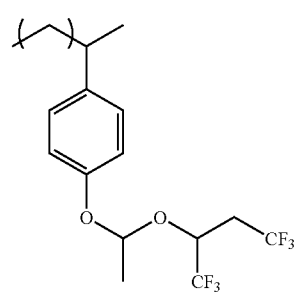
(A-18)
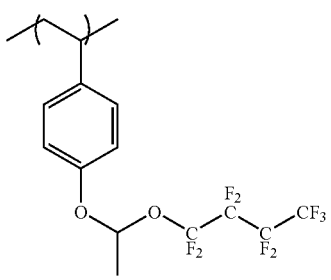
(A-19)
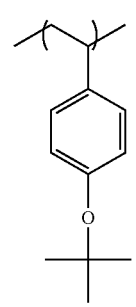
(A-20)
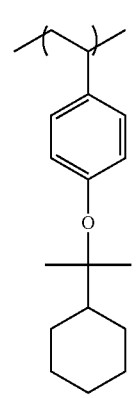

-continued
(A-20') 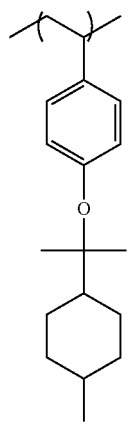
(A-24) 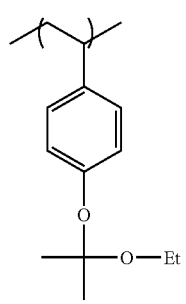
(A-25) 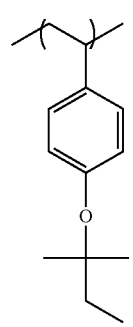
(A-26) 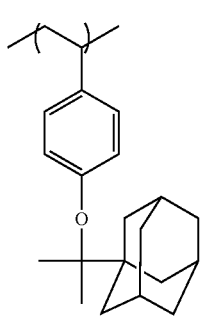
-continued
(A-27) 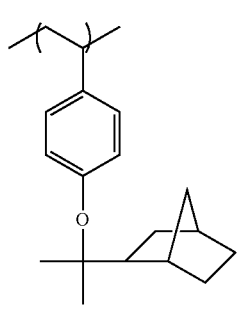
(A-28) 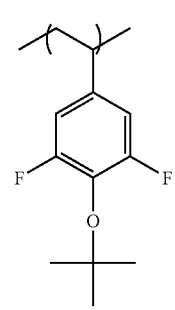
(A-29) 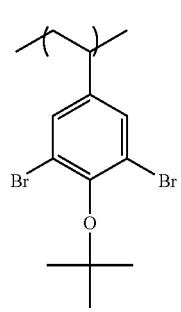
(A-30) 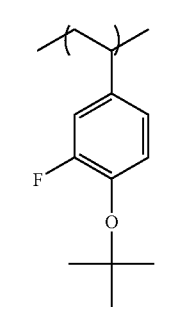
(A-31) 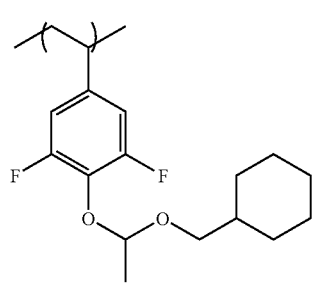

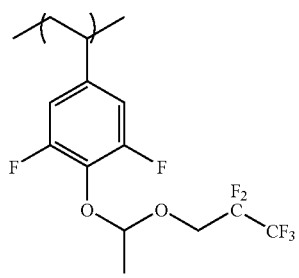 (A-32)
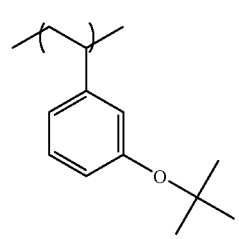 (A-33)
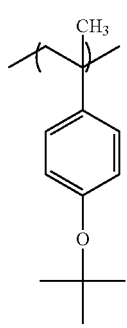 (A-34)
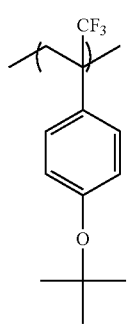 (A-35)
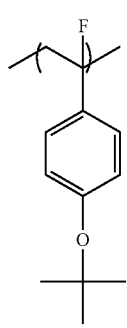 (A-36)
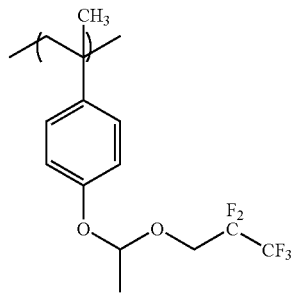 (A-37)
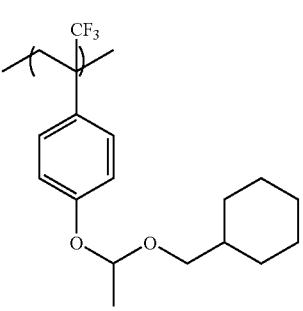 (A-38)
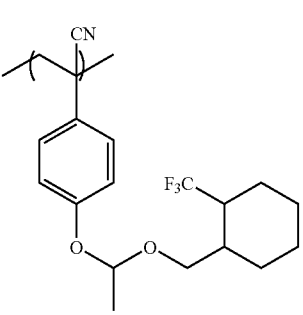 (A-39)
Specific examples of the repeating unit represented by the general formula (2a) or (2a') will be shown below, but it should not be construed that the invention is limited thereto.
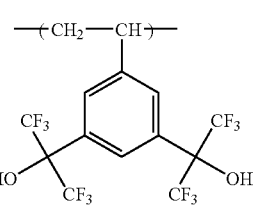 (II)-1
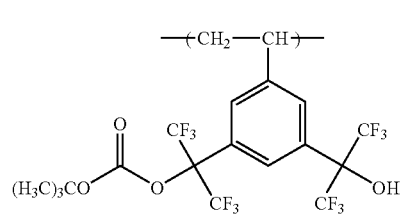 (II)-2

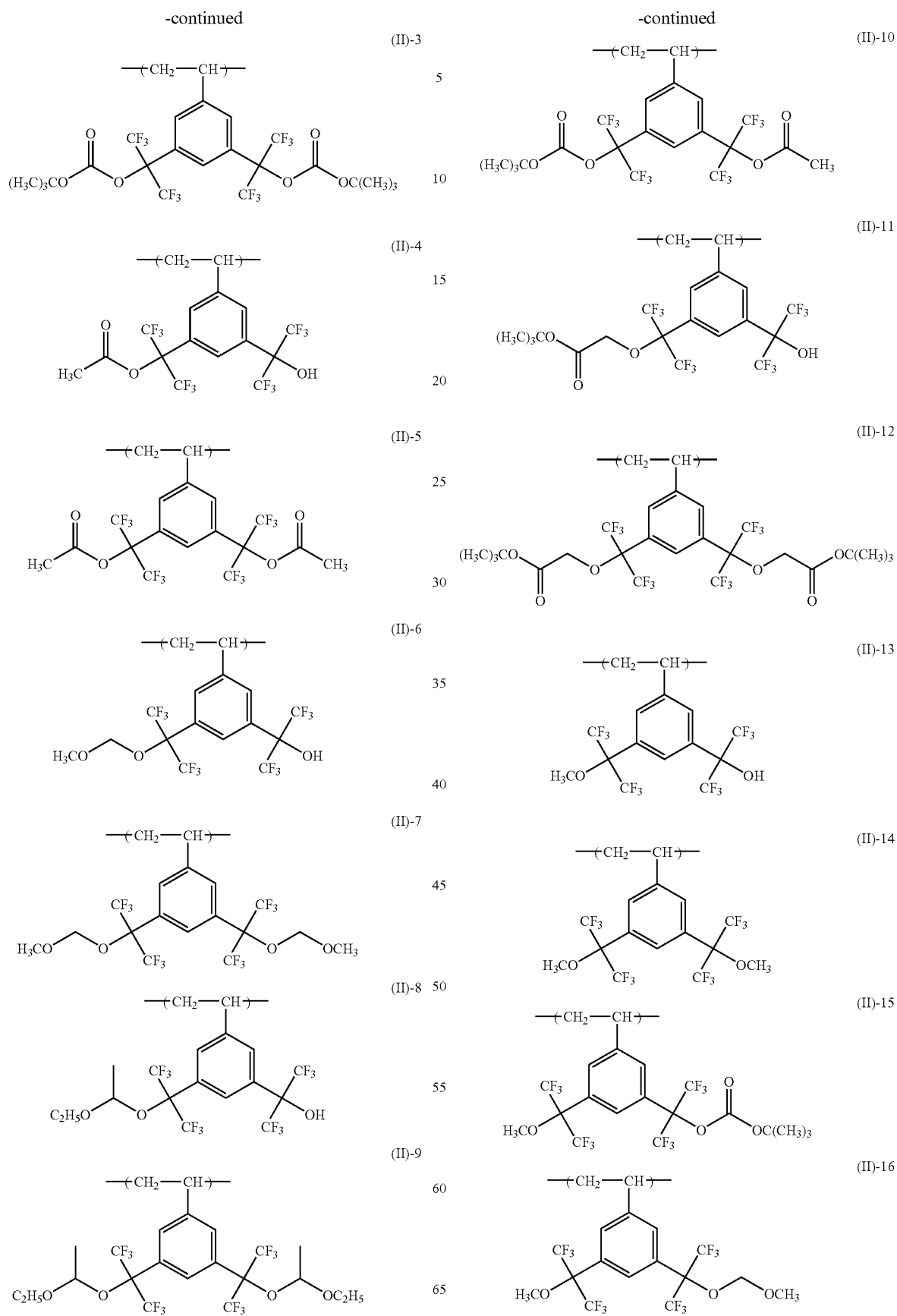

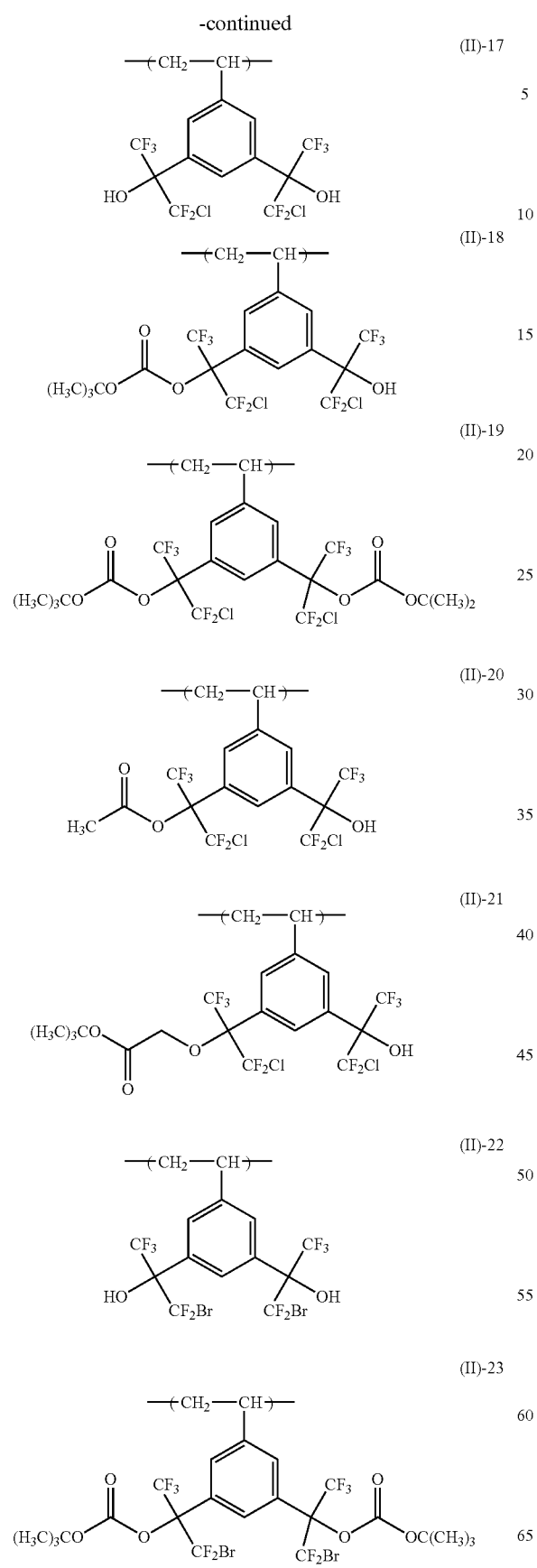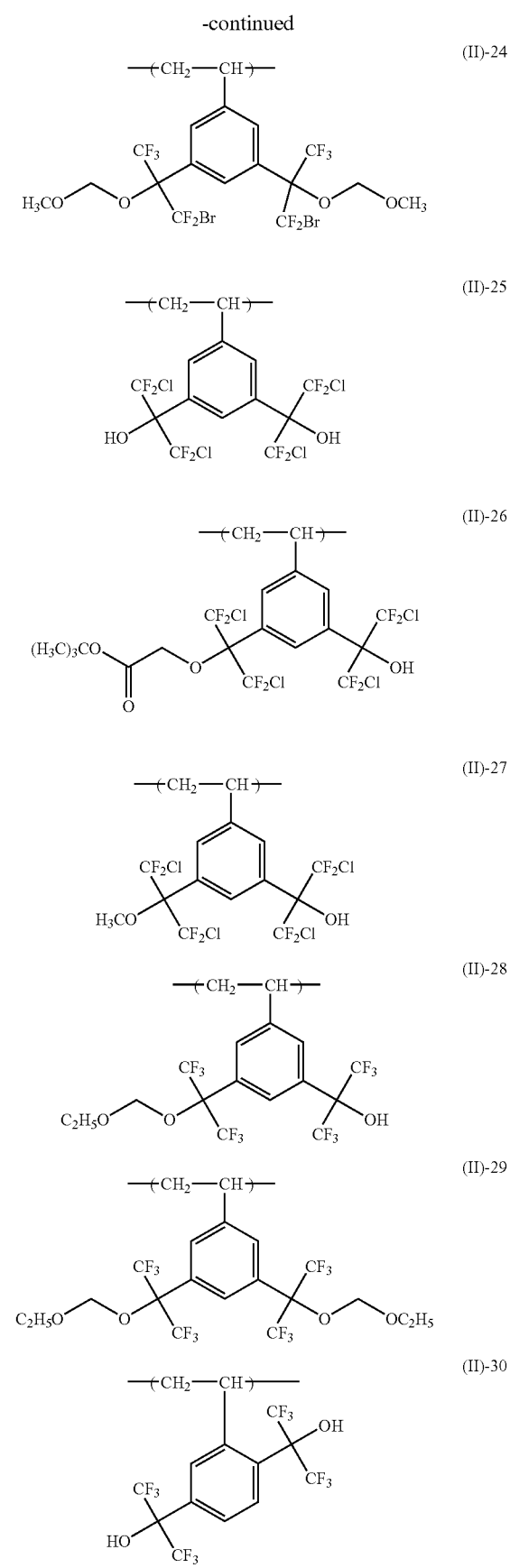

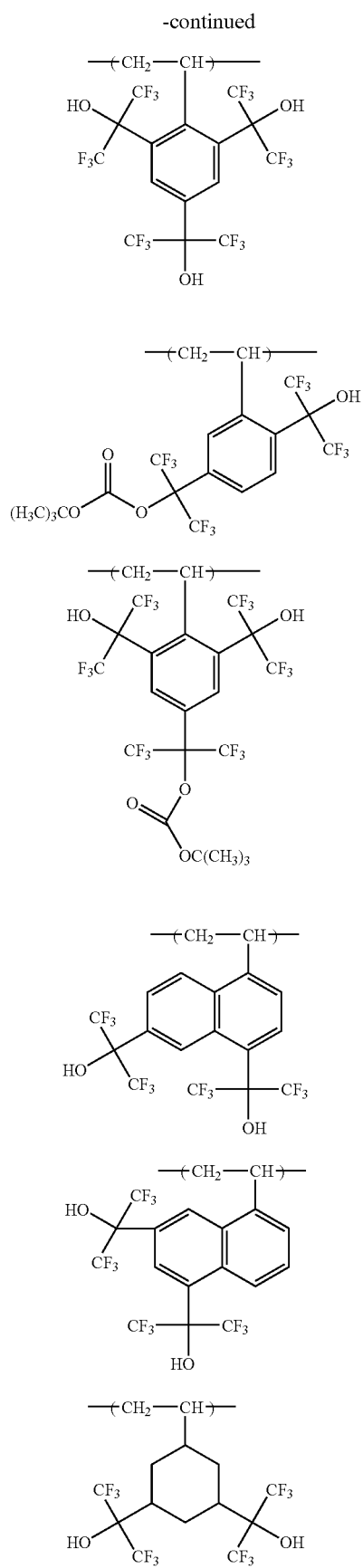

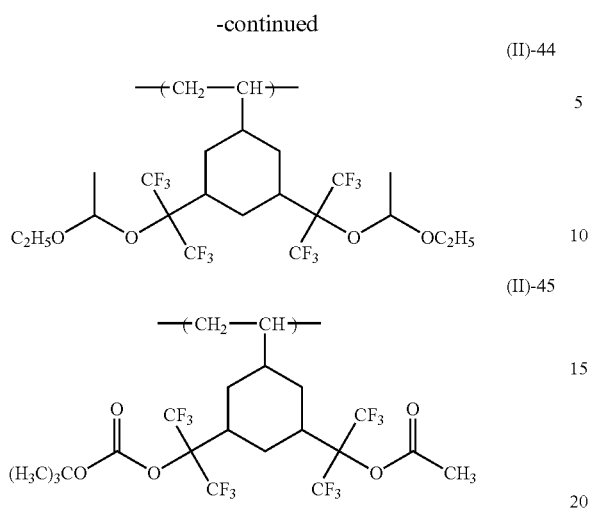
Specific examples of the repeating unit (A1) of the invention other than that of the general formula (2a) or (2a') will be shown below, but it should not be construed that the invention is limited thereto.
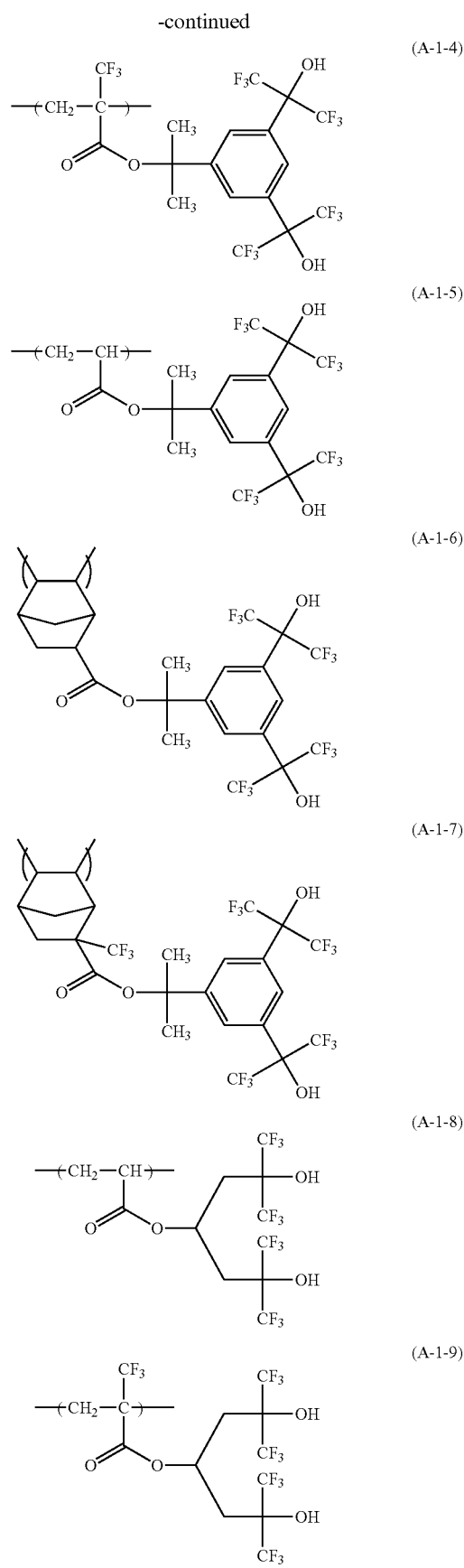

-continued (A-1-10)
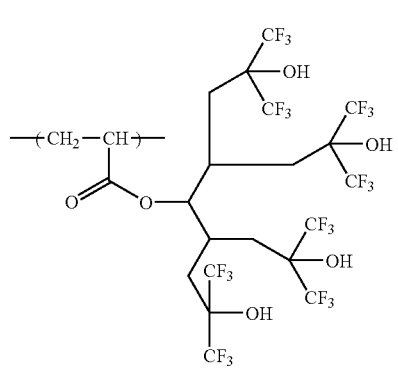

(A-1-11)
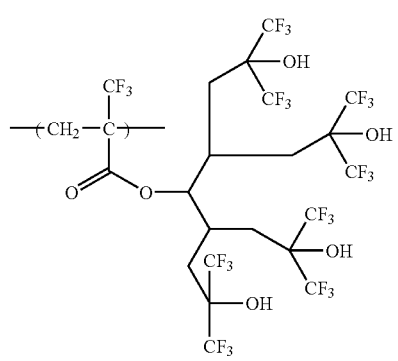

(A-1-12)
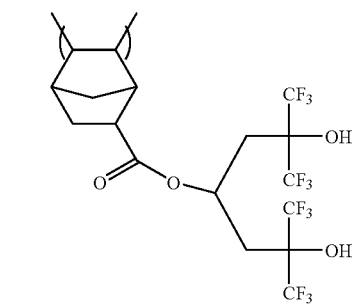

(A-1-13)
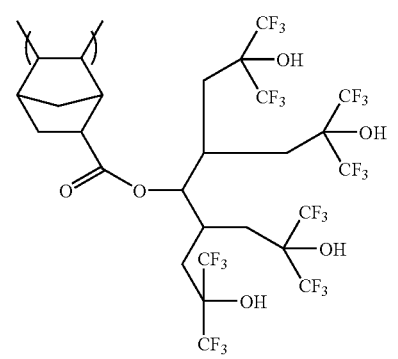

Specific examples of the repeating unit represented by the general formula (III) will be shown below, but it should not be construed that the invention is limited thereto.

(C-1)
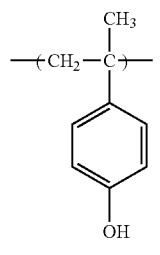

(C-2)
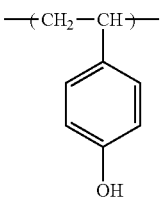

(C-3)
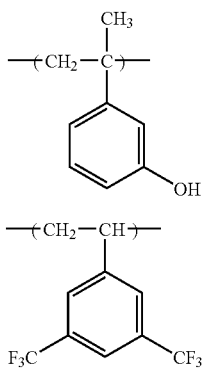

(C-4)
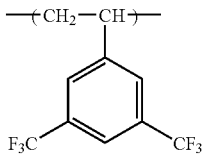

(C-5)
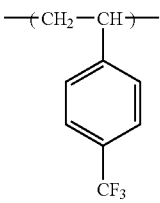

Specific examples of the repeating unit represented by the general formula (VII) will be shown below, but it should not be construed that the invention is limited thereto.

(VII-1)
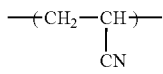

(VII-2)
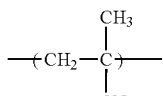

(VII-3)
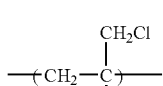

(VII-4)
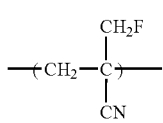

Specific examples of the repeating units represented by the general formulae (VIII) to (XIII) will be shown below, but it should not be construed that the invention is limited thereto.

-continued
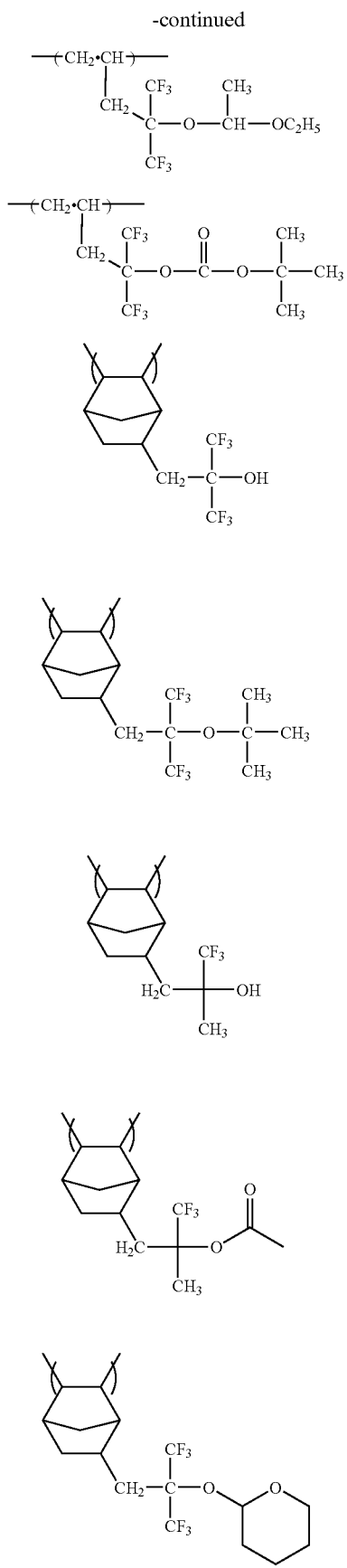
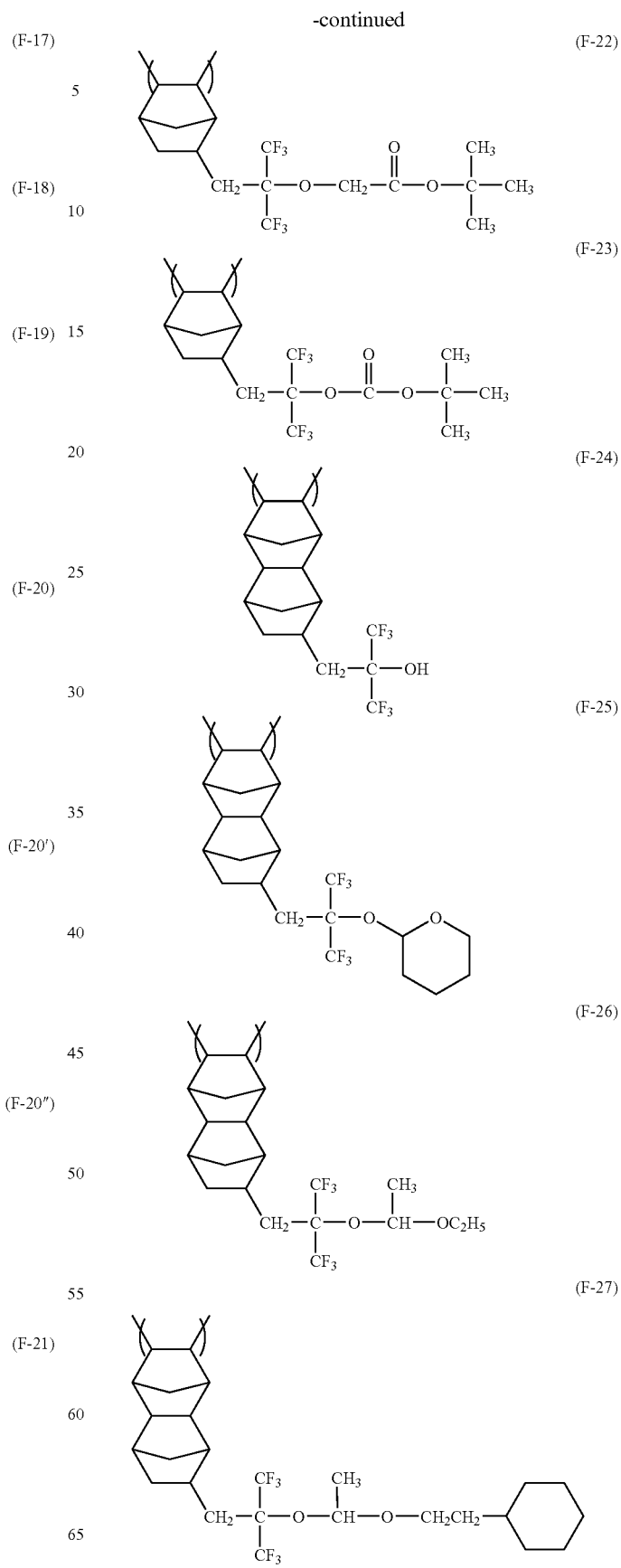

(F-28) 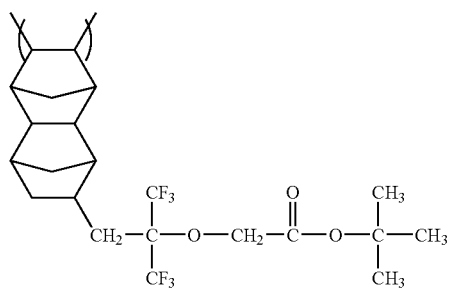
(F-33) 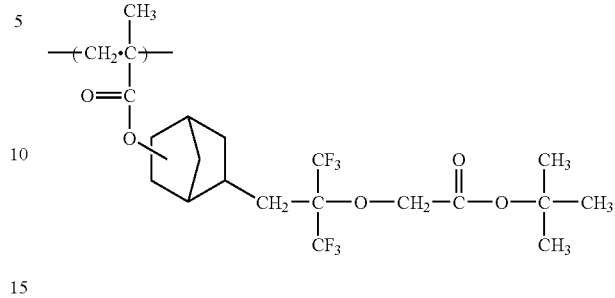
(F-29) 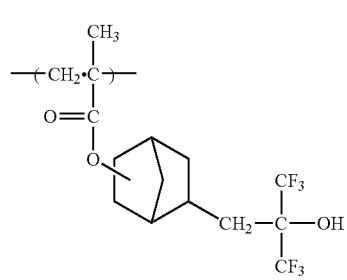
(F-34) 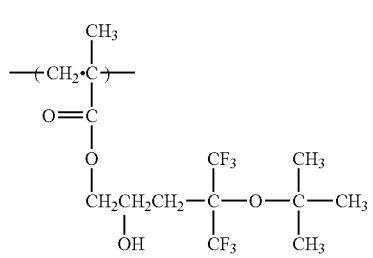
(F-30) 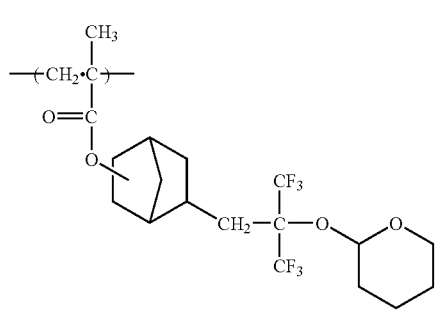
(F-35) 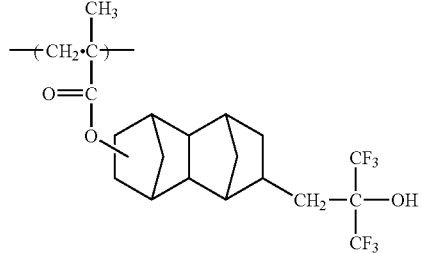
(F-31) 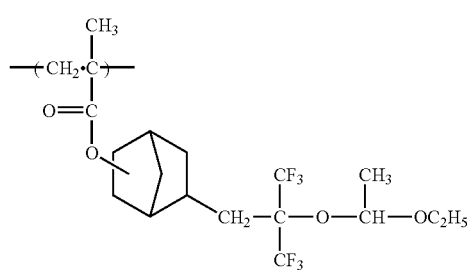
(F-36) 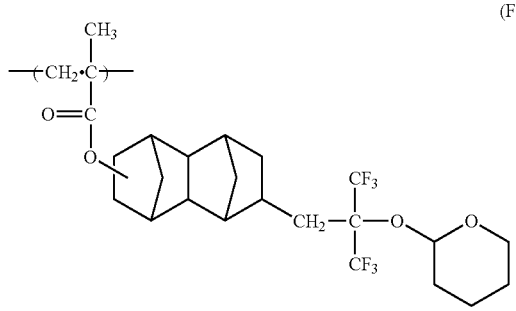
(F-32) 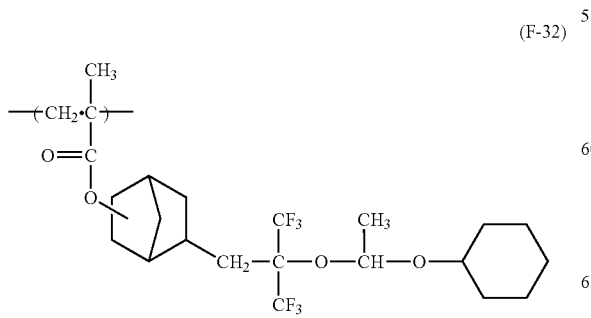
(F-37) 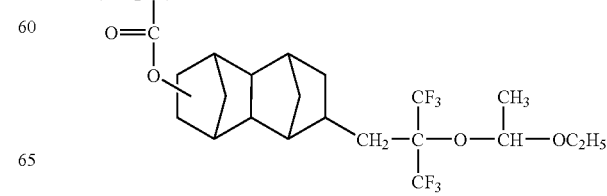

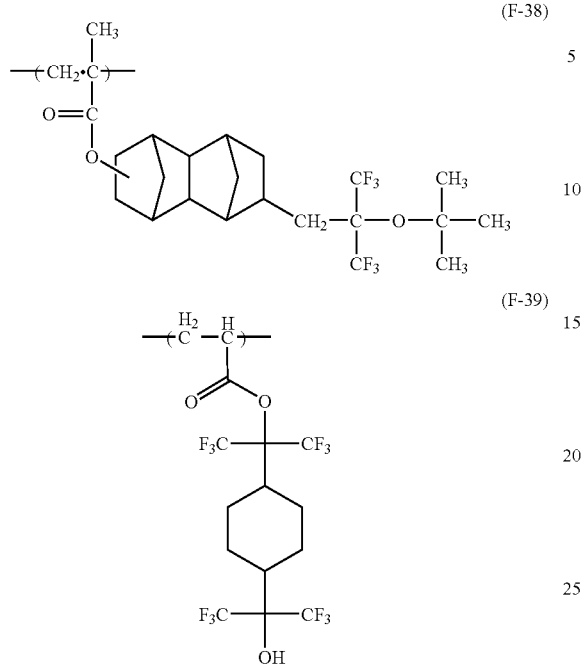
(F-38)
(F-39)
Specific examples of the repeating units represented by the general formulae (VI) and (XVII) will be shown below, but it should not be construed that the invention is limited thereto.
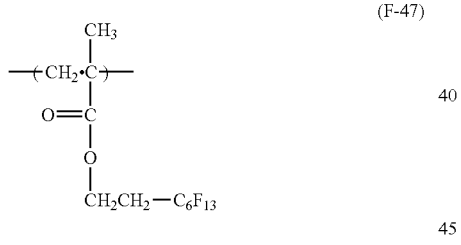
(F-47)
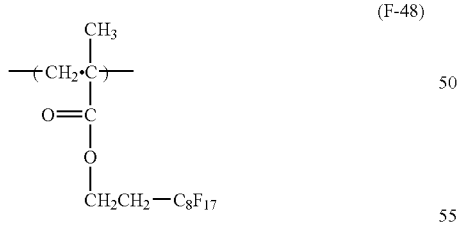
(F-48)
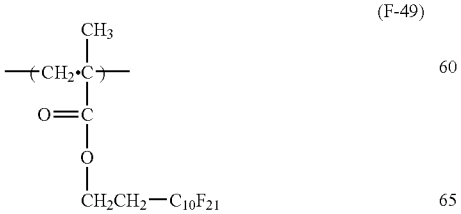
(F-49)
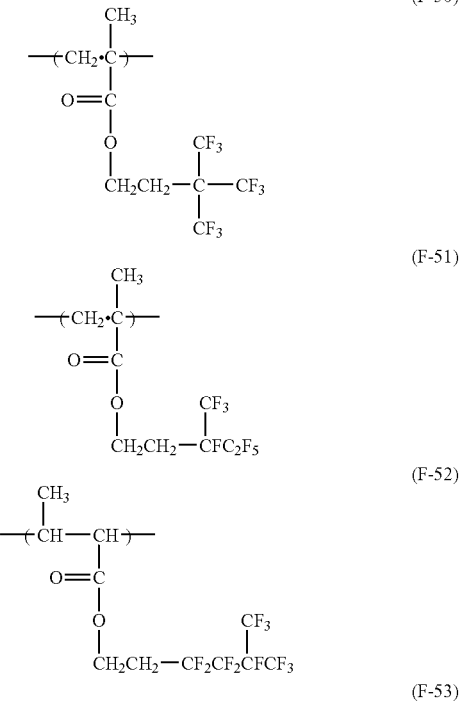
(F-50)
(F-51)
(F-52)
(F-53)
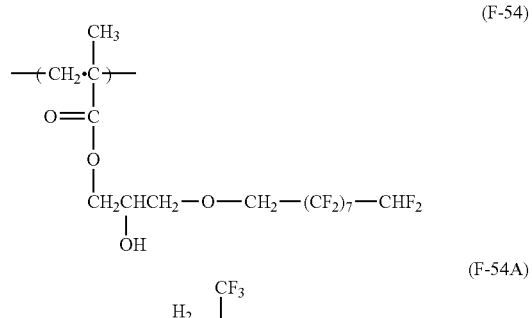
(F-54)
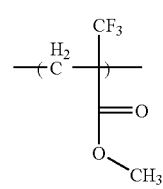
(F-54A)
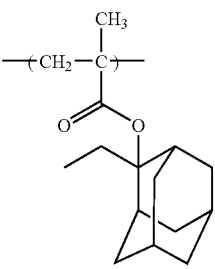
(F-54B)

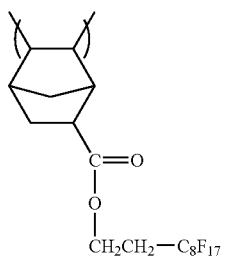
(F-55)
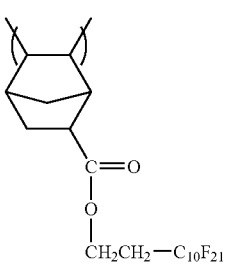
(F-56)
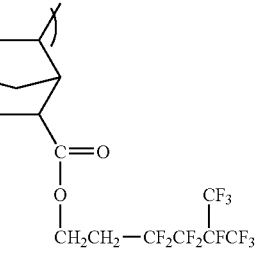
(F-57)
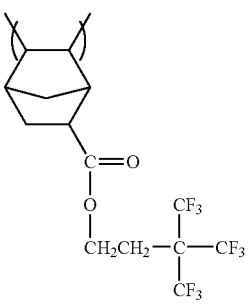
(F-58)
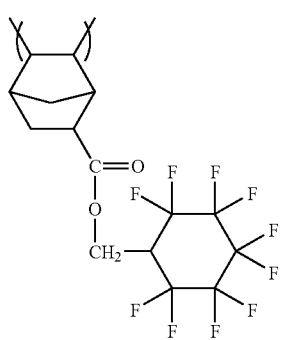
(F-59)
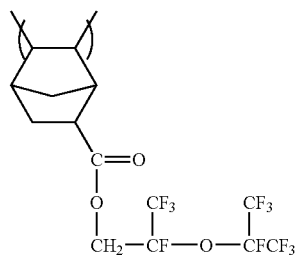
(F-60)
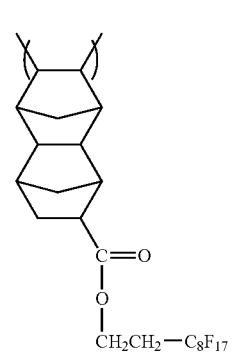
(F-61)
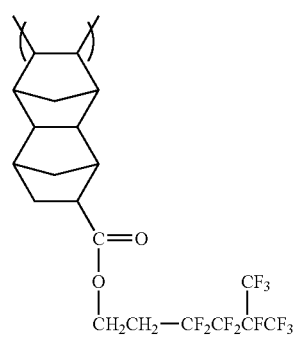
(F-62)
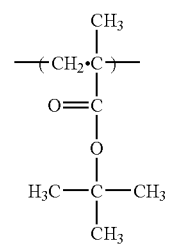
(B-1)
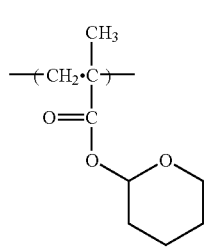
(B-2)

-continued
(B-3)
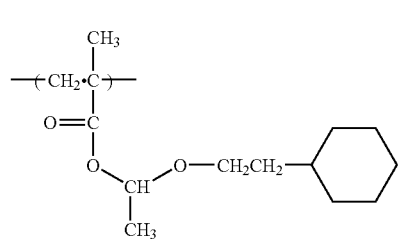
(B-4)
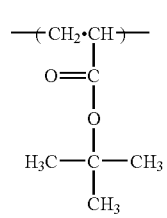
(B-5)
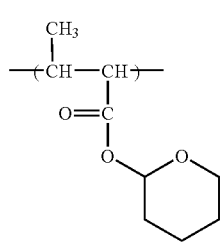
(B-6)
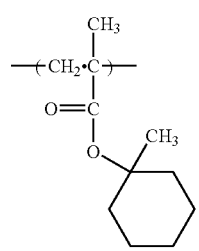
(B-7)
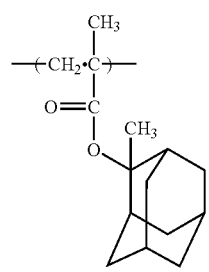
(B-8)
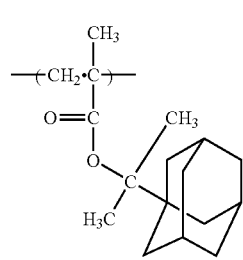
-continued
(B-9)
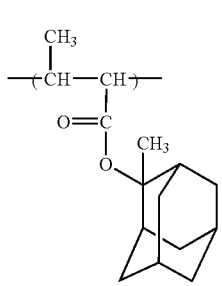
(B-10)
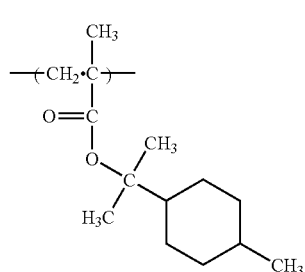
(B-11)
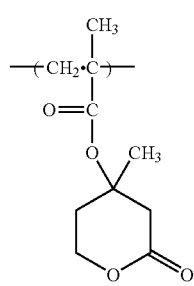
(B-12)
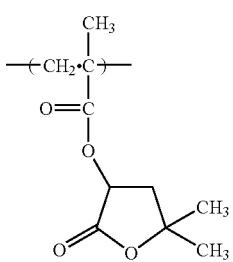
(B-13)
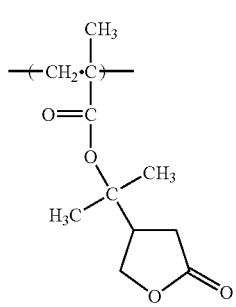

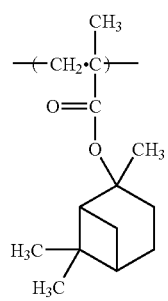
(B-14)
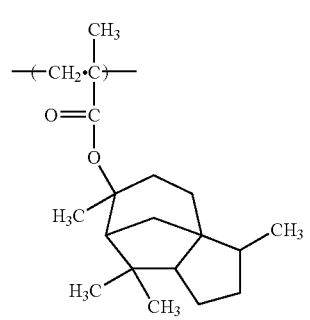
(B-15)
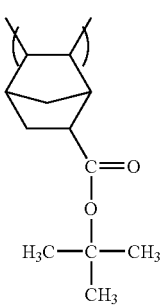
(B-16)
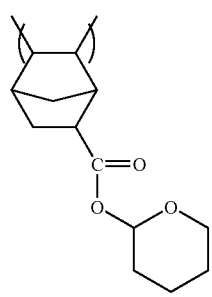
(B-17)
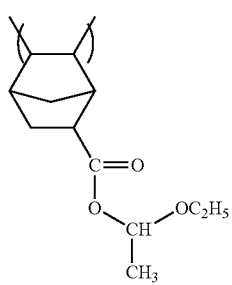
(B-18)
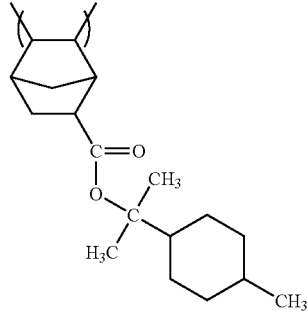
(B-19)
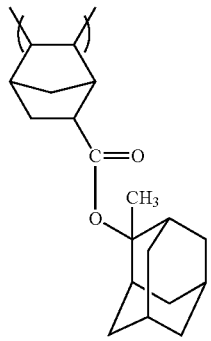
(B-20)
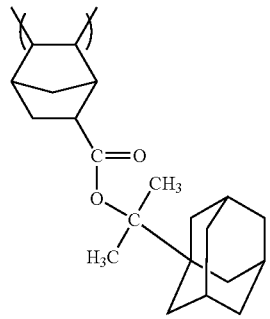
(B-21)
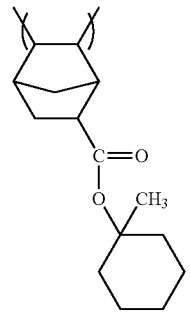
(B-22)
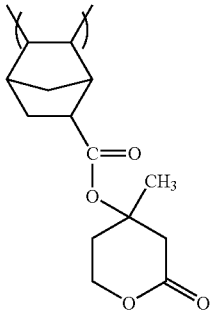
(B-23)

-continued
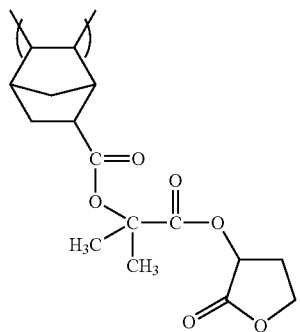
(B-24)
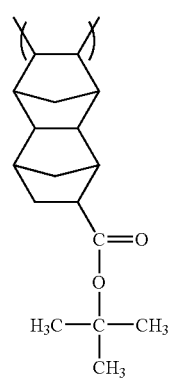
(B-25)
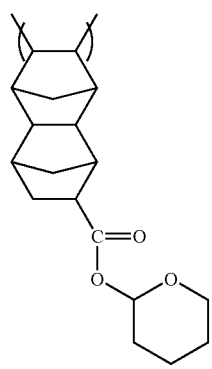
(B-26)
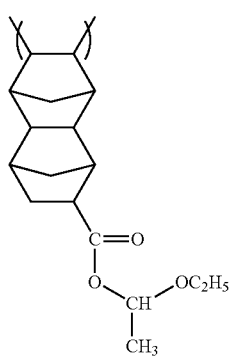
(B-27)
-continued
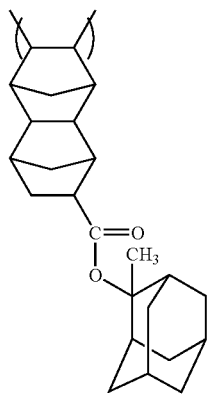
(B-28)
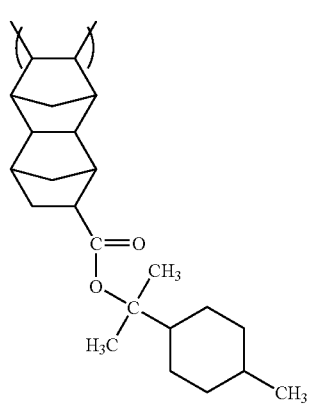
(B-29)
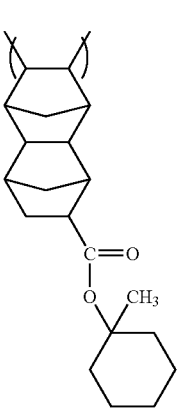
(B-30)
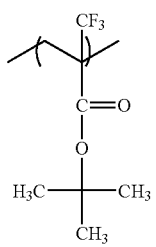
(B-1′)

-continued
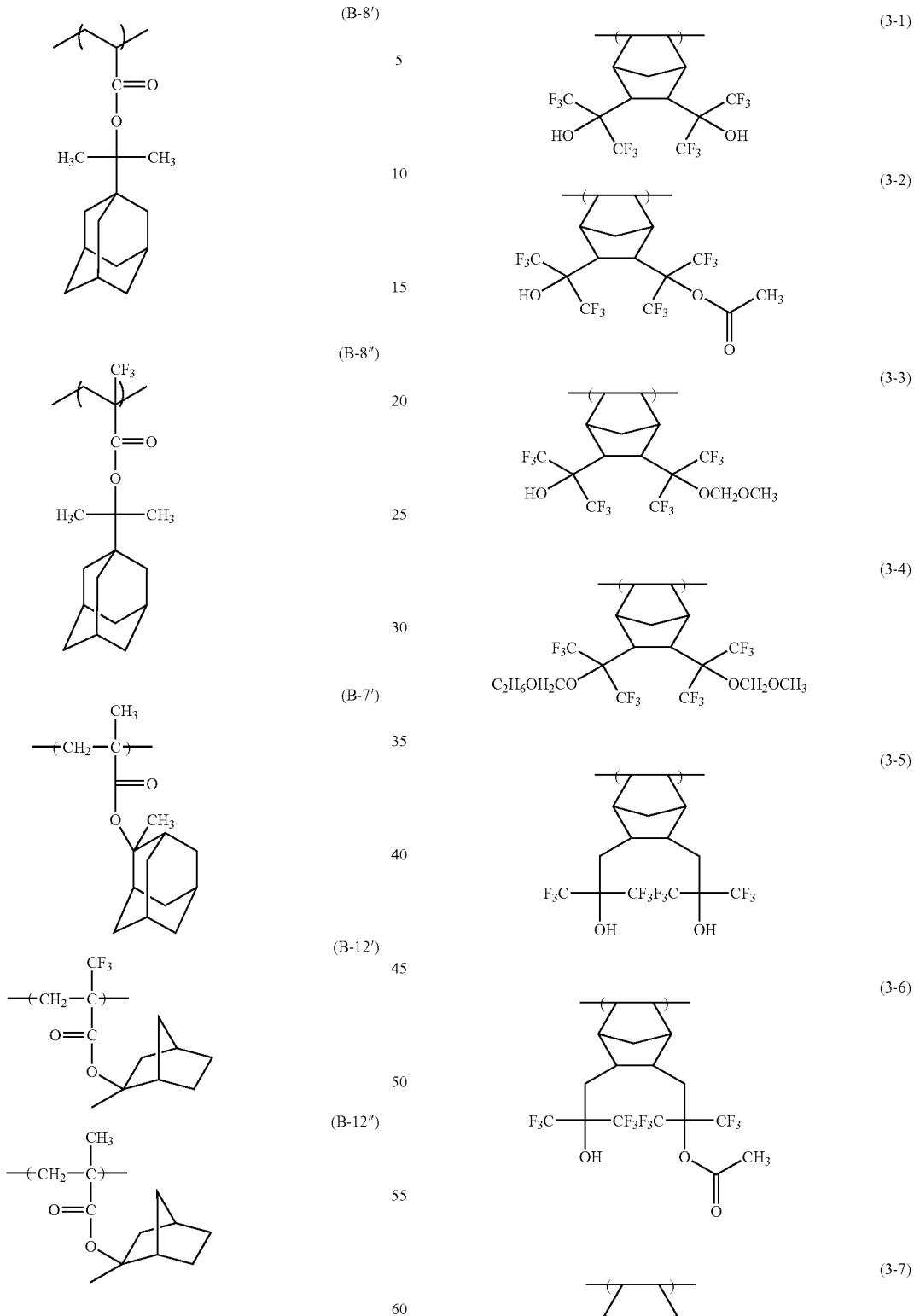
Specific examples of the repeating unit represented by the general formula (XV) include repeating units formed from the foregoing vinyl ethers.
Specific examples of the repeating units represented by the general formula (3) will be shown below, but it should not be construed that the invention is limited thereto.

-continued
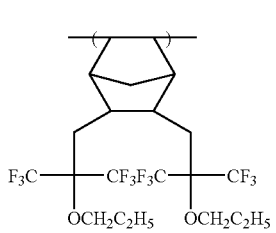 (3-8)
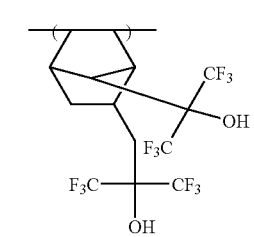 (3-9)
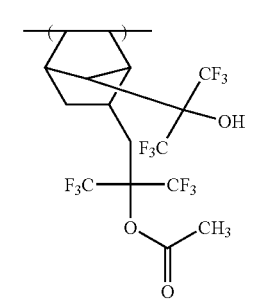 (3-10)
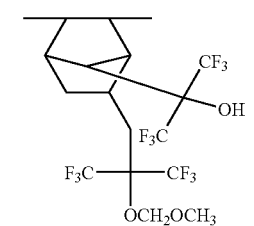 (3-11)
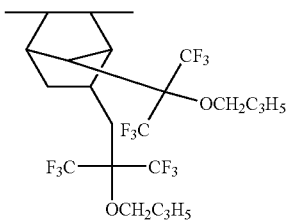 (3-12)
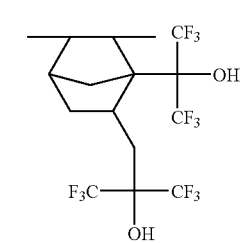 (3-13)
-continued
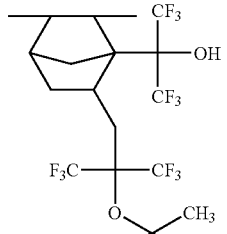 (3-14)
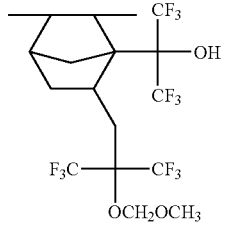 (3-15)
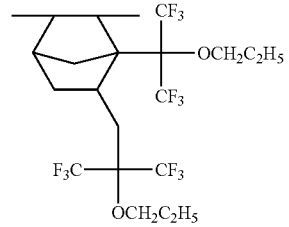 (3-16)
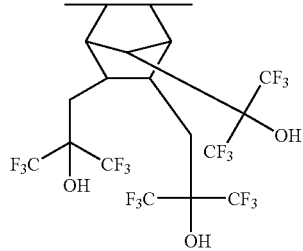 (3-17)
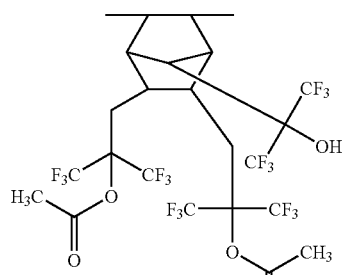 (3-18)
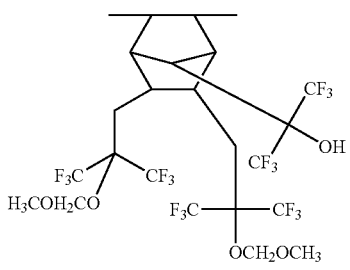 (3-19)

-continued

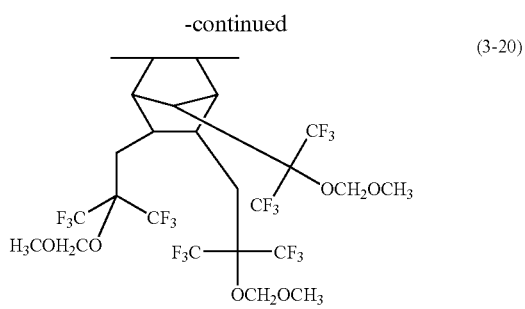

(3-20)

The repeating units enumerated above may be use singly or in admixture of two or more thereof.

The resin (A) of the invention having the foregoing repeating units preferably has a weight average molecular weight in the range of from 1,000 to 200,000, more preferably from 3,000 to 200,000, and most preferably from 3,000 to 50,000. A molecular weight distribution (degree of distribution) is in the range of from 1 to 10, preferably from 1 to 3, more preferably from 1 to 2, and most preferably from 1 to 1.7. The smaller the molecular weight distribution, the more superior the coating properties, sensitivity and contrast are.

In addition, degree of distribution is defined as the quotient (Mw/Mn) which is obtained by dividing weight average molecular weight (Mw) by number average molecular weight (Mn).

In the invention, it is preferred that a proportion of resins having a molecular weight of 1,000 or less is 20% or less, more preferably 15% or less, and most preferably 10% or less. Further, a proportion of the residual non-reacted monomers in the resin (A) is preferably 10% or less, more preferably 7% or less, and most preferably 5% or less.

An addition amount of the resin (A) of the invention is generally in the range of from 50 to 99.5% by weight, preferably from 60 to 98% by weight, and more preferably from 65 to 95% by weight on a basis of the total solids content of the composition.

The acid-decomposable resin that is used in the invention can be synthesized by a customary manner (such as radical polymerization). For example, as the general synthesis method, the monomer species are charged at once or on the way of the reaction into a reaction vessel; if desired, the monomers are dissolved in a reaction solvent such as ethers (e.g., tetrahydrofuran, 1,4-dioxane, diisoporpyl ether), ketones (e.g., methyl ethyl ketone, methyl isobutyl ketone), ester solvents (e.g., ethyl acetate), and solvents dissolving the various monomers therein as described later (e.g., propylene glycol monomethyl ether), to form a uniform solution; and polymerization of the solution is initiated by heating, if desired in an inert gas atmosphere such as nitrogen and argon using a commercially available radical initiator (such as an azo-based initiator and a peroxide). If desired, the initiator is supplemented or dividedly added. After completion of the reaction, the reaction mixture is added to a solvent, and the desired polymer is recovered by a powder or solid recovery method. A reaction concentration is 20% by weight or more, preferably 30% by weight or more, and more preferably 40% by weight or more. A reaction temperature is from 10° C. to 150° C., preferably from 30° C. to 120° C., and more preferably from 50° C. to 100° C. Incidentally, depending on the monomer, anionic polymerization may be suited for the synthesis. The polymerization methods are described in *Jikken Kagaku Koza* 28: Kobunshi Gosei (Experimental Chemistry Lecture No. 28: Polymer Synthesis), edited by The Chemical Society of Japan (Maruzen) and *Shin-Jikken Kagaku Koza* 19: Kobunshi Kagaku (New Experimental Chemistry Lecture No. 19: Polymer Chemistry), edited by The Chemical Society of Japan (Maruzen).

In a resist composition, it is preferred that generation of particles (the agglomeration of particles) which cause the sensitivity to change is reduced as far as possible. In general, the number of particles tend to increase with increase in the content of metal, because the resin particles agglomerate around nuclei of the metal in a solvent.

Therefore, in the invention, it is preferred that the amount of metal components contained in the resin as the component (A), such as Na, K, Ca, Fe, and Mg is small. Concretely, the content of each of the metal species contained in the resin is preferably 300 ppb or less, more preferably 200 ppb or less, and most preferably 100 ppb or less.

Since the fluorine-containing resins used for resists for $F_2$ excimer laser come often in contact with metallic catalysts in the process for synthesizing fluorine-containing monomers and the process for polymerizing the fluorine-containing resins, the resins are apt to increase in the content of metallic impurities.

The number of particles tend to increase with increase in the content of metallic impurities in the resists, and the probable reason for this is that the resin particles agglomerate around nuclei of the metallic impurities in a solvent with the elapse of time. Moreover, the agglomeration of the resin particles is presumed to bring about a substantial change of components forming a resist composition to cause the sensitivity to change.

The metallic impurities contained in the resist composition are Na, K, Ca, Fe, Mg, Mn, Pd, Ni, Zn, Pt, Ag, Cu, and the like.

Known methods for decreasing the content of the metallic impurities, i.e. the number of particles, in the resist composition include a method of preparing a solution by dissolving the resin in a solvent and filtering the solution through an ion exchange filter, washing with liquid, and a treatment with an acidic ion exchange resin or a chelate resin.

A preferred method for decreasing the content of the metallic impurities in the chemical amplification-type resist composition of the invention is a method comprising a step of filtering a solution of the resin of the invention through an ion exchange filter, subsequently a step of adding a photoacid generator, and a basic organic compound, a surfactant, or the like as needed to the solution to prepare a mixture, and lastly a step of filtering the mixture through a filter for removing insoluble colloid.

The ion exchange filters usable are preferably cation exchange filters where ion exchange groups are fixed on a porous film made of polyethylene or a porous film made of polypropylene, including Ionclean (produced by Nippon Pore Inc.) and Ionclean AQ (produced by Nippon Pore Inc.). The speed through the ion exchange filters preferably is from 500 to 10,000 $cc/min/m^2$. The filters for removing insoluble colloid preferably are filters made of synthetic resin, including Mykrolis Optimizer DEV-16/40 (polyethylene filter produced by Mykrolis Corp.), Mykroguard Minichem (polyethylene filter produced by Mykrolis Corp.), Enflon (polytetrafluoroethylene filter produced by Nippon Pore Inc.), Ultipore N66 (nylon 66 filter produced by Nippon Pore Inc.), Zetaplus (cellulose filter produced by CUNO Inc.), Electropore II (nylon 66 filter produced by CUNO Inc.), and the like. When the step of filtration is conducted after adding an ionic compound such as a photoacid generator, the filter for removing insoluble colloid preferably is that having no ion exchange capability.

The pore size of the ion exchange filter and the filter for removing insoluble colloid is preferably from 0.01 to 0.5 μm and more preferably from 0.01 to 0.1 μm.

In the invention, the resin as the component (A) preferably has an acid value of from $0.05 \times 10^{-3}$ to $6.0 \times 10^{-3}$ mol/g, more preferably from $0.1 \times 10^{-3}$ to $5.0 \times 10^{-3}$ mol/g, and most preferably from $0.2 \times 10^{-3}$ to $4.4 \times 10^{-3}$ mol/g. As the acid group that influences the oxidation is enumerated the hydroxyl group among the groups represented by the general formula (Z).

The method for controlling the acid value so as to fall in the range as described above can be realized by adjusting appropriately the composition ratio of a repeating unit containing a group where R is a hydrogen atom of the groups represented by general formula (Z) as described above.

[2] Components (B1) and (B2):

The photosensitive resin composition according to the invention contains a compound capable of generating an aliphatic or aromatic sulfonic acid substituted with at least one fluorine atom upon irradiation with one of an actinic ray and a radiation, especially $F_2$ excimer laser beams (this compound being referred to as "component (B1)").

Incidentally, in the invention, it is possible to use a compound capable of generating a fluorine atom-free aliphatic or aromatic sulfonic acid, or an aliphatic or aromatic carboxylic acid upon irradiation with one of an actinic ray and a radiation (this compound being referred to as "component (B2)") in combination with the component (B1).

When the component (B2) is combined with the component (B1), it is possible to enhance the coating properties and contrast.

In the component (B1), the aliphatic or aromatic sulfonic acid preferably has from 1 to 12 carbon atoms, more preferably from 2 to 16 carbon atoms, and most preferably from 3 to 12 carbon atoms.

The compounds (components (B1) and (B2)) capable of generating an acid upon irradiation with one of an actinic ray and a radiation can be selected from those that are generally used as a compound that is decomposed upon irradiation with one of an actinic ray and a radiation to generate an acid (this compound being referred to "photo acid generator").

Specifically, as the photo acid generator can be properly selected and used photo initiators of photo cationic polymerization, photo initiators of photo radical polymerization, light decoloring agents of dyes, light discoloring agents, and compounds to generate an acid by known lights used for microresists (such as ultraviolet rays of from 400 to 200 nm and far ultraviolet rays, and particularly preferably g-rays, h-ryas, i-rays, and KrF excimer laser beams), ArF excimer laser beams, $F_2$ excimer laser beams, electron beams, X rays, molecular rays, or ion beams, or mixtures thereof.

Examples of such compounds include onium salts such as diazonium salts as described in S. I. Schlesinger, *Photogr. Sci. Eng.*, 18, 387 (1974) and T. S. Bal, et al., *Polymer*, 21, 423 (1980), ammonium salts as described in U.S. Pat. Nos. 4,069,955 and 4,069,056, U.S. Re. Pat. No. 27,992, and JP-A-3-140140, phosphonium salts as described in D. C. Necker, et al., *Macromolecules*, 17, 2468 (1984), C. S. Wen, et al., *Teh. Proc. Conf. Rad. Curing ASIA*, p. 478, Tokyo, October (1988), and U.S. Pat. Nos. 4,069,055 and 4,069,056, iodonium salts as described in J. V. Crivello, et al., *Macromolecules*, 10(6), 1307 (1977), *Chem. & Eng. News*, November 28, p. 31 (1988), European Patent Nos. 104,143, 339,049 and 410,201, JP-A-2-150848, and JP-A-2-296514, sulfonium salts as described in J. V. Crivello, et al., *Polymer J.*, 17, 73 (1985), J. V. Crivello, et al., *J. Org. Chem.*, 43, 3055 (1978), W. R. Watt, et al., *J. Polymer Sci., Polymer Chem. Ed.*, 22, 1789 (1984), J. V. Crivello, et al., *Polymer Bull.*, 14, 279 (1985), J. V. Crivello, et al., *Macromolecules*, 14(5), 1141(1981), J. V. Crivello et al., *J. Polymer Sci., Polymer Chem. Ed.*, 17, 2877 (1979), European Patent Nos. 370,693, 161,811, 410,201, 339,049, 233,567, 297,443 and 297,442, U.S. Pat. Nos. 4,933,377, 3,902,114, 4,760,013, 4,734,444 and 2,833,827, and German Patent Nos. 2,904, 626, 3,604,580 and 3,604,581, selenonium salts as described in J. V. Crivello, et al., *Macromolecules*, 10(6), 1307 (1977) and J. V. Crivello, et al., *J. Polymer Sci., Polymer Chem. Ed.*, 17, 1047 (1979), and arsonium salts as described in C. S. Wen, et al., *Teh. Proc. Conf. Rad. Curing ASIA*, p. 478, Tokyo, October (1988); organic halides as described in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339; organic metal/organic halides as described in K. Meier, et al., *J. Rad. Curing*, 13(4), 26 (1986), T. P. Gill, et al., *Inorg. Chem.*, 19, 3007 (1980), D. Astruc, *Acc. Chem. Res.*, 19(12), 377 (1986), and JP-A-2-161445; photo acid generators having an o-nitrobenzyl type protective group as described in S. Hayase, et al., *J. Polymer Sci.*, 25, 753 (1987), E. Reichmanis, et al., *J. Polymer Sci., Polymer Chem. Ed.*, 23, 1 (1985), Q. Q. Zhuetal, *J. Photochem.*, 36, 85, 39, 317 (1987), B. Amit, et al., *Tetrahedron Lett.*, (24), 2205 (1973), D. H. R. Barton, et al., *J. Chem. Soc.*, 3571 (1965), P. M. Collins, et al., *J. Chem. Soc., Perkin I*, 1695 (1975), M. Rudinstein, et al., *Tetrahedron Lett.*, (17), 1445 (1975), J. W. Walker, et al., *J. Am. Chem. Soc.*, 110, 7170 (1988), S. C. Bushman, et al., *J. Imaging Technol.*, 11(4), 191 (1985), H. M. Houlihan, et al., *Macromolecules*, 21, 2001 (1988), P. M. Collins, et al., *J. Chem. Soc., Chem. Commun.*, 532 (1972), S. Hayase, et al., *Macromolecules*, 18, 1799 (1985), E. Reichmanis, et al., *J. Electrochem. Soc., Solid State Sci. Technol.*, 130(6), F. M. Houlihan, et al., *Macromolecules*, 21, 2001 (1988), European Patent Nos. 290,750, 46,083, 156,535, 271,851 and 388,343, U.S. Pat. Nos. 3,901,710 and 4,181,531, JP-A-60-198538, and JP-A-53-133022; compounds that are photo-decomposed to generate a sulfonic acid, represented by iminosulfonate as described in M. TUNOOKA, et al., *Polymer Preprints Japan*, 35(8), B. Berner, et al., *J. Rad. Curing*, 13(4), W. J. Mijs, et al., *Coating Technol.*, 55(697), 45 (1983), Akzo, H. Adachi, et al., *Polymer Preprints*, Japan, 37(3), European Patent Nos. 199,672, 84,515, 44,115, 618,564 and 101,122, U.S. Pat. Nos. 4,371,605 and 4,431,774, JP-A-64-18143, JP-A-2-245756, and JP-A-3-140109; and disulfone compounds as described in JP-A-61-166544.

As the combination of the component (B1) and the component (B2) are preferable the following combinations.

A combination in which the component (B1) is a compound capable of generating an aliphatic or aromatic sulfonic acid substituted with at least one fluorine atom upon irradiation with one of an actinic ray and a radiation; and the component (B2) is a compound capable of generating an aliphatic or aromatic sulfonic acid not containing a fluorine atom as an anion, or an ionic compound having an aliphatic or aromatic carboxylic acid that may have a fluorine atom as an anion.

[a] The compound capable of generating a fluorine-containing sulfonic acid upon irradiation with one of an actinic ray and a radiation (and ionic compound containing a fluorine-containing sulfonic acid as an anion) will be described.

For example, iodonium salts represented by the following general formula (PAG3) and sulfonium salts represented by the following general formula (PAG4) can be enumerated.

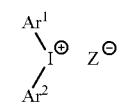
(PAG3)

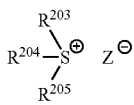
(PAG4)

In the formulae, $Ar^1$ and $Ar^2$ each independently represents a substituted or unsubstituted aryl group; $R^{203}$, $R^{204}$, and $R^{205}$ each independently represents a substituted or unsubstituted alkyl group or a substituted or unsubstituted aryl group; $Z^-$ represents a sulfonic anion having at least one fluorine atom; and two of $R^{203}$, $R^{204}$, and $R^{205}$, or $Ar^1$ and $Ar^2$ may be taken together via the single bond or substituent thereof.

The aryl group represented by $Ar^1$, $Ar^2$, $R^{203}$, $R^{204}$, and $R^{205}$ is preferably an aryl group having from 6 to 14 carbon atoms, and the alkyl group represented by $Ar^1$, $Ar^2$, $R^{203}$, $R^{204}$, and $R^{205}$ is preferably an alkyl group having from 1 to 8 carbon atoms.

Preferred examples of the substituent on the aryl group include an alkoxy group having from 1 to 8 carbon atoms, an alkyl group having from 1 to 8 carbon atoms, an alkoxycarbonyl group having from 2 to 9 carbon atoms, an alkylcarbonylamino group having from 2 to 9 carbon atoms, a nitro group, a carboxyl group, a hydroxyl group, a halogen atom, and a phenylthio group; and preferred examples of the substituent on the alkyl group include an alkoxy group having from 1 to 8 carbon atoms, an aryl group having from 5 to 14 carbon atoms, an arylcarbonyl group having from 6 to 15 carbon atoms, a carboxyl group, and a halogen atom.

Preferred examples of the sulfonic anion represented by $Z^-$ include an aliphatic hydrocarbon having from 1 to 20 carbon atoms and an aromatic hydrocarbon having from 5 to 20 carbon atoms, each of which has at least one fluorine atom and may be substituted. Examples of the substituent include an optionally fluorine-substituted alkoxy group having from 1 to 10 carbon atoms, an optionally fluorine-substituted alkoxycarbonyl group having from 2 to 11 carbon atoms, a phenylamino group, a phenylcarbonyl group, a halogen atom, and a hydroxyl group. As the substituent on the aromatic hydrocarbon can further be enumerated an alkyl group having from 1 to 15 carbon atoms.

Specific examples will be given below, but it should not be construed that the invention is limited thereto.

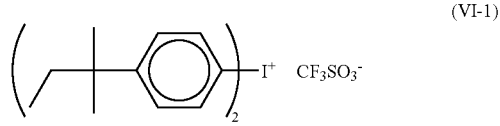
(VI-1)

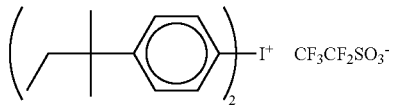
(VI-2)

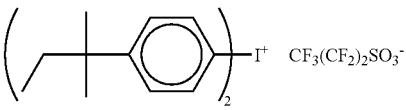
(VI-3)

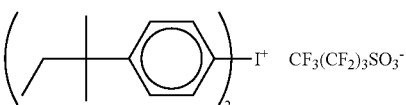
(VI-4)

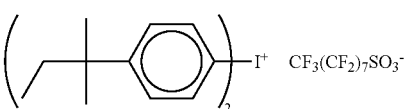
(VI-5)

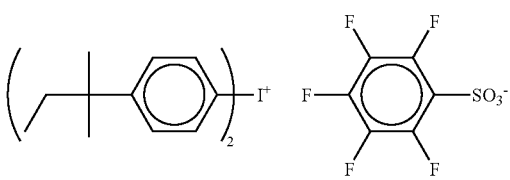
(VI-6)

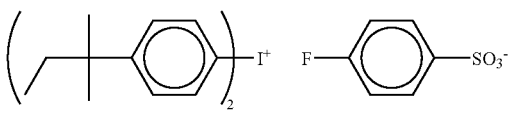
(VI-7)

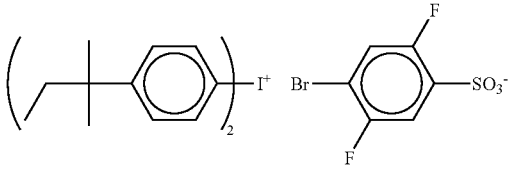
(VI-8)

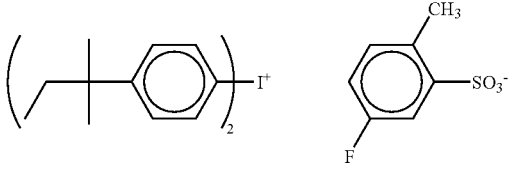
(VI-9)

(VI-10)

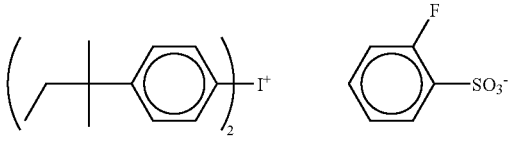
(VI-11)

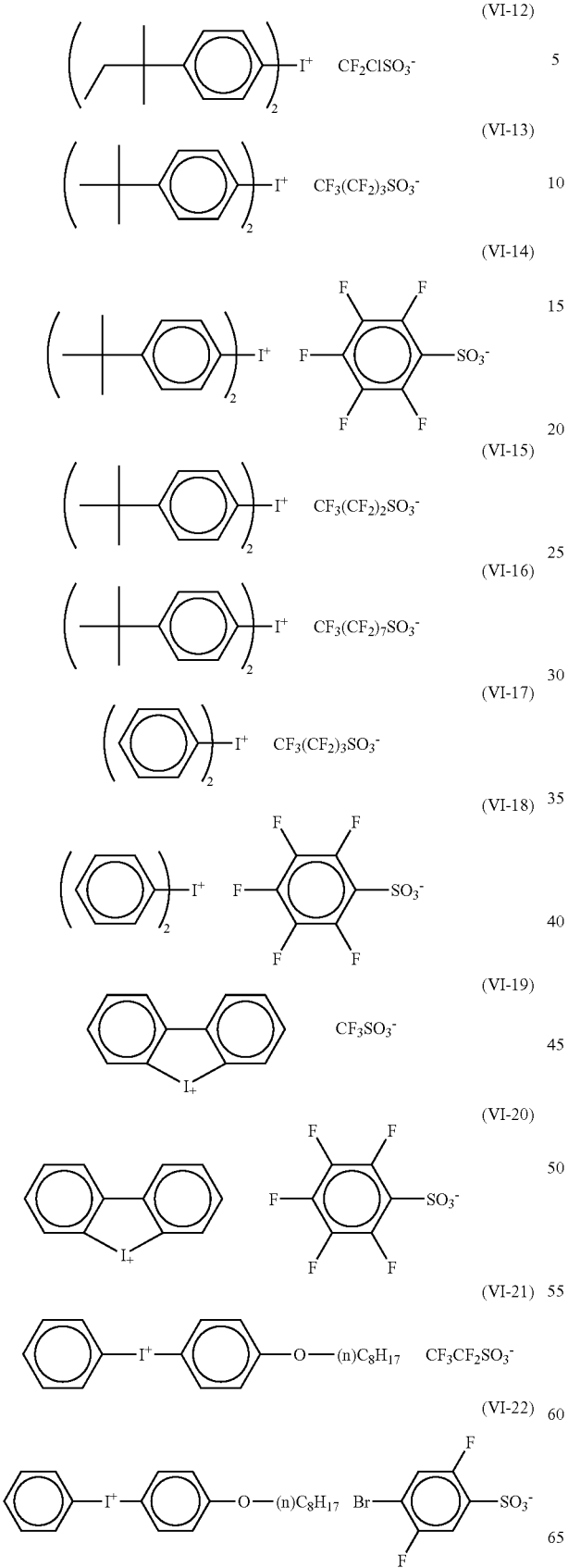

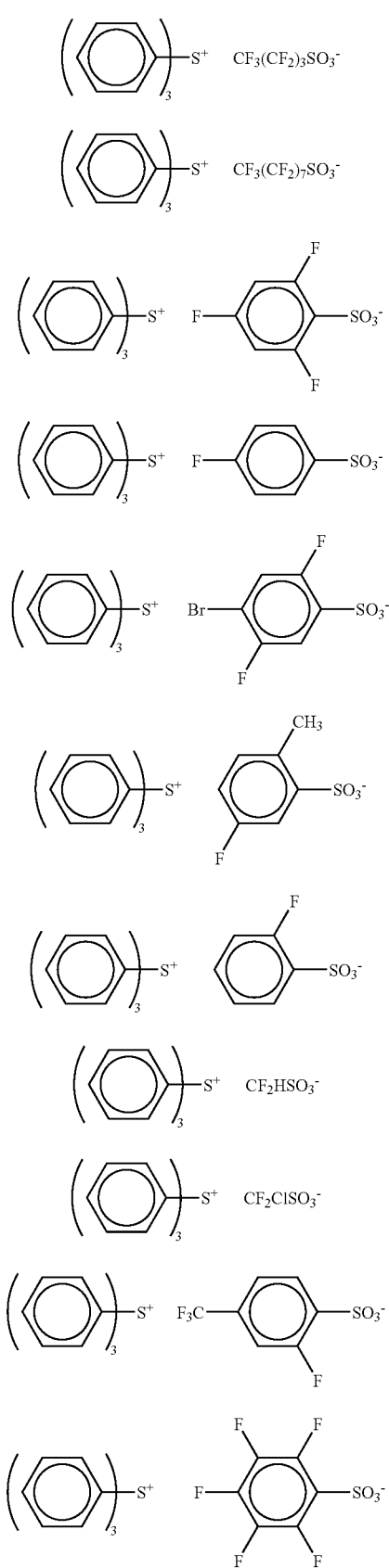
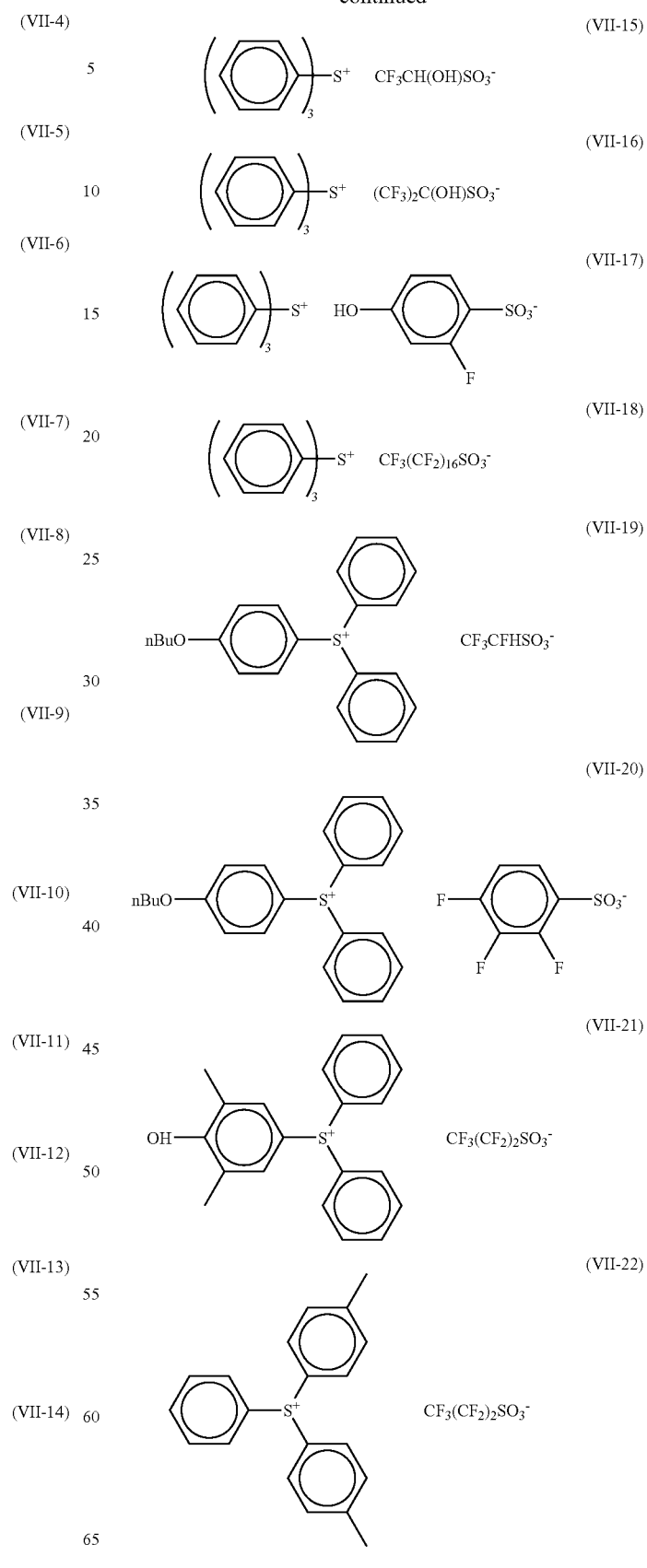

-continued
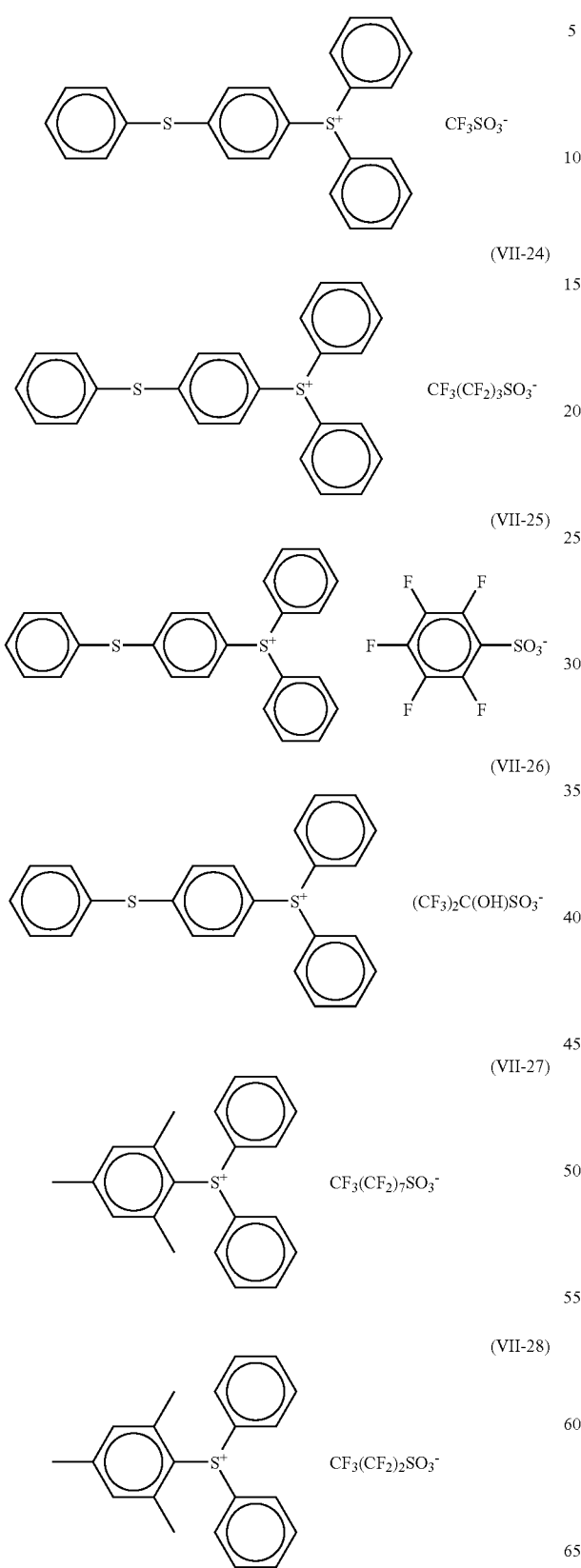
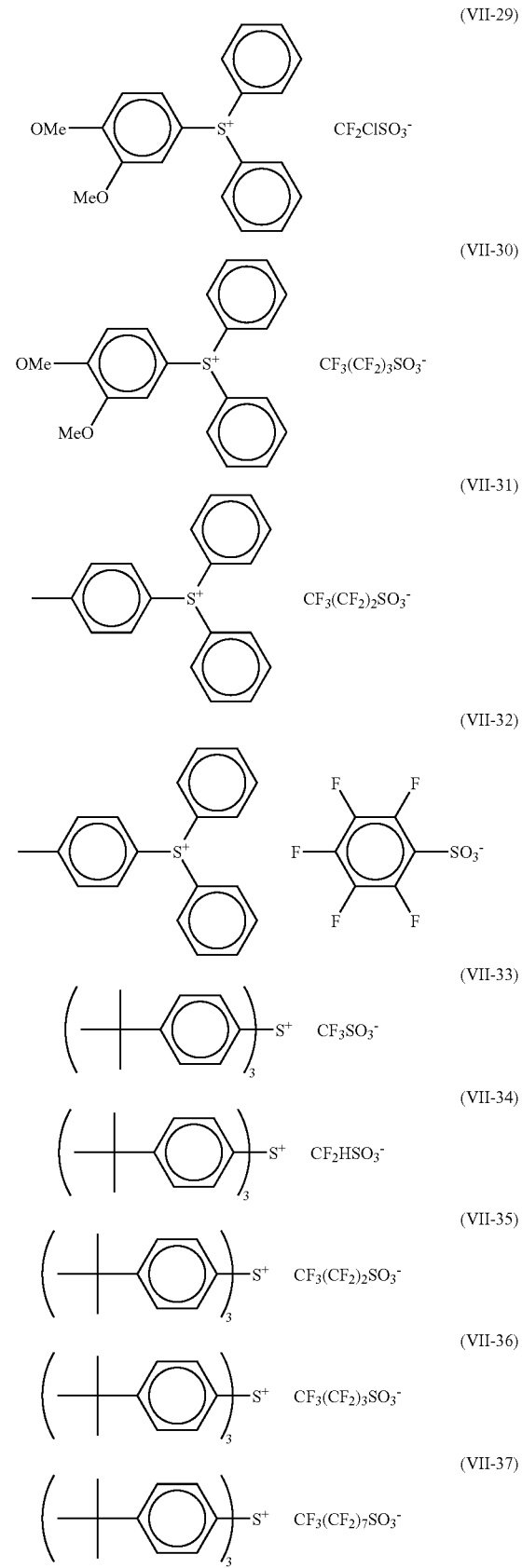

-continued
(VII-38)
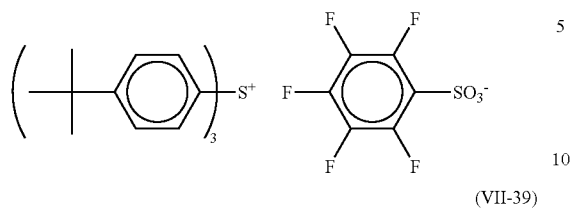
(VII-39)
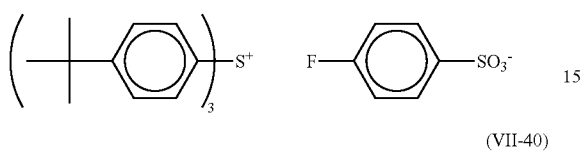
(VII-40)
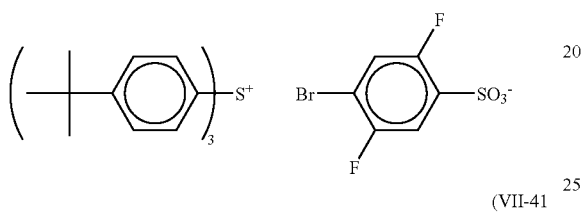
(VII-41)
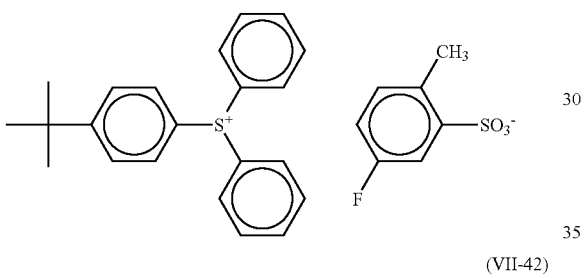
(VII-42)
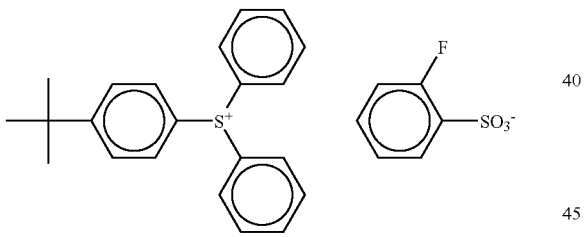
(VII-43)
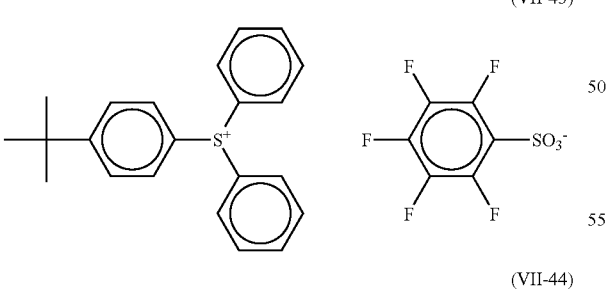
(VII-44)
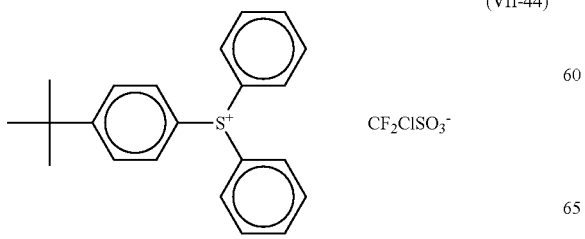
-continued
(VII-45)
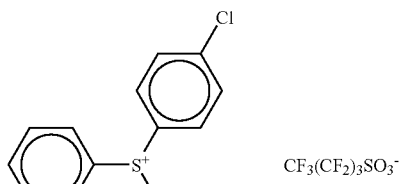
(VII-46)
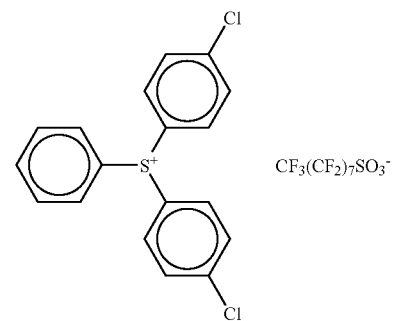
(VII-47)
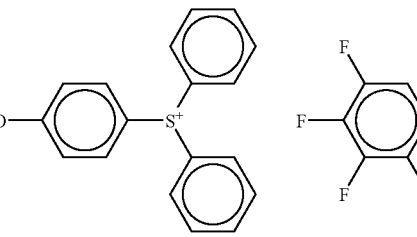
(VII-48)
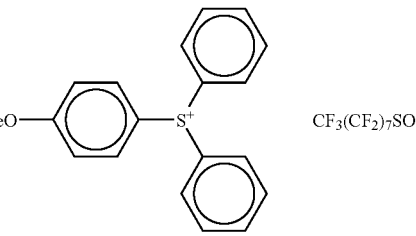
(VII-49)
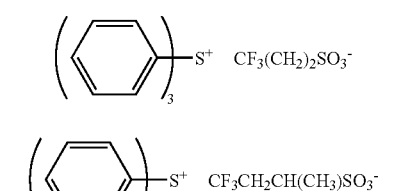
(VII-50)
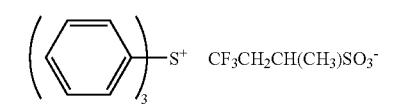
(VII-51)
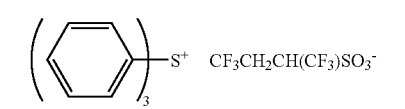
(VII-52)
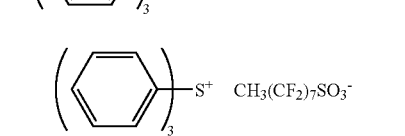

-continued (VII-53)
$(\mathrm{C_6H_5})_3\mathrm{S}^+ \quad \mathrm{CF_3(CF_2)_2O(CF_2)_2SO_3^-}$ (VII-54)
$(\mathrm{C_6H_5})_3\mathrm{S}^+ \quad \mathrm{CF_3(CF_2)_2OCF(CF_3)SO_3^-}$ (VII-55)
$(\mathrm{C_6H_5})_3\mathrm{S}^+ \quad \mathrm{F[CF(CH_3)CF_2O]_2CF(CF_3)SO_3^-}$ (VII-56)
$(\mathrm{C_6H_5})_3\mathrm{S}^+ \quad \mathrm{F[CF(CF_3)CF_2O]_2CF(CF_3)SO_3^-}$

[b] As the compound capable of generating a fluorine-free sulfonic acid upon irradiation with one of an actinic ray and a radiation and the ionic compound having a fluorine-free sulfonic acid as an anion can be enumerated iodonium salts and sulfonium salts represented by the foregoing general formulae (PAG3) and (PAG4), respectively, wherein Z⁻ represents a fluorine atom-free sulfonic anion.

Specific examples of the compound will be given below, but it should not be construed that the invention is limited thereto.

(PAG3-1)

(PAG3-2)

(PAG3-5)

(PAG3-7)

(PAG3-9)

(PAG3-10)

(PAG3-11)

(PAG3-13)

(PAG3-14)

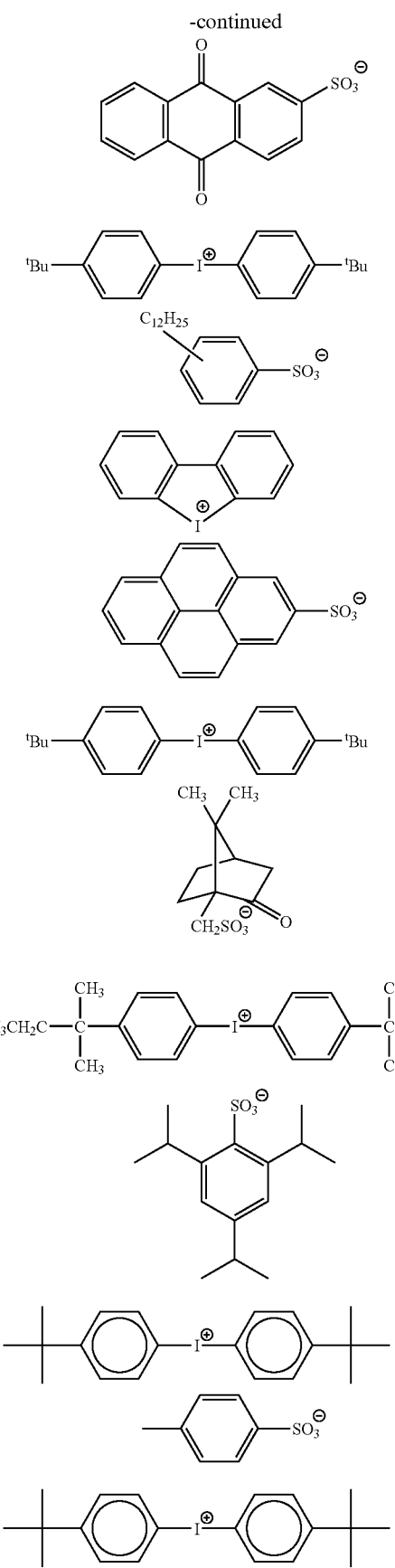
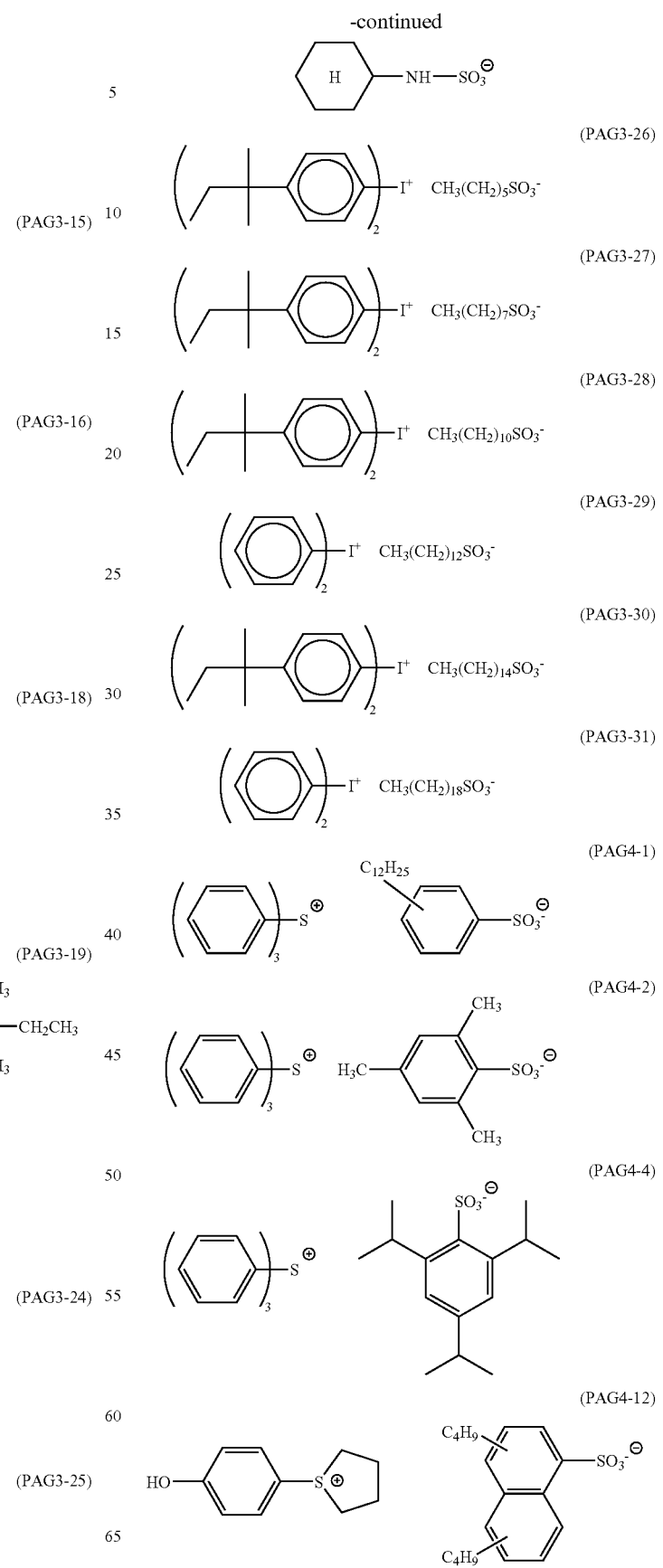

(PAG4-16)
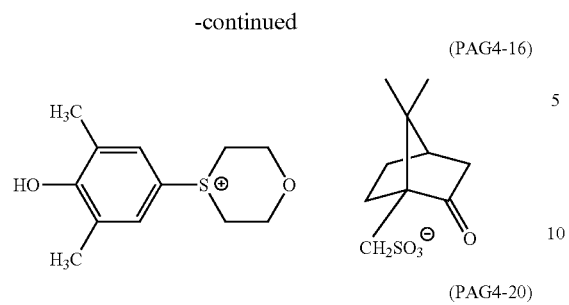
(PAG4-20)
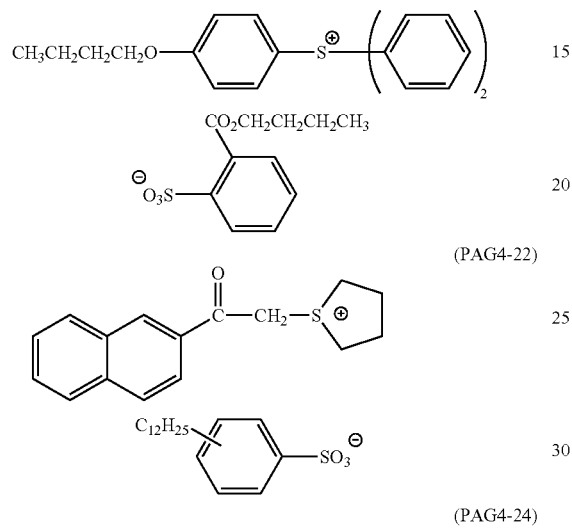
(PAG4-22)
(PAG4-24)
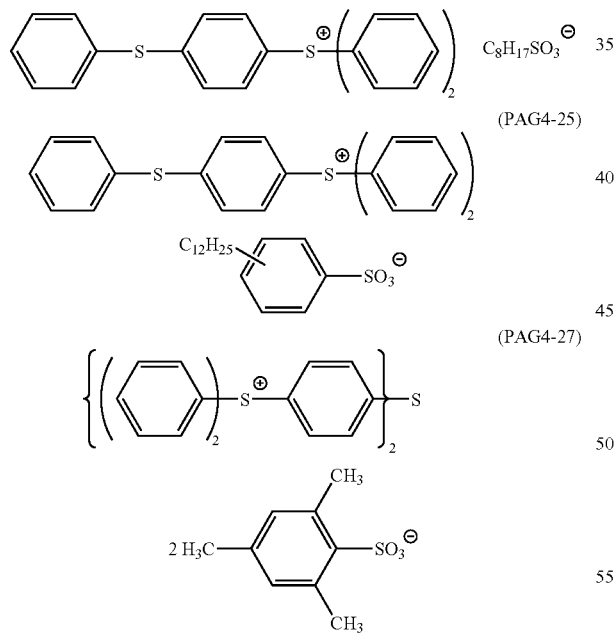
(PAG4-25)
(PAG4-27)
(PAG4-28)
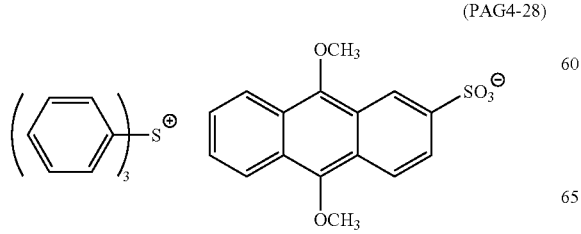
(PAG4-30)
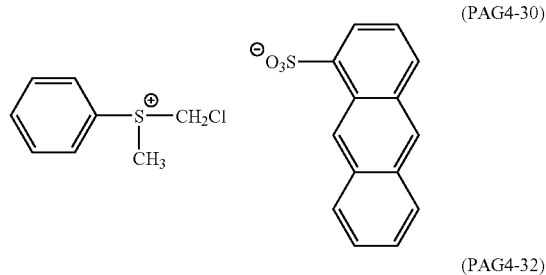
(PAG4-32)
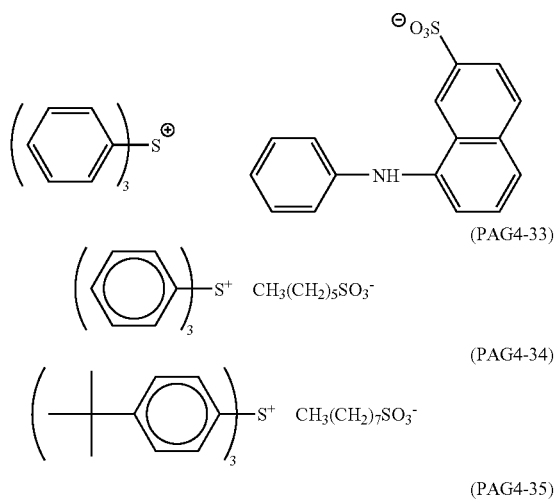
(PAG4-33)
(PAG4-34)
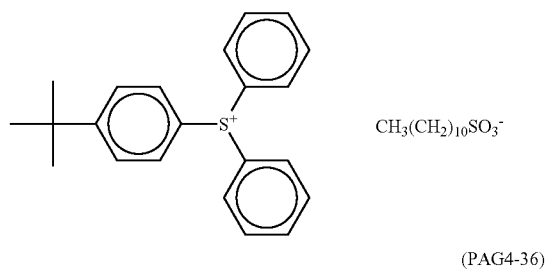
(PAG4-35)
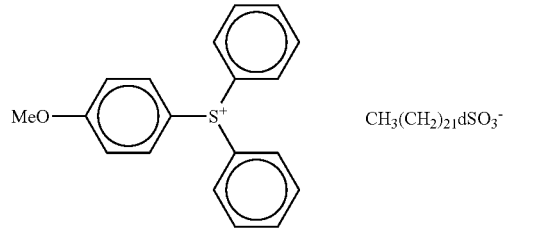
(PAG4-36)
(PAG4-37)
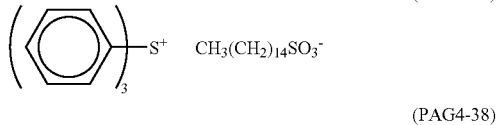
(PAG4-38)
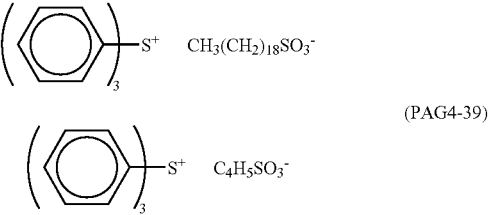
(PAG4-39)

Further, disulfone derivatives represented by the following general formula (PAG5) and iminosulfonate derivatives represented by the following general formula (PAG6) can be enumerated.

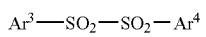
(PAG5)

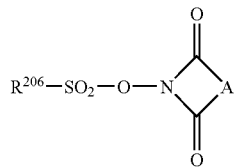
(PAG6)

In the formulae, $Ar^3$ and $Ar^4$ each independently represents a substituted or unsubstituted aryl group; $R^{206}$ represents a substituted or unsubstituted alkyl group or a substituted or unsubstituted aryl group; and A represents a substituted or unsubstituted alkylene group, a substituted or unsubstituted alkenylene group, or a substituted or unsubstituted arylene group.

Specific examples will be given below, but it should not be construed that the invention is limited thereto.

(PAG5-1)

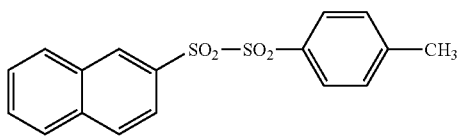

(PAG5-2)

(PAG5-3)

(PAG5-4)

(PAG5-6)

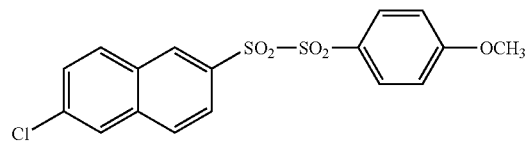

(PAG5-7)

(PAG5-8)

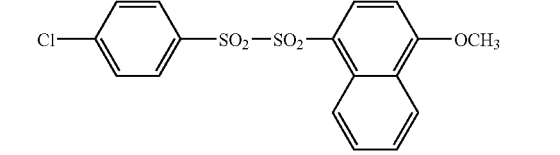

-continued (PAG5-9)

(PAG5-10)

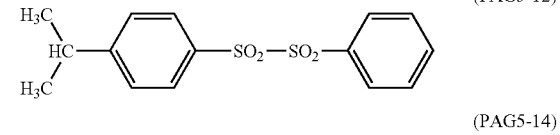

(PAG5-11)

(PAG5-12)

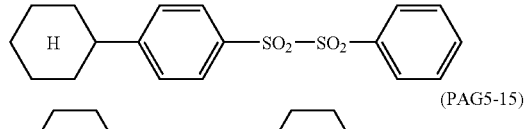

(PAG5-14)

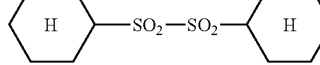

(PAG5-15)

(PAG6-1)

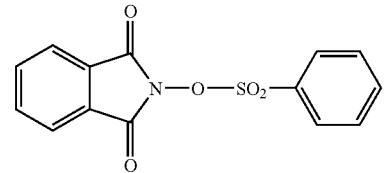

(PAG6-2)

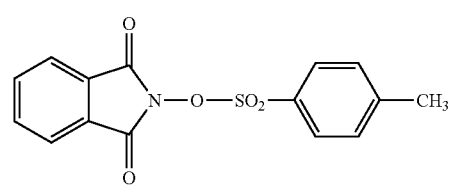

(PAG6-3)

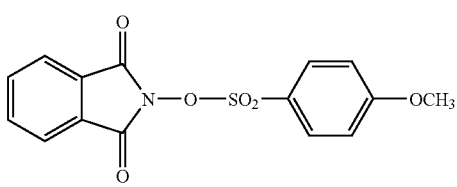

(PAG6-5)

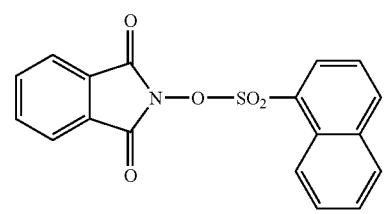

Moreover, diazodisulfone derivatives represented by the following general formula (PAG7) can be enumerated.

In the formula, R represents a linear, branched or cyclic alkyl group or an optionally substituted aryl group.

Specific examples will be given below, but it should not be construed that the invention is limited thereto.

The compounds as set forth in [a] and [b] as above can be synthesized by reacting an aromatic compound with a periodate and subjecting the obtained iodonium salt to salt exchange with a corresponding sulfonic acid.

Further, the compounds can be synthesized by a method in which a substituted or unsubstituted phenyl sulfoxide is reacted with an aryl Grignard reagent such as an aryl magnesium bromide, and the obtained triaryl sulfonium halide is subjected to salt exchange with a corresponding sulfonic acid. Moreover, the compounds can be synthesized by a method in which a substituted or unsubstituted phenyl sulfoxide is condensed and subjected to salt exchange with a corresponding aromatic compound in the presence of an acid catalyst such as methanesulfonic acid/diphosphorus pentoxide and aluminum chloride, or a method in which a diaryliodonium salt and a diaryl sulfide are condensed and subjected to salt exchange in the presence of a catalyst such as copper acetate.

The salt exchange can be carried out by a method in which a halide is first introduced and then exchanged to a sulfonate using a silver reagent such as silver oxide, or by using an ion exchange resin. As the sulfonic acid or sulfonate that is used for the salt exchange, commercially available materials can be used. Alternatively, it can be obtained by hydrolysis of a commercially available sulfonic halide.

[c] The compound capable of generating a fluorine-containing carboxylic acid upon irradiation with one of an actinic ray and a radiation and the ionic compound containing a fluorine-containing carboxylic acid as an anion will be described.

Examples of the fluorine-substituted aliphatic carboxylic acid include fluorine-substituted compounds of an aliphatic carboxylic acid such as acetic acid, propionic acid, n-butyric acid, isobutyric acid, valerianic acid, trimethylacetic acid, capronic acid, heptanoic acid, caprylic acid, pelargonic acid, capric acid, lauric acid, myristic acid, palmitic acid, stearic acid, undecanoic acid, dodecanoic acid, and tridecanoic acid. These compounds may have a hydroxyl group, an alkoxy group, or a halogen atom as a substituent. Further, those containing a connecting group such as an oxygen atom, a sulfur atom, a carbonyl group, a carboxyl group, and a sulfonyl group in the aliphatic chain thereof are preferred.

As the fluorine-substituted aliphatic carboxylic acid are preferable those represented by the following general formula.

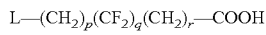

L—(CH$_2$)$_p$(CF$_2$)$_q$(CH$_2$)$_r$—COOH

In the general formula, L represents a hydrogen atom or a fluorine atom; p and r each independently represents an integer of from 0 to 15; and q represents an integer of from 1 to 15. In the general formula, the hydrogen atom(s) or fluorine atom(s) may be substituted with an optionally fluorine atom-substituted alkyl group (preferably one having from 1 to 5 carbon atoms), an optionally fluorine atom-substituted alkoxy group (preferably one having from 1 to 5 carbon atoms), or a hydroxyl group.

As the fluorine-substituted aliphatic carboxylic acid are preferable fluorine-substituted compounds of a saturated aliphatic carboxylic acid having from 2 to 20 carbon atoms, and more preferably from 4 to 20 carbon atoms. When the number of carbon atoms is 4 or more, the diffusibility of the generated carboxylic acid is lowered, and the lapsing change in line width after exposure until heating can be more inhibited. Among them, fluorine-substituted compounds of a linear or branched saturated aliphatic carboxylic acid having from 4 to 18 carbon atoms are preferred.

As the fluorine-substituted aromatic carboxylic acid are preferable fluorine-substituted compounds of an aromatic carboxylic acid having from 7 to 20 carbon atoms, more preferably from 7 to 15 carbon atoms, and most preferably from 7 to 11 carbon atoms. Specific examples include fluorine-substituted compounds of an aromatic carboxylic acid such as benzoic acid, a substituted benzoic acid, naphthoic acid, a substituted naphthoic acid, anthracenecarboxylic acid, and a substituted anthracenecarboxylic acid (wherein examples of the substituent include an alkyl group, an alkoxy group, a hydroxyl group, a halogen atom, an aryl group, an acyl group, an acyloxy group, a nitro group, an alkylthio group, and an arylthio group). Of these are preferable fluorine-substituted compounds of benzoic acid and a substituted benzoic acid.

These fluorine-substituted aliphatic or aromatic carboxylic acids are ones in which at least one hydrogen atom present in other skeleton than the carboxyl group is substituted with a fluorine atom, and particularly preferably aliphatic or aromatic carboxylic acids in which all hydrogen atoms present in other skeleton than the carboxyl group are substituted with a fluorine atom (perfluoro saturated aliphatic carboxylic acids or perfluoro saturated aromatic carboxylic acids). These compounds can make the sensitivity more superior.

Preferably, there are enumerated onium salt compounds (such as sulfonium salts and iodonium salts), carboxylic ester group-containing imidecarboxylate compounds, or nitrobenzyl ester compounds having an anion of the fluorine atom-substituted aliphatic or aromatic carboxylic acid as a counter anion.

More preferably, there are enumerated compounds represented by the following general formulae (I) to (III). These compounds can make the sensitivity, resolving power, and exposure margin more superior. Upon irradiation with one of an actinic ray and a radiation, these compounds generate a saturated aliphatic or aromatic carboxylic acid substituted with at least one fluorine atom, which is corresponding to X$^-$ of the general formulae (I) to (III), and function as a photo acid generator.

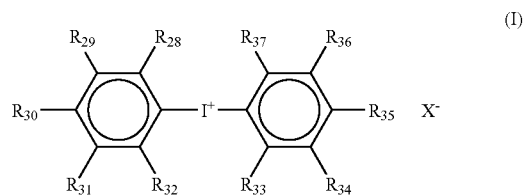

(I)

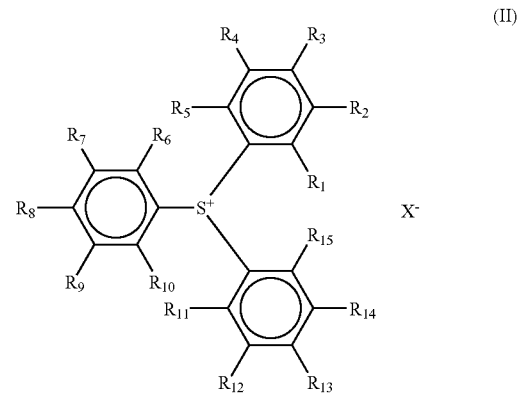

(II)

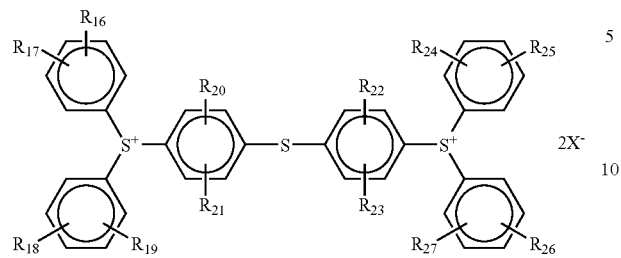

In the general formulae, $R_1$ to $R_{37}$ each independently represents a hydrogen atom, a linear, branched or cyclic alkyl group, a linear, branched or cyclic alkoxy group, a hydroxyl group, a halogen atom, or an —S—$R_{38}$ group; $R_{38}$ represents a linear brached or cyclic alkyl group or an aryl group; and X⁻ represents an anion of an aliphatic or aromatic carboxylic acid substituted with at least one fluorine atom.

X⁻ preferably represents an anion of a perfluoro aliphatic carboxylic acid or a perfluoro aromatic carboxylic acid, and particularly preferably an anion of a fluorine-substituted alkylcarboxylic acid having 4 or more carbon atoms.

In the general formulae (I) to (III), examples of the linear or branched alkyl group represented by $R_1$ to $R_{38}$ include ones having from 1 to 4 carbon atoms, which may be substituted, such as a methyl group, an ethyl group, a propyl group, an n-butyl group, a sec-butyl group, and a t-butyl group; and examples of the cyclic alkyl group represented by $R_1$ to $R_{38}$ include ones having from 3 to 8 carbon atoms, which may be substituted, such as a cyclopropyl group, a cyclopentyl group, and a cyclohexyl group.

Examples of the alkoxy group represented by $R_1$ to $R_{37}$ include ones having from 1 to 4 carbon atoms such as a methoxy group, an ethoxy group, a hydroxyethoxy group, a propoxy group, an n-butoxy group, an isobutoxy group, a sec-butoxy group, a t-butoxy group.

Examples of the halogen atom represented by $R_1$ to $R_{37}$ include a fluorine atom, a chlorine atom, a bromine atom, and an iodine atom.

Examples of the aryl group represented by $R_{38}$ include ones having from 6 to 14 carbon atoms such as a phenyl group, a tolyl group, a methoxyphenyl group, and a naphthyl group. The aryl group may be substituted.

Preferred examples of the substituent include an alkoxy group having from 1 to 4 carbon atoms, a halogen atom (such as a fluorine atom, a chlorine atom, and an iodine atom), an aryl group having from 6 to 10 carbon atoms, an alkenyl group having from 2 to 6 carbon atoms, a cyano group, a hydroxyl group, a carboxy group, an alkoxycarbonyl group, and a nitro group.

The iodonium compounds or sulfonium compounds represented by the general formulae (I) to (III), which are used in the invention, have an anion of a saturated aliphatic or aromatic carboxylic acid substituted with at least one fluorine atom, as the counter anion X⁻. These anions are an anion (—COO⁻) from which the hydrogen atom of the carboxylic acid (—COOH) has split off.

Specific examples will be given below, but it should not be construed that the invention is limited thereto. Specific examples (I-1f) to (I-36f) of the photo acid generator represented by the general formula (I):

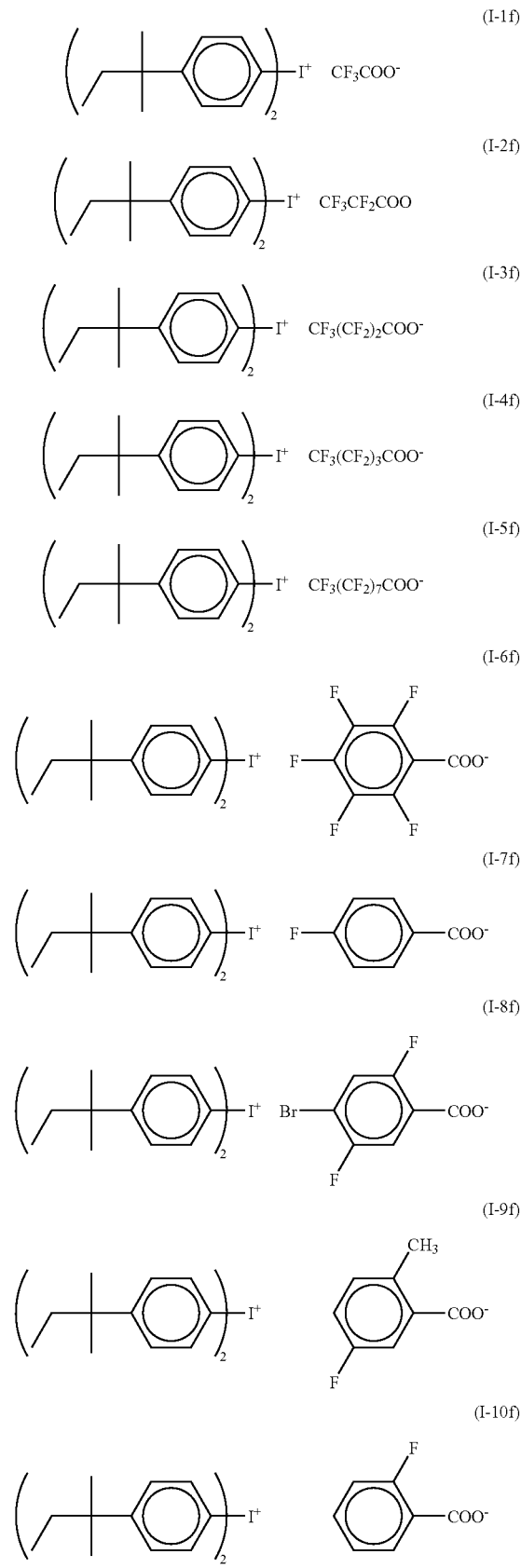

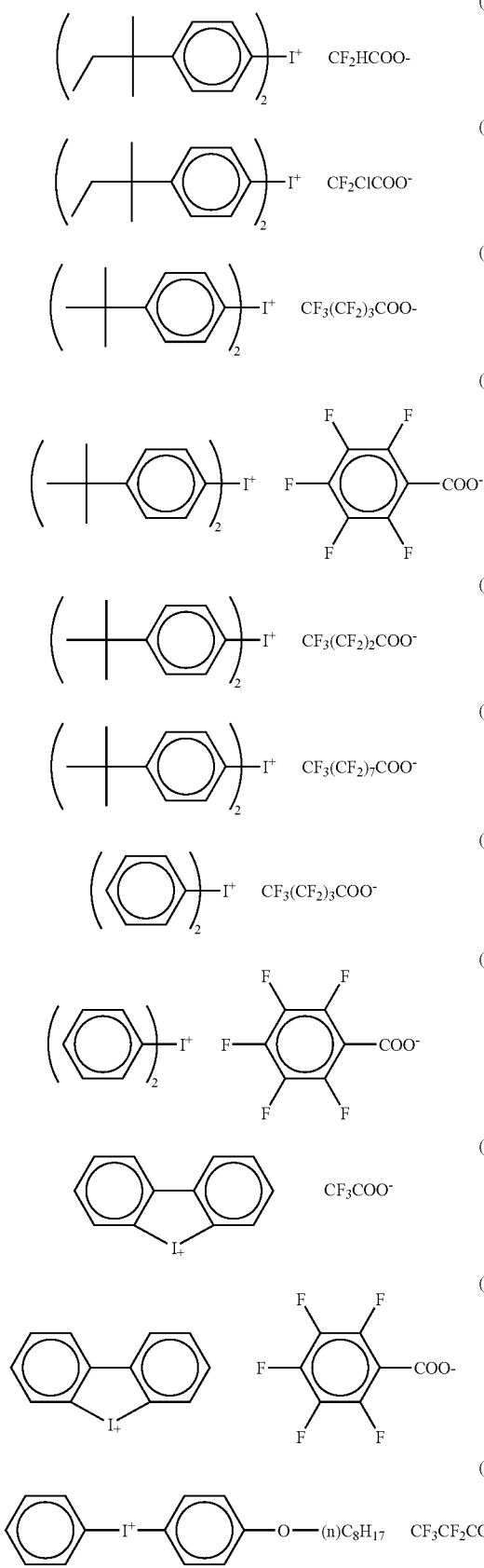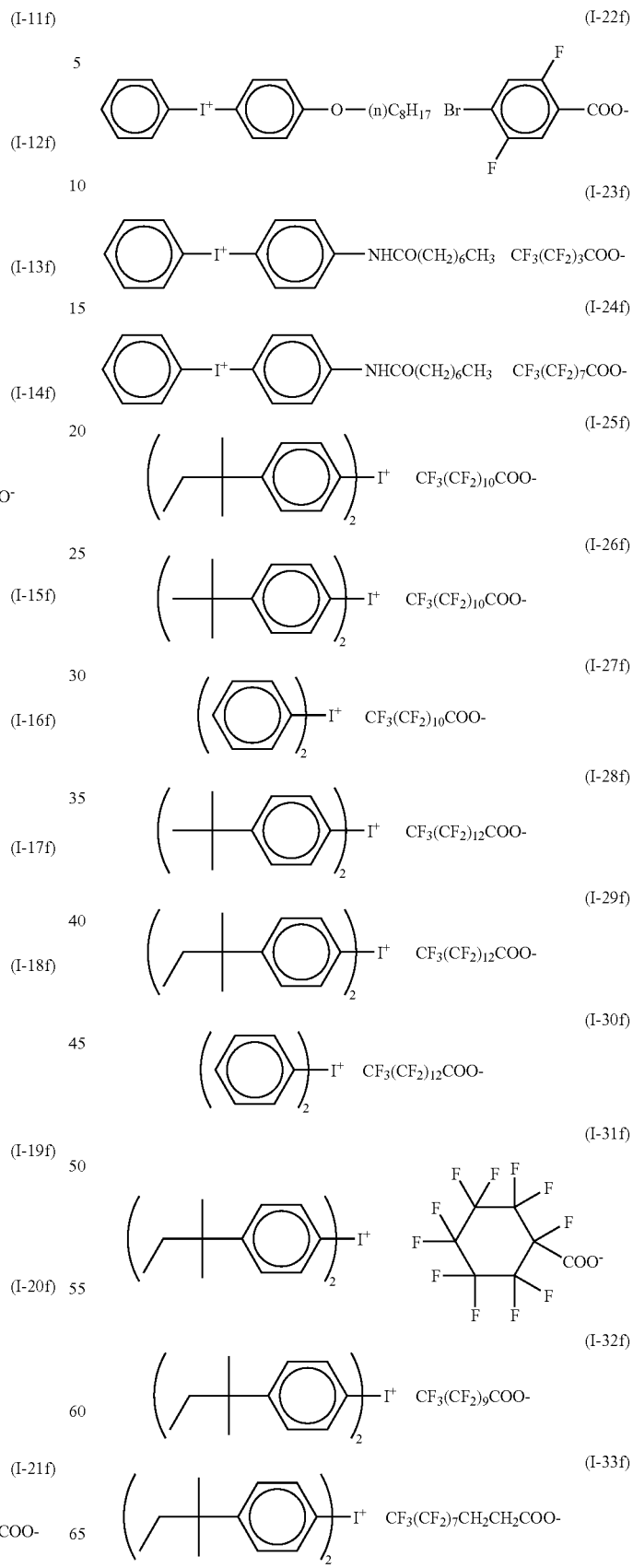

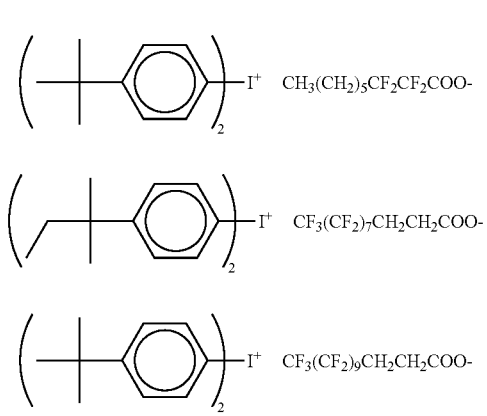
Specific examples (II-1f) to (II-67f) of the photo acid generator represented by the general formula (II):
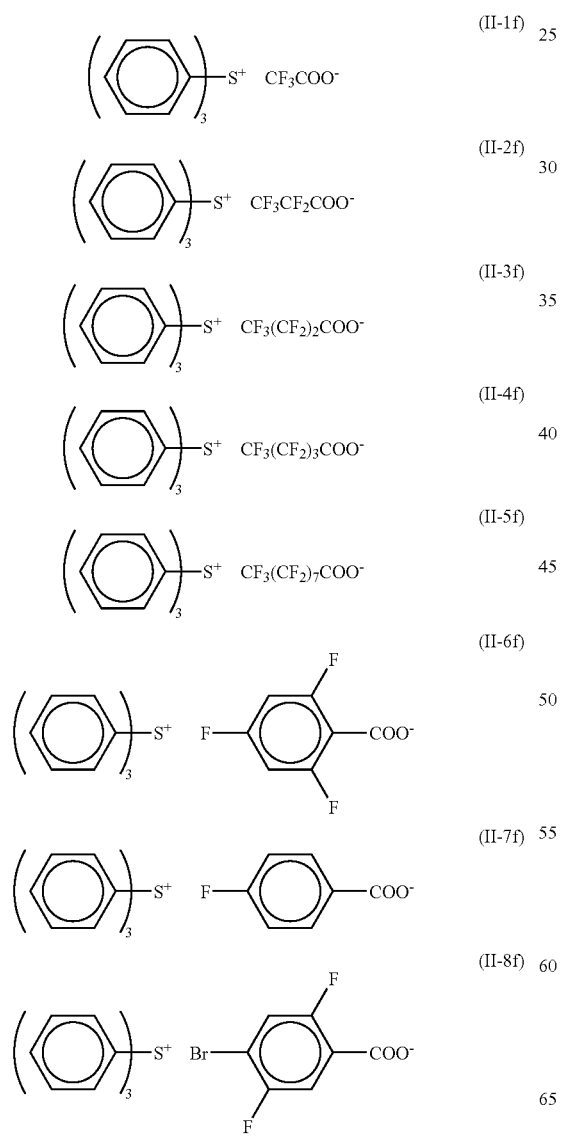
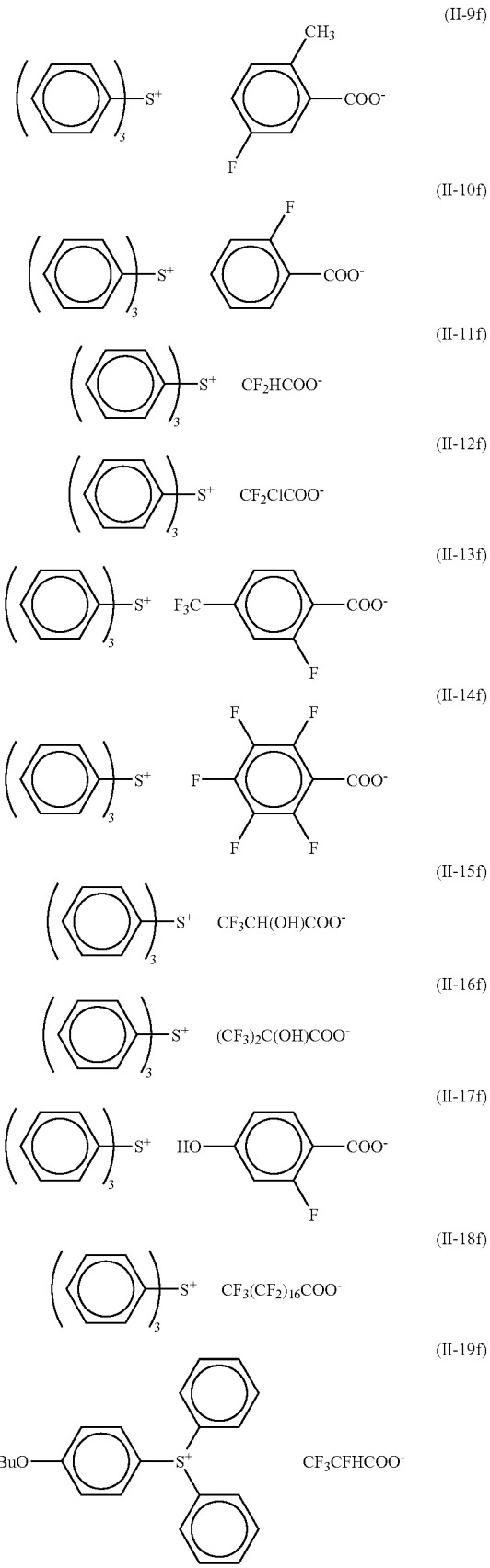

-continued
(II-20f)
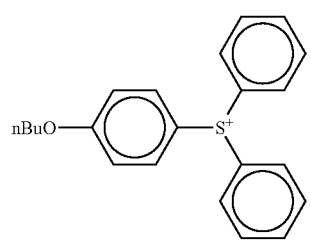
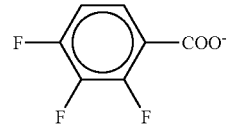
(II-21f)
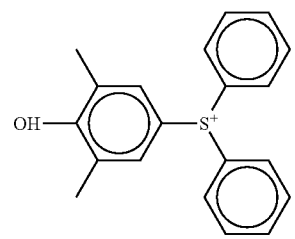
CF$_3$(CF$_2$)$_2$COO$^-$
(II-22f)
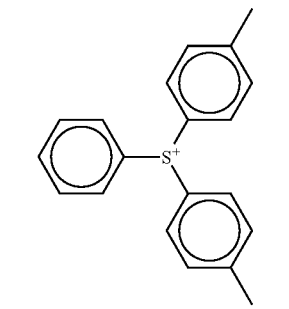
CF$_3$(CF$_2$)$_3$COO$^-$
(II-23f)
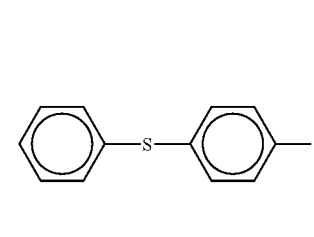
CF$_3$COO$^-$
(II-24f)
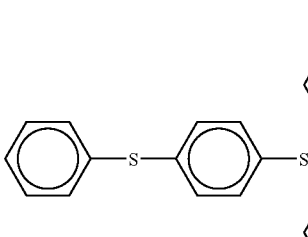
CF$_3$(CF$_2$)$_3$COO$^-$
(II-25f)
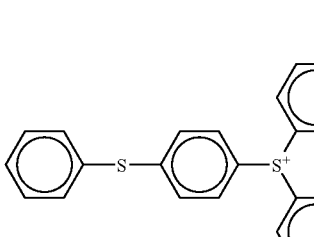
-continued
(II-26f)
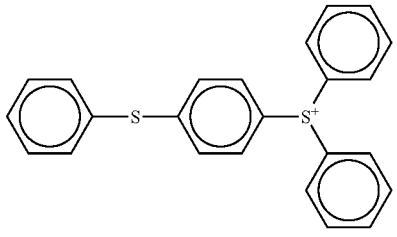
(CF$_3$)$_2$C(OH)COO$^-$
(II-27f)
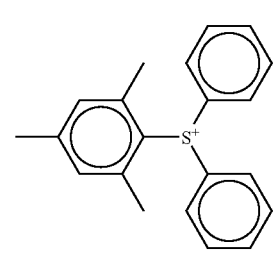
CF$_3$(CF$_2$)$_7$COO$^-$
(II-28f)
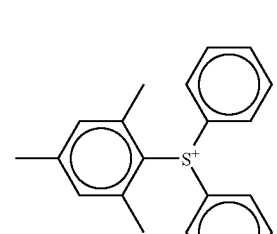
CF$_3$(CF$_2$)$_2$COO$^-$
(II-29f)
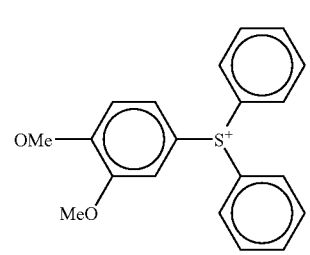
CF$_2$ClCOO$^-$
(II-30f)
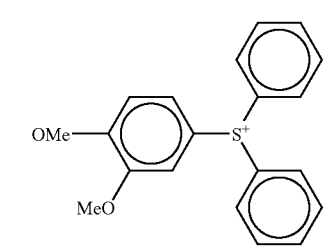
CF$_3$(CF$_2$)$_3$COO$^-$
(II-31f)
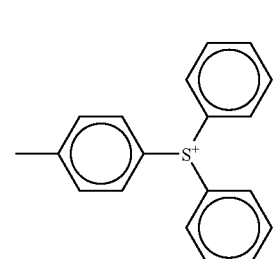
CF$_3$(CF$_2$)$_2$COO$^-$ -continued
(II-32f)
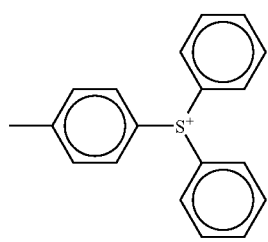 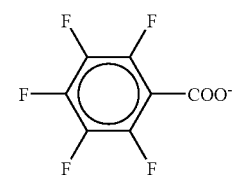
(II-33f)
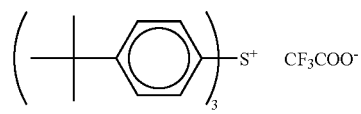 
(II-34f)
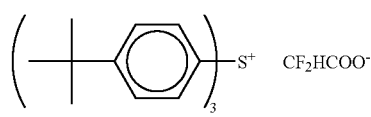 
(II-35f)
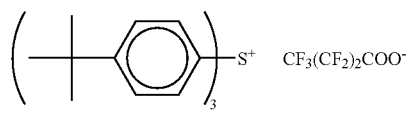 
(II-36f)
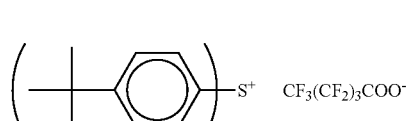 
(II-37f)
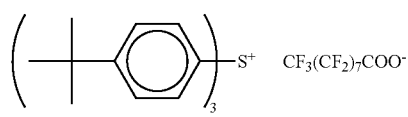 
(II-38f)
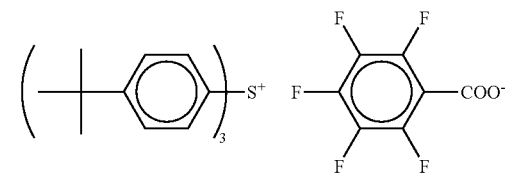 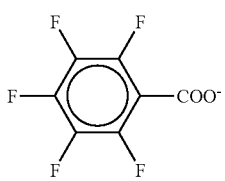
(II-39f)
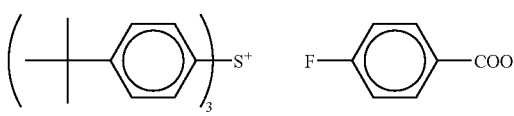 
(II-40f)
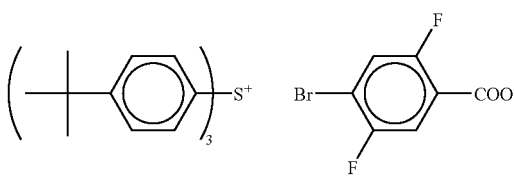 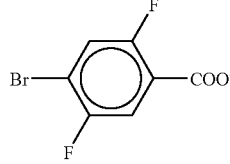
(II-41f)
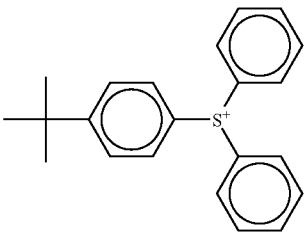 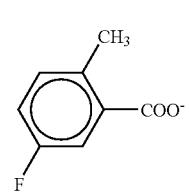
(II-42f)
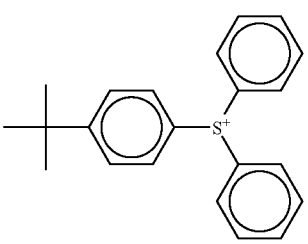 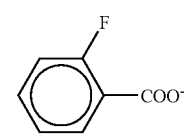
(II-43f)
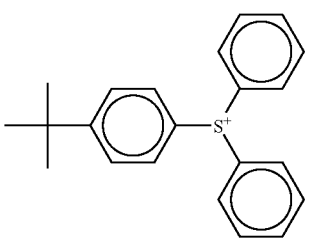 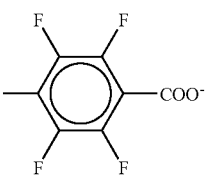
(II-44f)
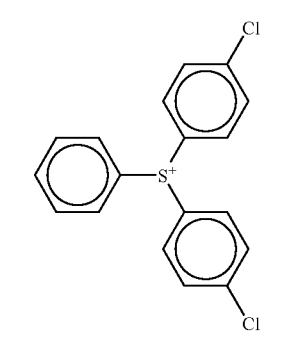 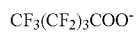
(II-45f)

-continued
(II-46f)
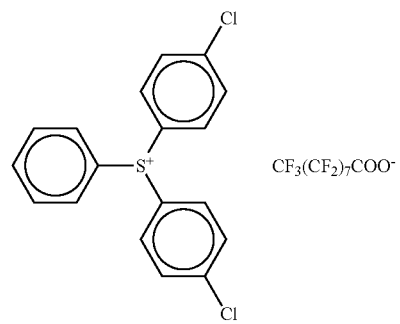
(II-47f)
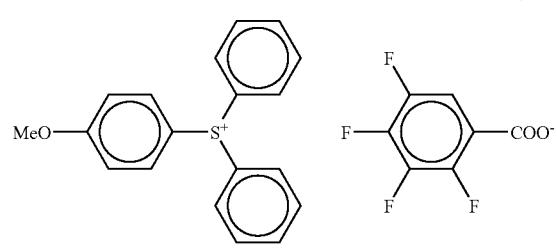
(II-48f)
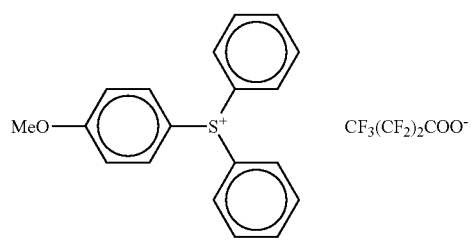
(II-49f)
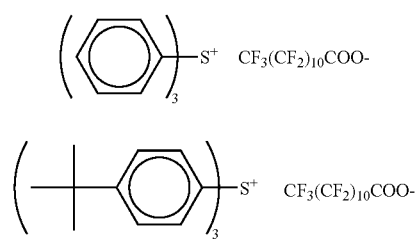
(II-50f)
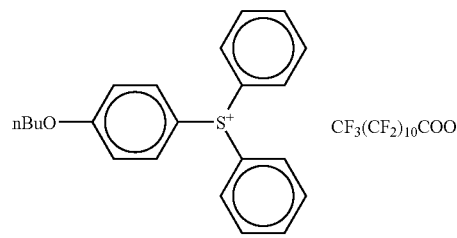
(II-51f)
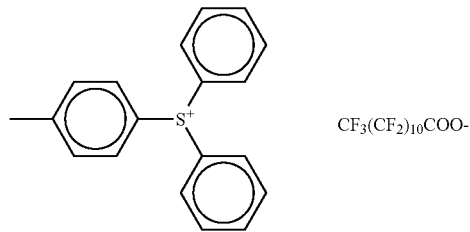
-continued
(II-53f)
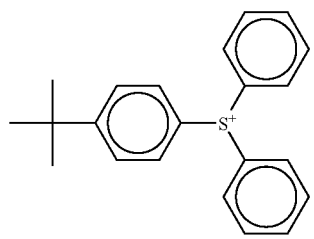
(II-54f)
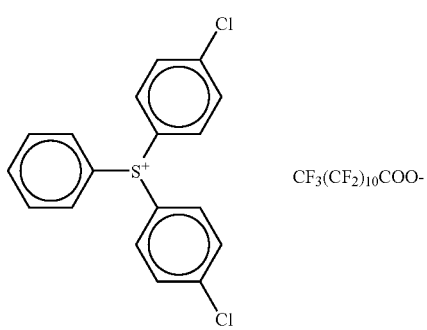
(II-55f)
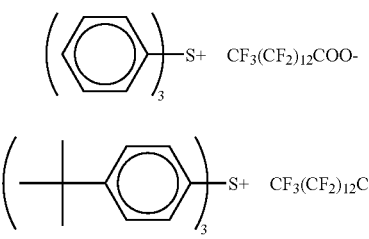
(II-56f)
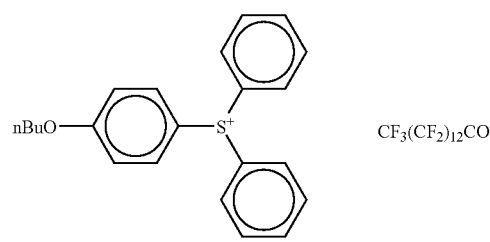
(II-57f)
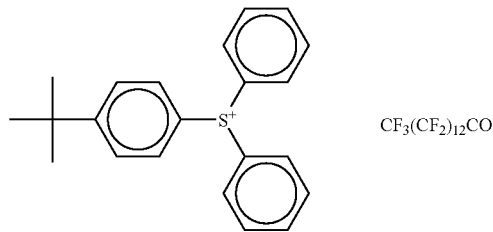
(II-58f)
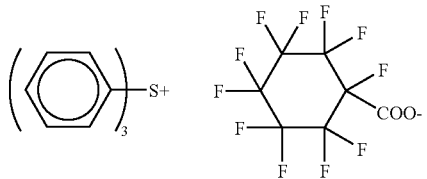
(II-59f)

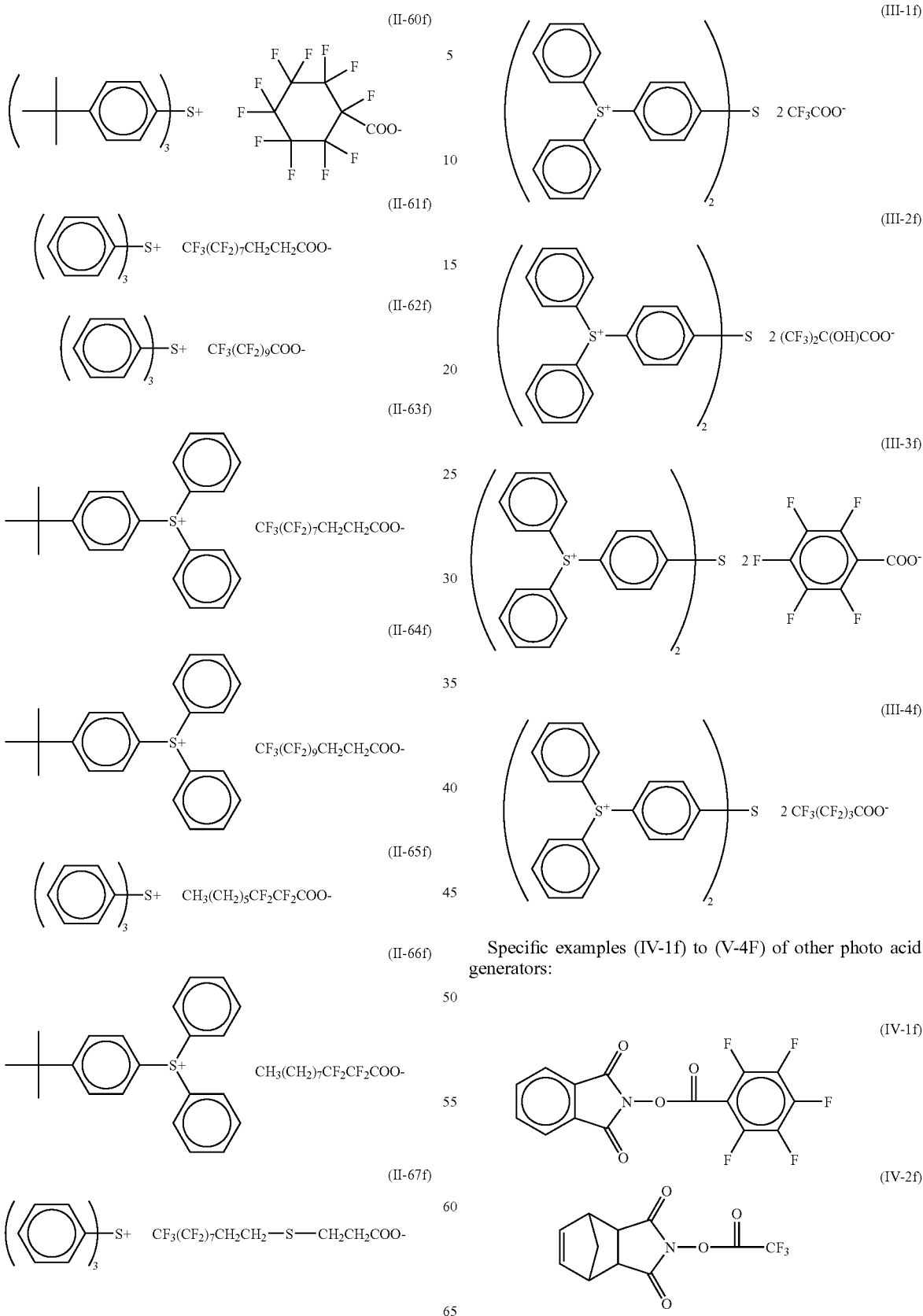

-continued

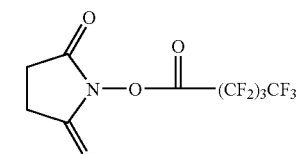 (IV-3f)

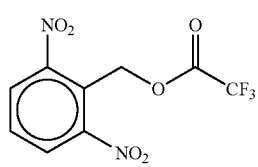 (V-1f)

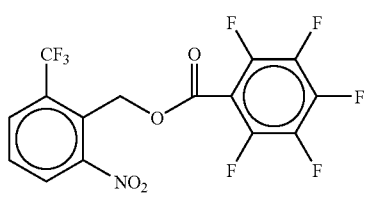 (V-2f)

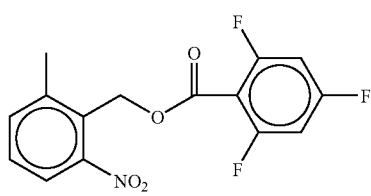 (V-3f)

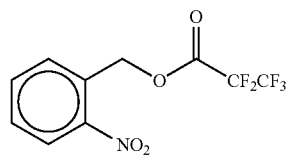 (V-4f)

The compounds represented by the general formula (I) can be synthesized by reacting an aromatic compound using a periodate and subjecting the obtained iodonium salt to salt exchange with a corresponding carboxylic acid.

The compounds represented by the general formulae (II) and (III) can be synthesized by, for example, a method in which a substituted or unsubstituted phenyl sulfoxide is reacted with an aryl Grignard reagent such as an aryl magnesium bromide, and the obtained triaryl sulfonium halide is subjected to salt exchange with a corresponding carboxylic acid. Moreover, the compounds can be synthesized by a method in which a substituted or unsubstituted phenyl sulfoxide is condensed and subjected to salt exchange with a corresponding aromatic compound in the presence of an acid catalyst such as methanesulfonic acid/diphosphorus pentoxide and aluminum chloride, or a method in which a diaryliodonium salt and a diaryl sulfide are condensed and subjected to salt exchange in the presence of a catalyst such as copper acetate.

The salt exchange can be carried out by a method in which a halide is first introduced and then exchanged to a sulfonate using a silver reagent such as silver oxide, or by using an ion exchange resin. As the sulfonic acid or sulfonate that is used for the salt exchange, commercially available materials can be used. Alternatively, it can be obtained by hydrolysis of a commercially available sulfonic halide.

As the fluorine-substituted carboxylic acid as the anion moiety is preferable one using a compound derived from fluoro aliphatic compounds produced by the telomerization process (also called as "telomer process") or the oligomerization process (also called as "oligomer process"). The production processes of these fluoro aliphatic compounds are described in, for example, *Fusso Kagobutsu no Gosei to Kino* (Syntheses and Functions of Fluorine Compounds), supervised by Nobuo Ishikawa, pp. 117–118 (1987), published by CMC Publishing Co., Ltd.; and *Chemistry of Organic Fluorine Compounds II* (Monograph 187, Ed by Milos Hudlicky and Attila E. Pavlath, American Chemical Society 1995), pp. 747–752. The telomerization process as referred to herein is a process in which a fluorine-containing vinyl compound such as tetrafluoroethylene is subjected to radical polymerization using, as a telogen, an alkyl halide having a large chain transfer constant, such as iodides, to synthesize a telomer. In the synthesis by the telomer process, a mixture of plural compounds having a different carbon chain length is obtained. In this case, the mixture may be used as it is or after purification.

[d] Specific examples of the compound capable of generating a fluorine-free carboxylic acid upon irradiation with one of an actinic ray and a radiation and the ionic compound having a fluorine-free carboxylic acid as an anion will be given below, but it should not be construed that the invention is limited thereto.

For example, there can be enumerated compounds represented by the following general formulae (AI) to (AV).

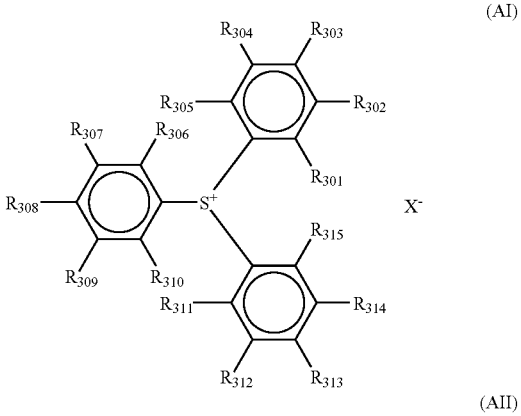 (AI)

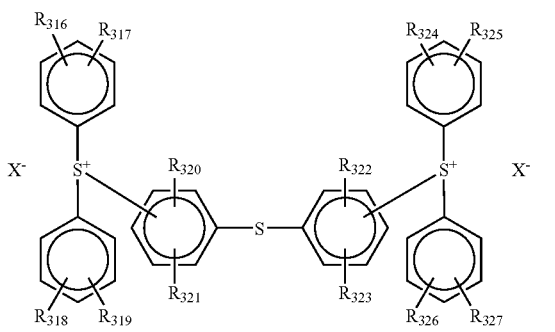 (AII)

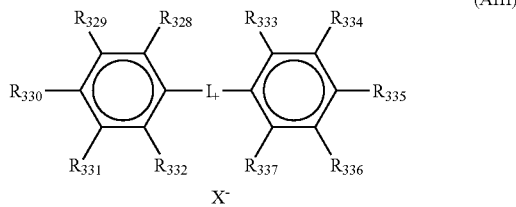 (AIII)

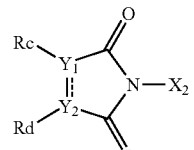
(AIV)

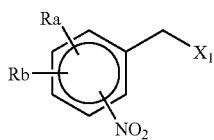
(AV)

In the formulae, $R_{301}$ to $R_{337}$ each independently represents a hydrogen atom, a linear, branched or cyclic alkyl group, a linear, branched or cyclic alkoxy group, a hydroxyl group, a halogen atom, or -an —S—$R_0$ group; $R_0$ represents a linear, branched or cyclic alkyl group or an aryl group; Ra and Rb each independently represents a hydrogen atom, a nitro group, a halogen atom, an optionally substituted alkyl group, or an optionally substituted alkoxy group; Rc and Rd each independently represents a halogen atom, an optionally substituted alkyl group, or an optionally substituted aryl group; Rc and Rd may be taken together to form an aromatic ring or a monocyclic or polycyclic hydrocarbon (these rings may contain an oxygen atom or a nitrogen atom); $Y_1$ and $Y_2$ each represents a carbon atom; the $Y_1$—$Y_2$ bond may be a single bond or a double bond; $X^-$ represents an anion of a carboxylic acid represented by the formulae as described below; and $X_1$ and $X_2$ each independently represents an ester group formed in the carboxyl group moiety of a carboxylic acid compound represented by the formulae as described below.

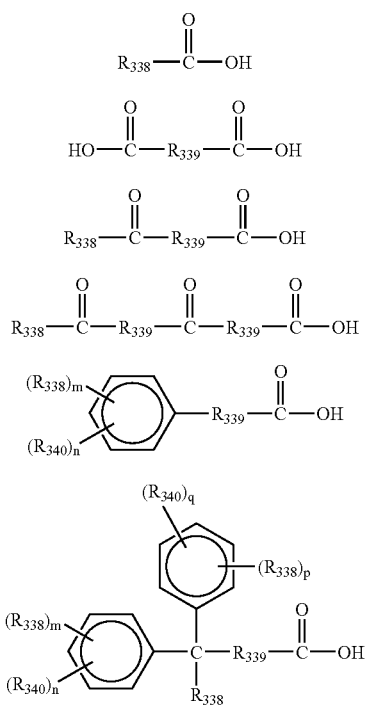

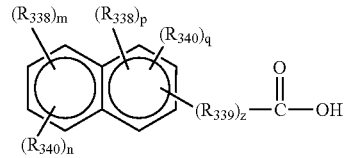
(C7)

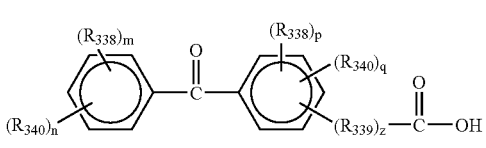
(C8)

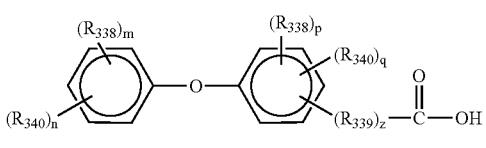
(C9)

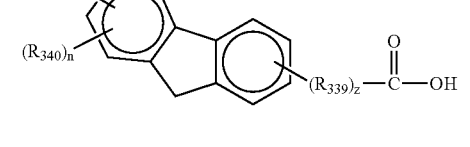
(C10)

In the formulae, $R_{338}$ represents a linear, branched or cyclic alkyl group having from 1 to 30 carbon atoms (the chain of the alkyl group may contain an oxygen atom or a nitrogen atom), a linear, branched or cyclic alkenyl group having from 1 to 20 carbon atoms, a linear, branched or cyclic alkynyl group having from 1 to 20 carbon atoms, a linear, branched or cyclic alkoxy group having from 1 to 20 carbon atoms, the foregoing alkyl group in which at least part of the hydrogen atoms is substituted with a halogen atom and/or a hydroxyl group, the foregoing alkenyl group in which at least part of the hydrogen atoms is substituted with a halogen atom and/or a hydroxyl group, or a substituted or unsubstituted aryl group having from 6 to 20 carbon atoms. Examples of the substituent on the aryl group include an alkyl group, a nitro group, a hydroxyl group, an alkoxy group, an acyl group, an alkoxycarbonyl group, and a halogen atom.

$R_{339}$ represents a single bond, a linear, branched or cyclic alkylene group having from 1 to 20 carbon atoms (the chain of the alkylene group may contain an oxygen atom or a nitrogen atom), a linear, branched or cyclic alkenylene group having from 1 to 20 carbon atoms, the foregoing alkylene group in which at least part of the hydrogen atoms is substituted with a halogen atom and/or a hydroxyl group, the foregoing alkenylene group in which at least part of the hydrogen atoms is substituted with a halogen atom, or an alkoxyalkylene group having from 2 to 20 carbon atoms. $R_{338}$'s and $R_{339}$'s, which are each present in a plural number, may be the same or different.

$R_{340}$ represents a hydroxyl group or a halogen atom, and $R_{340}$'s, which are present in a plural number, may be the same or different. m, n, p, and q each independently represents an integer of from 0 to 3; $(m+n) \leqq 5$; $(p+q) \leqq 5$; and z represents 0 or 1.

In the general formulae (AI) to (AV), examples of the linear and branched alkyl group represented by $R_{301}$ to $R_{337}$, Ra, Rb, Rc, Rd, and $R_0$ include ones having from 1 to 4 carbon atoms, which may be substituted, such as a methyl group, an ethyl group, a propyl group, an n-butyl group, a sec-butyl group, and a t-butyl group; and examples of the cyclic alkyl group represented by $R_{301}$ to $R_{337}$, Ra, Rb, Rc, Rd, and $R_0$ include ones having from 3 to 8 carbon atoms, which may be substituted, such as a cyclopropyl group, a cyclopentyl group, and a cyclohexyl group.

Examples of the alkoxy group represented by $R_{301}$ to $R_{337}$, Ra, and Rb include ones having from 1 to 4 carbon atoms such as a methoxy group, an ethoxy group, a hydroxyethoxy group, a propoxy group, an n-butoxy group, an isobutoxy group, a sec-butoxy group, and a t-butoxy group.

Examples of the halogen atom represented by $R_{301}$ to $R_{337}$, Ra, Rb, Rc, and Rd include a fluorine atom, a chlorine atom, a bromine atom, and an iodine atom.

Examples of the aryl group represented by $R_0$, Rc, and Rd include ones having from 6 to 14 carbon atoms, which may be substituted, such as a phenyl group, a tolyl group, a methoxyphenyl group, and a naphthyl group.

Preferred examples of the substituent include an alkoxy group having from 1 to 4 carbon atoms, a halogen atom (such as a fluorine atom, a chlorine atom, and an iodine atom), an aryl group having from 6 to 10 carbon atoms, an alkenyl group having from 2 to 6 carbon atoms, a cyano group, a hydroxyl group, a carboxy group, an alkoxycarbonyl group, and a nitro group.

Examples of the aromatic ring or monocyclic or polycyclic hydrocarbon (these rings may contain an oxygen atom or a nitrogen atom) formed when Rc and Rd are taken together include a benzene structure, a naphthalene structure, a cyclohexane structure, a norbornene structure, and an oxabicyclo structure.

The sulfonium compounds or iodonium compounds represented by the general formulae (AI) to (AIII), which are used in the invention, contain an anion (—COO⁻) derived from the carboxyl group (—COOH) of at least one compound of the carboxylic acid compounds represented by the foregoing formulae (C1) to (C10), as the counter anion $X^-$.

The compounds represented by the general formulae (AIV) to (AV), which are used in the invention, contain a substituent as an ester group (—COO—) derived from the carboxyl group (—COOH) of at least one compound of the carboxylic acid compounds represented by the foregoing formulae (C1) to (C10), as the substituents $X_1$ and $X_2$.

Examples of the linear, branched or cyclic alkyl group having from 1 to 30 carbon atoms (the chain of the alkyl group may contain an oxygen atom or a nitrogen atom), which is represented by $R_{338}$, include methyl, ethyl, propyl, butyl, pentyl, hexyl, cyclohexyl, dodecyl, 1-ethoxyethyl, and adamantyl.

Examples of the linear, branched or cyclic alkenyl group having from 1 to 20 carbon atoms, which is represented by $R_{338}$, include ethenyl, propenyl, isopropenyl, and cyclohexene.

Examples of the linear, branched or cyclic alkynyl group having from 1 to 20 carbon atoms, which is represented by $R_{338}$, include acetylene and propenylene.

Examples of the linear, branched or cyclic alkoxy group having from 1 to 20 carbon atoms, which is represented by $R_{338}$, include methoxy, ethoxy, propyloxy, butoxy, cyclohexyloxy, isobutoxy, and dodecyloxy.

Examples of the substituted or unsubstituted aryl group having from 6 to 20 carbon atoms, which is represented by $R_{338}$, include phenyl, naphthyl, and anthranyl.

Examples of the substituent on the aryl group include an alkyl group, a nitro group, a hydroxyl group, an alkoxy group, an acyl group, an alkoxycarbonyl group, and a halogen atom.

Examples of the linear, branched or cyclic alkylene group having from 1 to 20 carbon atoms (the chain of the alkylene group may contain an oxygen atom or a nitrogen atom), which is represented by $R_{339}$, include methylene, ethylene, propylene, butylene, isobutylene, ethoxyethylene, and cyclohexylene.

Examples of the linear, branched or cyclic alkenylene group having from 1 to 20 carbon atoms, which is represented by $R_{339}$, include vinylene and allylene.

Specific examples will be given below, but it should not be construed that the invention is limited thereto.

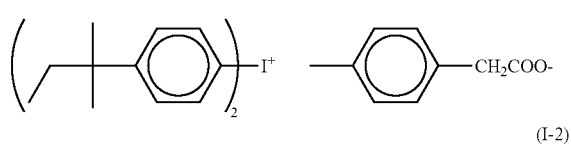

(I-1)

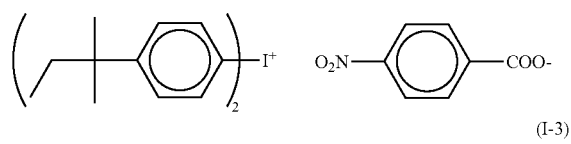

(I-2)

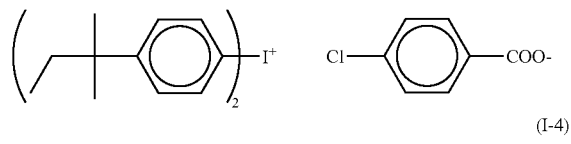

(I-3)

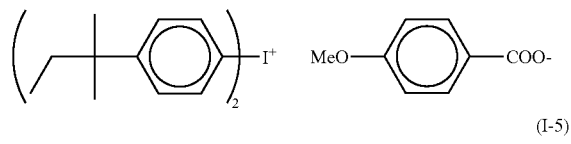

(I-4)

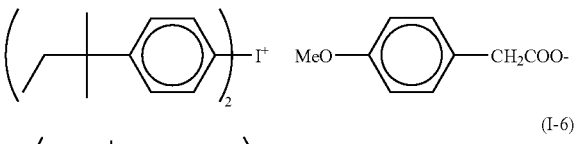

(I-5)

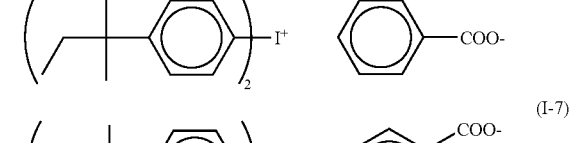

(I-6)

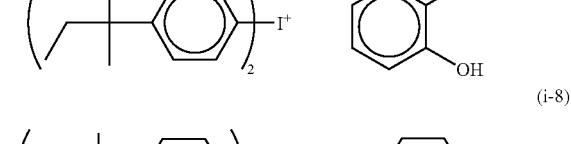

(I-7)

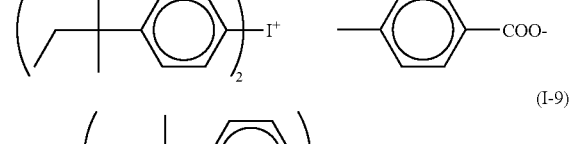

(i-8)

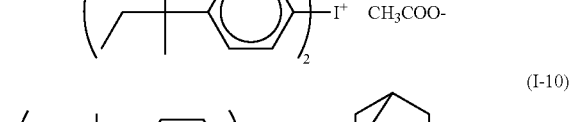

(I-9)

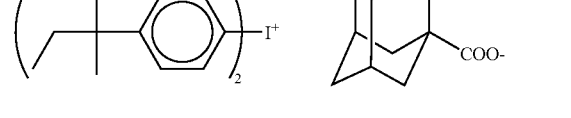

(I-10)

-continued
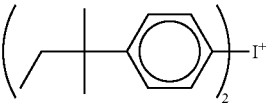 (I-11)
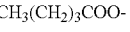 (I-12)
 (I-13)
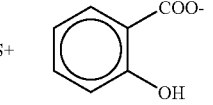 (I-14)
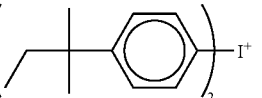 (I-15)
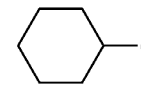 (I-16)
 (II-1)
 (II-2)
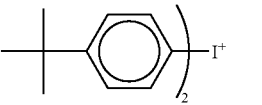 (II-3)
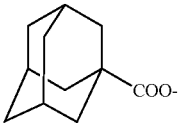 (II-4)
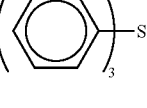 (II-5)
 (II-6)
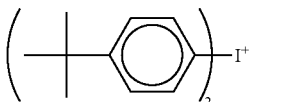 (II-7)
-continued
 (II-8)
 (II-9)
 (II-10)
 (II-11)
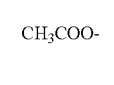 (II-12)
 (II-13)
 (II-14)
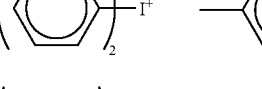 (II-15)
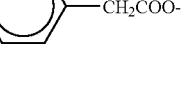 (II-16)
 (II-17)
 (II-18)
 (II-19)

(II-20) 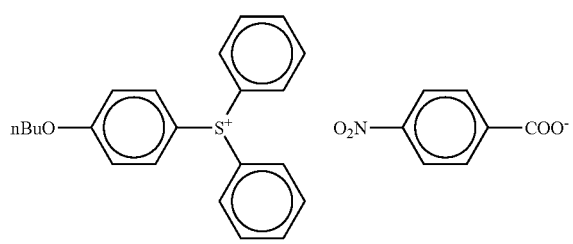
(II-21) 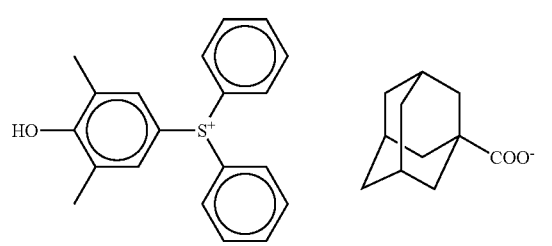
(II-22) 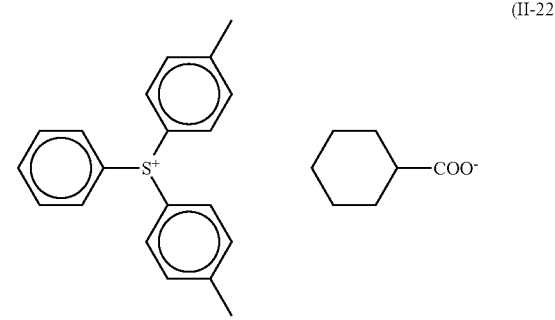
(II-23) 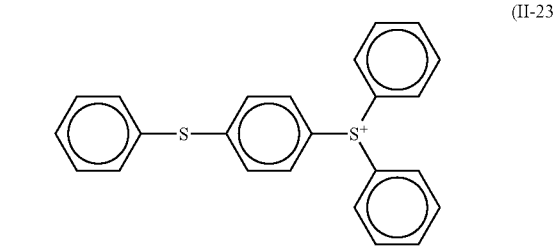
(II-24) 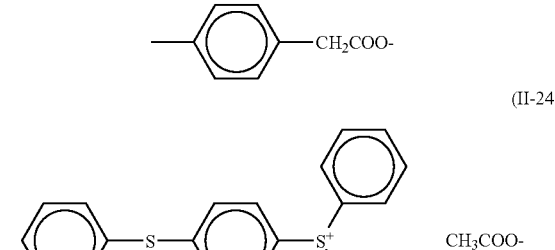
(II-25) 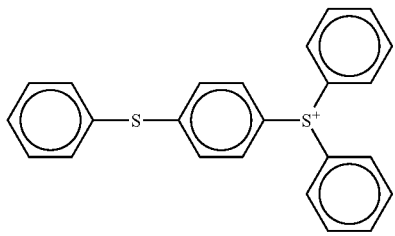
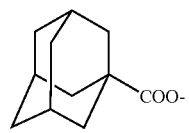
(II-26) 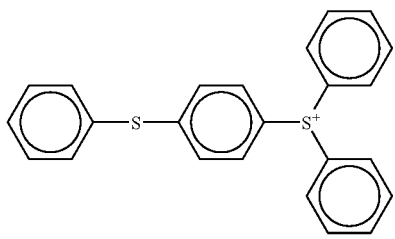
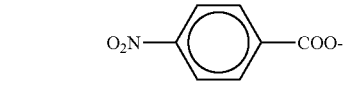
(II-27) 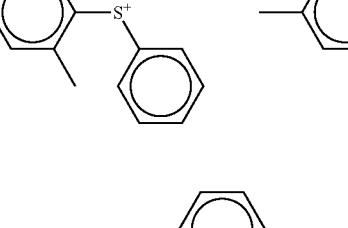
(II-28) 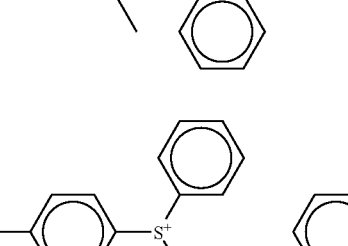
(II-29) 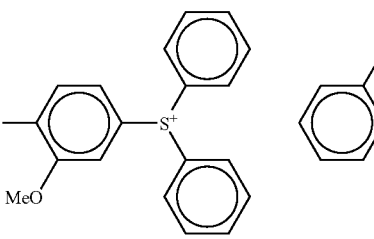

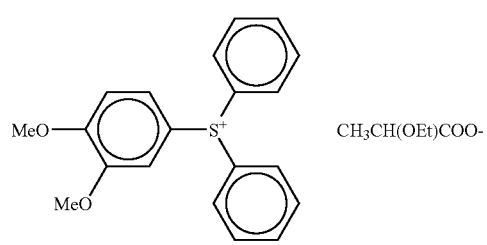
(II-30)
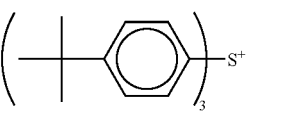
(II-31)
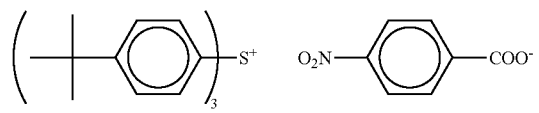
(II-32)
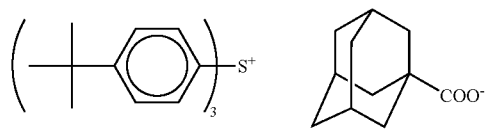
(II-33)
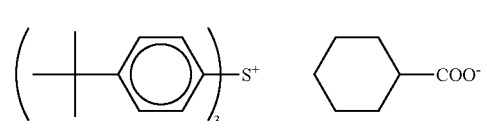
(II-34)
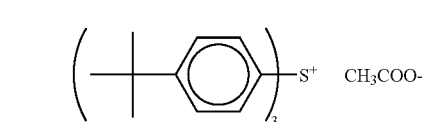
(II-35)
(II-36)
(II-37)
(II-38)
(II-39)
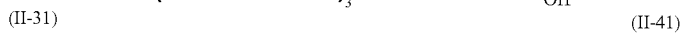
(II-40)
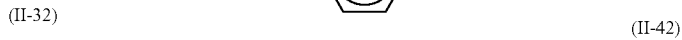
(II-41)
(II-42)
(II-43)
(II-44)
(II-45)
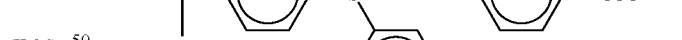

(II-46)
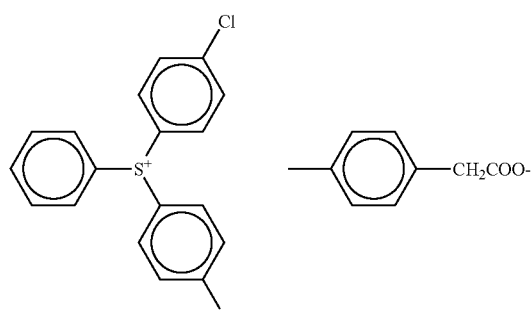
(II-47)
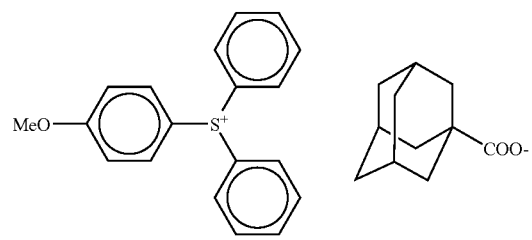
(II-48)
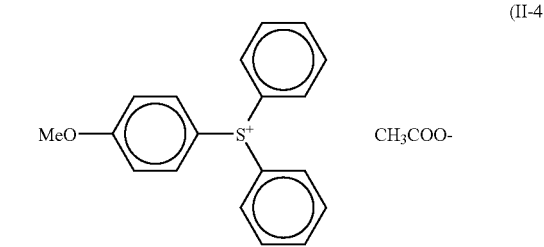
(III-1)
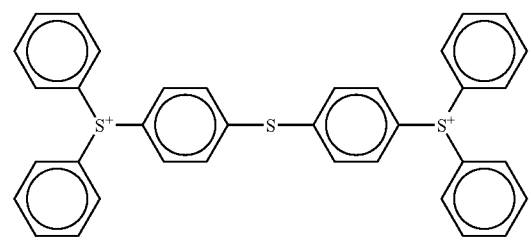
(III-2)
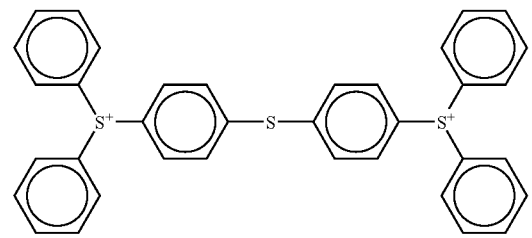
(IV-1)
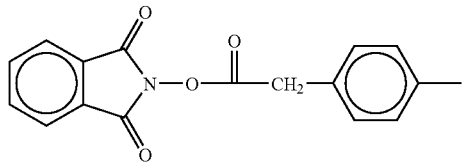
(IV-2)
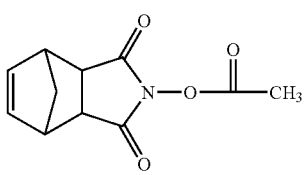
(IV-3)
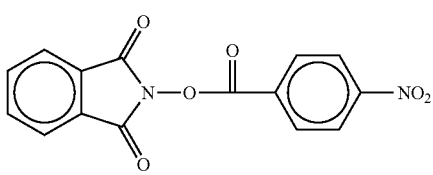
(IV-4)
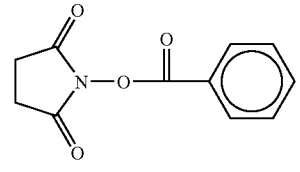
(V-1)
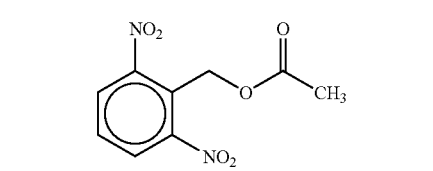
(V-2)
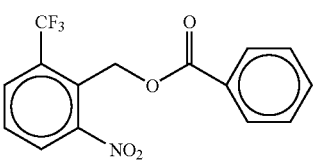
(V-3)
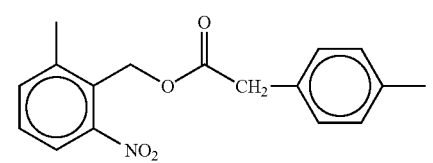
(V-4)
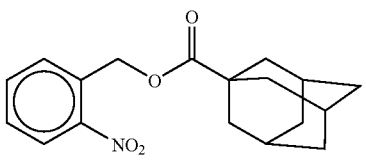
The foregoing photo acid generator, i.e., the compounds represented by the general formulae (AI), (AII) and (AIII), can be synthesized by the method as described in U.S. Pat. No. 3,734,928, or the methods as described in *Macromolecules*, Vol. 10, 1307 (1977), *Journal of Organic Chemistry*, Vol. 55, 4222 (1990), and *J. Radiat. Curing*, Vol. 5(1), 2

(1978) and further by exchange with a counter anion. The compounds represented by the general formulae (AIV) and (AV) are obtained by reacting an N-hydroxyimide compound and a carboxylic chloride under basic conditions, or by reacting nitrobenzyl alcohol and a carboxylic chloride under basic conditions.

A weight ratio of the component (B1) to the component (B2) to be added is usually from 1/1 to 50/1, preferably from 1/1 to 10/1, and particularly preferably from 2/1 to 5/1.

A total sum of the component (B1) and the component (B2) is usually in the range of from 0.5 to 20% by weight, preferably from 0.75 to 15% by weight, and more preferably from 1 to 10% by weight on a base of the total solids of the composition.

Each of the component (B1) and the component (B2) may be contained in admixture of two or more thereof.

[3] Solvent (Component (C)):

The composition according to the invention is dissolved in a solvent that can dissolve the foregoing respective components therein and then applied onto a support. As the solvent that is used are preferable 1-methoxy-2-propanol acetate (propylene glycol monomethyl ether acetate), 1-methoxy-2-propanol (propylene glycol monomethyl ether), ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl ether, ethylene glycol monoethyl ether acetate, propylene glycol monomethyl ether, propylene glycol monoethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran, with 1-methoxy-2-propanol acetate and 1-methoxy-2-propanol being particularly preferred. These solvents may be used singly or in admixture of two or more thereof. When the solvent is a mixed solvent, ones containing 1-methoxy-2-propanol acetate or ones containing 1-methoxy-2-propnaol are preferred.

[4] Surfactant (Component (D)):

It is preferred that the photosensitive resin composition according to the invention contains a surfactant, particularly a fluorine-based and/or silicon-based surfactant. That is, the photosensitive resin composition according to the invention can contain any one of fluorine-based surfactants, silicon-based surfactants, and surfactants containing both a fluorine atom and a silicon atom), or two or more thereof. The addition of the fluorine-based and/or silicon-based surfactant can give rise to effects to inhibit the development defect and to enhance the coating properties. Also, it gives rise to an effect to enhance the sensitivity and contrast.

As the surfactant can be enumerated the surfactants disclosed in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, and U.S. Pat. Nos. 5,405,720, 5,360,692, 5,529,881, 5,296,330, 5,436,098, 5,576,143, 5,296,143, 5,294,511 and 5,824,451. Further, the following commercially available surfactants can also be used as they stand.

Examples of the commercially available surfactants that can be used include fluorine-based surfactants or silicon-based surfactants, such as Eftop EF301, Eftop EF303 and Eftop EF352 (all being produced by Shin Akita Kasei Co., Ltd.); Fluorad FC430 and Fluorad FC431 (all being produced by Sumitomo 3M Limited); Megafac F171, Megafac F173, Megafac F176, Megafac F189 and Megafac R08 (all being produced by Dainippon Ink and Chemicals, Incorporated); Asahi Guard AG710, Surflon S-382, Surflon SC101, Surflon SC102, Surflon SC103, Surflon SC104, Surflon SC105 and Surflon SC106 (all being produced by Asahi Glass Co., Ltd.); and Troy Sol S-366 (produced by Troy Chemical Industries, Inc.). Further, a polysiloxane polymer, KP-341 (produced by Shin-Etsu Chemical Co., Ltd.) can also be used as the silicon-based surfactant.

Furthermore, the surfactants also include, in addition to known ones as shown above, surfactants where polymers with fluoroaliphatic groups that are derived from fluoroaliphatic compounds produced according to the telomerization process (also referred to as the telomer process) or the oligomerization process (also referred to as the oligomer process) are used. The fluoroaliphatic compounds can be synthesized according to the process described in JP-A-2002-90991.

The polymers with fluoroaliphatic groups preferably are copolymers of monomers with the fluoroaliphatic groups and (poly(oxyalkylene)) acrylates and/or (poly(oxyalkylene)) methacrylates, and those having irregular distributions and those having undergone block copolymerization also are used. The poly(oxyalkylene) groups include poly (oxyethylene) groups, poly(oxypropylene) groups, poly (oxybutylene) groups, and the like, and units containing alkylene groups having chains different in length within a chain identical in length such as poly(oxyethylene-oxypropylene-oxyethylene) block linking groups and poly(oxyethylene-oxypropylene) block linking groups also are used. Furthermore, in addition to binary copolymers of monomers with a fluoroaliphatic groups and (poly(oxyalkylene)) acrylates (or methacrylates), ternary or more copolymers prepared by copolymerizing simultaneously monomers with two or more different fluoroaliphatic groups or two or more different (poly(oxyalkylene)) acrylates (or methacrylates) also are used.

As commercially available surfactants, there are, for example, Megafac F178, F-470, F-473, F-475, F-476, and F-472 (manufactured by Dainippon Ink and Chemicals, Inc.). Furthermore, the surfactants include copolymers of $C_6F_{13}$ group-containing acrylates (or methacrylates) and (poly(oxyalkylene)) acrylates (or methacrylates), copolymers of $C_6F_{13}$ group-containing acrylates (or methacrylates), (poly(oxyethylene)) acrylates (or methacrylates), and (poly(oxypropylene)) acrylates (or methacrylates), copolymers of $C_8F_{17}$ group-containing acrylates (or methacrylates) and (poly(oxyalkylene)) acrylates (or methacrylates), copolymers of $C_8F_{17}$ group-containing acrylates (or methacrylates), (poly(oxyethylene)) acrylates (or methacrylates), and (poly(oxypropylene)) acrylates (or methacrylates), and the like.

A compounding amount of the surfactant is usually from 0.001 to 2% by weight, and preferably from 0.01 to 1% by weight on a basis of the solids content of the composition according to the invention. These surfactants may be added singly or in admixture of two or more thereof.

[5] Acid Diffusion Inhibitor (E):

It is preferred to add an acid diffusion inhibitor for the purposes of preventing the lapsing changes in performances (such as formation of T-top shape of pattern, change in sensitivity, and change in line width of pattern) after irradiation with one of an actinic ray and a radiation until the heating treatment, the lapsing change in performance after coating, and the excessive diffusion of the acid (deterioration of resolution) during the heat treatment after irradiation with one of an actinic ray and a radiation. As the acid diffusion inhibitor are preferably used organic basic compounds such as basic nitrogen-containing organic basic compounds, having a pKa value of conjugate acid of 4 or more.

Specifically, structures represented by the following formulae (A) to (E) can be enumerated.

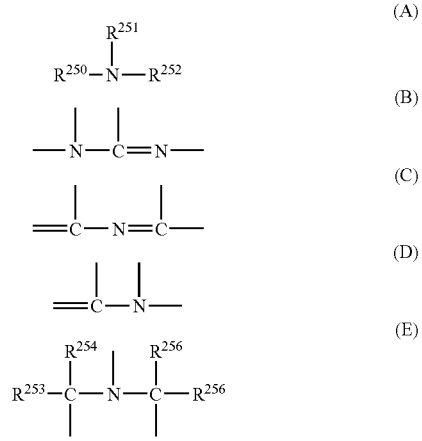

In the formulae, $R^{250}$, $R^{251}$, and $R^{252}$, which may be the same or different, each represents a hydrogen atom, an alkyl group having from 1 to 20 carbon atoms, an aminoalkyl group having from 1 to 20 carbon atoms, a hydroxyalkyl group having from 1 to 20 carbon atoms, or a substituted or unsubstituted aryl group having from 6 to 20 carbon atoms; $R^{251}$ and $R^{252}$ may be taken together to form a ring; and $R^{253}$, $R^{251}$, $R^{254}$, and $R^{256}$, which may be the same or different, each represents an alkyl group having from 1 to 6 carbon atoms.

Nitrogen-containing basic compounds having two or more nitrogen atoms having a different chemical environment in one molecule are more preferred, and compounds having both of a substituted or unsubstituted amino group and a nitrogen-containing ring structure or compounds having an alkylamino group are particularly preferred.

Preferred specific examples include substituted or unsubstituted guanidines, substituted or unsubstituted aminopyridines, substituted or unsubstituted aminoalkylpyridines, substituted or unsubstituted aminopyrrolidines, substituted or unsubstituted indazoles, substituted or unsubstituted imidazoles, substituted or unsubstituted pyrazoles, substituted or unsubstituted pyrazines, substituted or unsubstituted pyrimidines, substituted or unsubstituted purines, substituted or unsubstituted imidazolines, substituted or unsubstituted pyrazolines, substituted or unsubstituted piperazines, substituted or unsubstituted aminomorpholines, and substituted or unsubstituted aminoalkylmorpholines. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group, and a cyano group.

Especially preferred compounds are guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydropyrimidine, 2-pyrazoline, 3-pyrazoline, and N-aminomorpholine. However, it should not be construed that the invention is limited thereto.

These nitrogen-containing basic compounds may be used singly or in admixture of two or more thereof.

A proportion of the acid generator to the organic basic compound to be used in the composition is preferably from 2.5 to 300 in terms of molar ratio. When the molar ratio is less than 2.5, the sensitive is low so that the resolving power may possibly be lowered. On the other hand, when it exceeds 300, the thickness of the resist pattern is too thick by the lapsing change after the exposure until the heating treatment, so that the resolving power may possibly be lowered. The molar ratio of the acid generator to the organic basic compound is preferably from 5.0 to 200, and more preferably from 7.0 to 150.

[6] Non-polymer Type Dissolution Inhibitor (X):

It is preferred that the photosensitive resin composition according to the invention further contains a non-polymer type dissolution inhibitor (X). The non-polymer type dissolution inhibitor as referred to herein means a compound having a molecular weight of 3,000 or less and having at least two acid-decomposable groups, whose solubility in an alkaline developing liquid increases by the action of an acid. Especially, those in which a fluorine atom is substituted on the mother nucleus are preferred from the standpoint of transparency.

An addition amount of the non-polymer type dissolution inhibitor as the component (X) is preferably from 3 to 50% by weight, more preferably from 5 to 40% by weight, and most preferably from 7 to 30% by weight to the polymer in the composition. The addition of the component (X) further enhances the sensitivity and contrast.

Specific examples of the component (X) will be given below, but it should not be construed that the invention is limited thereto.

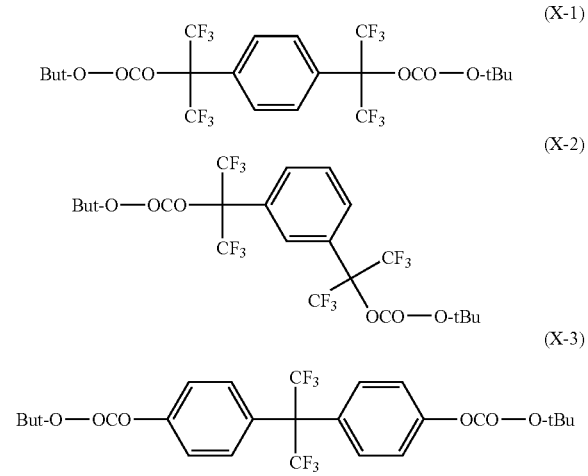

[7] Amphoteric Ion Compound (Y):

It is preferred that the photosensitive resin composition according to the invention further contains an amphoteric ion compound (Y). The amphoteric ion compound as referred to herein means a compound simultaneously containing a cation moiety and an anion moiety in one molecule. Specific examples include amphoteric ions of an amino acid such as alanine, phenylalanine, asparagine, glycine, and valine. However, it should not be construed that the invention is limited thereto.

An addition amount of the amphoteric ion compound as the component (Y) is preferably from 3 to 70 mole %, more preferably from 5 to 50 mole %, and most preferably from 7 to 40 mole % to the component (B1). The addition of the component (Y) further enhances the sensitivity and contrast.

In the manufacture of large-scale integrated circuit elements, the pattern formation on the resist film is carried out in the following manner. That is, the photosensitive resin composition according to the invention is applied on a substrate (examples include transparent substrates silicon/silicon dioxide coating films, glass substrates, and ITO substrates) and then irradiated using actinic rays or a radiation-drawing device, followed by heating, development, rinsing and drying. Thus, a good resist pattern can be formed.

As a developing liquid of the photosensitive resin composition according to the invention can be used alkaline aqueous solutions such as inorganic alkalis (such as sodium hydroxide, potassium hydroxide, sodium carbonate, sodium silicate, sodium metasilicate, and ammonia water), primary amines (such as ethylamine and n-propylamide), secondary amines (such as diethylamine and di-n-butylamine), tertiary amines (such as triethylamine and methyldiethylamine), alcoholamines (such as dimethyl-ethanolamine and triethanolamine), quaternary ammonium salts (such as tetramethylammonium hydroxide, tetraethylammonium hydroxide, and choline), and cyclic amines (such as pyrrole and piperidine). In addition, proper amounts of alcohols (such as isopropyl alcohol) and surfactants (such as nonionic surfactants) may be added to the alkaline aqueous solution.

Among these developing liquids are preferable quaternary ammonium salts, especially tetramethylammonium hydroxide and choline.

The invention will be described below in detail with reference to the Examples, but it should not be construed that the invention is limited thereto.

Synthesis Examples (1) Synthesis of Intermediate (M-1):

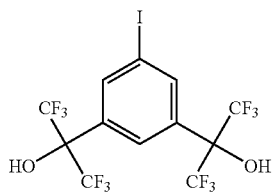

Fuming sulfuric acid (60 g) and 55.84 g (0.22 moles) of iodine were mixed, to which was then added dropwise 82.03 g (0.2 moles) of 1,3-bis-(2-hydroxyhexafluoroisopropyl) benzene over one hour while heating at 60° C. with stirring. After the dropwise addition, the mixture was stirred for an additional 3 hours, neutralized with an aqueous sodium hydroxide solution, and then extracted with ethyl acetate. The organic layer was dehydrated over 30 g of magnesium sulfate, and the solvent was distilled off. Thereafter, the product was purified by silica gel column chromatography to obtain 50.71 g (yield: 43%) of an intermediate (M-1).

(2) Synthesis of Intermediate (M-2-7):

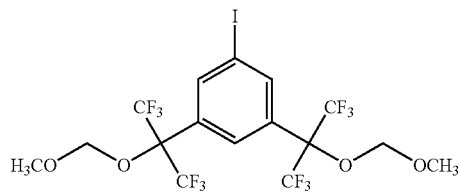

In 80 g of N,N-dimethylacetamide was dissolved 53.61 g (0.1 moles) of the intermediate (M-1), to which were then added 4.4 g (0.11 moles) of sodium hydroxide and 19.32 g (0.24 moles) of chloromethyl-methyl ether, and the mixture was heated at 100° C. and stirred for 3 hours. After returning the temperature to room temperature, the reaction mixture was neutralized with an aqueous 0.1N HCl solution, and then rinsed and extracted with ethyl acetate-water. The organic layer was dehydrated over 20 g of anhydrous sodium sulfate, and the solvent was distilled off. Thereafter, the product was purified by silica gel column chromatography to obtain 48.68 g (yield: 78%) of an intermediate (M-2-7).

(3) Synthesis (1) of Monomer (II)-7:

In 50 g of dehydrated tetrahydrofuran was dissolved 31.2 g (0.05 moles) of the intermediate (M-2-7), and the system was purged with nitrogen. To the intermediate (M-2-7) were added 5 mole % of nickel(II) chloride and 10 mole % of triphenylphosphine, and the mixture was stirred, to which was then added 50 mL of vinyl magnesium bromide (a 1.0 M tetrahydrofuran solution). The mixture was heated at 60° C. and stirred for 4 hours. After returning the temperature to room temperature, the reaction mixture was rinsed and extracted with ethyl acetate-water. The organic layer was dehydrated over 20 g of anhydrous sodium sulfate, and the solvent was distilled off. Thereafter, the product was purified by silica gel column chromatography to obtain 17.30 g (yield: 66%) of a monomer (II)-7.

(4) Synthesis of Intermediate (M-3-7):

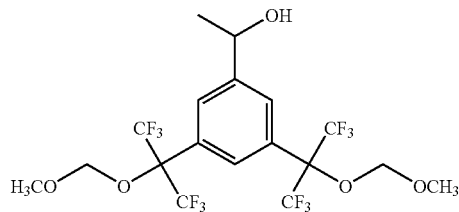

In a dried reactor was charged 1.22 g (0.05 moles) of magnesium (in a flaky state), and the system was purged with nitrogen. 1,2-Dibromoethane (20 mg) was further added thereto, and the mixture was thoroughly stirred. Thereafter, 31.2 g (0.05 moles) of the intermediate (M-2a) and 50 g of dehydrated tetrahydrofuran were gradually added dropwise to the mixture. After the dropwise addition, the mixture was stirred until the heat generation stopped. Thereafter, a solution of 6.60 g (0.15 moles) of acetaldehyde in 20 g of dehydrated tetrahydrofuran was added to the reaction mixture, and the mixture was stirred for 2 hours. Thereafter, the reaction mixture was neutralized with an aqueous saturated ammonium chloride solution and extracted with ethyl acetate-water. The organic layer was dehydrated over 10 g of anhydrous sodium sulfate, and the solvent was distilled off to obtain 20.61 g (yield; 76%) of an intermediate (M-3-7).

(5) Synthesis (2) of Monomer (II)-7:

In 20 g of tetrahydrofuran was dissolved 20.61 g (0.03 moles) of the intermediate (M-3-7), to which were then added dropwise a solution of 5.72 g (0.03 moles) of p-toluenesulfonic chloride in 15 g of tetrahydrofuran and 4.05 g (0.04 moles) of triethylamine. After the dropwise addition, the mixture was stirred for 2 hours, to which were than added 0.1 g of p-methoxyphenol and 9.13 g (0.06 moles) of 1,8-diazabicyclo[5.4.0]undeca-7-en (DBU), and the mixture was heated at 65° C. and stirred for one hour. Thereafter, the reaction mixture was neutralized with an aqueous 0.1N HCl solution, the salt was filtered off, and the residue was extracted with ethyl acetate-water. The organic layer was dehydrated over 10 g of anhydrous sodium sulfate, and the solvent was distilled off to obtain 8.97 g (yield: 57%) of a monomer (II)-7.

(6) Synthesis of Monomer (II)-1:

In 40 g of a solution of tetrahydro-turan/methanol/aqueous 0.1N HCl solution (2/2/1 by weight) was dissolved 15.73 g (0.03 moles) of the monomer (II)-7, and the solution was stirred at room temperature for one hour. Thereafter, the reaction mixture was neutralized with an aqueous sodium hydroxide solution and extracted with ethyl acetate-water. The organic layer was dehydrated over 20 g of magnesium sulfate, and the solvent was distilled off to obtain 12.17 g (yield: 93%) of a monomer (II)-1.

(7) Synthesis of Monomer (II)-3:

In 100 g of tetrahydrofuran was dissolved in 43.62 g (0.1 moles) of the monomer (II)-1, to which were then added 30.16 g (0.30 moles) of triethylamine and 5 g of 4-dimethylaminopyridine, and the mixture was stirred. Thereafter, 52.38 g (0.24 moles) of di-t-butyl dicarbonate was added dropwise to the reaction mixture. After the dropwise addition, the mixture was stirred for an additional 2 hours. Thereafter, the reaction mixture was neutralized with an aqueous 0.1N HCl solution, and rinsed and extracted with ethyl acetate-water. The organic layer was dehydrated over 20 g of anhydrous sodium sulfate, the solvent was distilled off, and the product was purified by silica gel chromatography to obtain 56.64 g (yield: 89%) of a monomer (II)-3.

A monomer (II)-4 was obtained by carrying out the same reaction as in (7), except that acetic anhydride was used in place of the di-t-butyl dicarbonate and that the addition amount of each of the reactants to the monomer (II)-1 was changed to a half amount.

A monomer (II)-18 was obtained by carrying out the same reaction as in (2), except that the monomer (II)-1 was used in place of the intermediate (M-1), t-butyl bromoacetate was used in place of the chloromethyl-methyl ether, and that the addition amount of each of the reactants to the monomer (II)-1 was changed to a half amount.

A monomer (II)-29 was obtained by carrying out the same reaction as in (2), except that the monomer (II)-1 was used in place of the intermediate (M-1) and that chloromethyl-ethyl ether was used in place of the chloromethyl-methyl ether.

The monomers having the repeating units of the invention can be synthesized in the same methods as described above.

(8) Synthesis of Polymer (1):

In 70 g of tetrahydrofuran were dissolved 43.62 g (0.1 moles) of the monomer (II)-1 and 28.84 g (0.15 moles) of 4-(1-ethoxyethoxy)styrene (made by Tosoh Corporation), and the reaction system was purged with nitrogen. To the solution was added 0.99 g (0.006 moles) of AIBN as a polymerization initiator, and the mixture was heated at 65° C. for 8 hours while making nitrogen flow into the reaction system. Thereafter, the temperature was cooled to room temperature, and the reaction mixture was added dropwise to 1.5 L of hexane. A solid was taken out by filtration and dried in vacuo at 100° C. to obtain 34.78 g (yield: 48%) of a powder. As a result of measurement by gel permeation chromatography (GPC), the resulting powder was found to have a weight average molecular weight of 14,500 and a degree of distribution of 1.43. Further, the $^{13}$C-NMR analysis revealed that the powder had a composition ratio of the monomer (II)-1 to 4-(1-ethoxyethoxy)styrene of 38/62.

Polymers (2) to (31) were obtained in the same manner, except for changing the monomer to be added. Monomer composition, composition ratio, weight average molecular weight and degree of distribution of each polymer were indicated in Table 1.

(9) Synthesis of Polymer (11-2);

In 50 g of tetrahydrofuran were dissolved with stirring 23.72 g of the polymer (7) [a copolymer having a composition ratio of the monomer (II)-1 to the monomer (A-19) of 41/59] and 8.61 g of 4-dimethylaminopyridine, to which was then added dropwise 15.37 g of di-t-butyl dicarbonate while cooling to 0° C. After the dropwise addition, the mixture was further stirred at room temperature for 3 hours. Thereafter, the reaction mixture was neutralized with an aqueous 0.1N HCl solution and extracted with ethyl acetate-water. The organic layer was dehydrated over 10 g of anhydrous sodium sulfate and filtered, and the resulting solution was added dropwise to 1.5 L of hexane. A solid was taken out by filtration and dried in vacuo at 100° C. to obtain 13.26 g (yield: 43%) of a powder. As a result of measurement by gel permeation chromatography (GPC), the resulting powder was found to have a weight average molecular weight of 15,900 and a degree of distribution of 1.48. Further, the $^1$H-NMR and $^{13}$C-NMR analyses revealed that the powder had a protection rate of OH of 51.3%.

By protecting OH after the polymerization in this manner, the resins of the invention could also be synthesized.

EXAMPLES

Example 1

<Measurement of Transmittance>

In 8.5 g of propylene glycol monomethyl ether acetate was dissolved 1.36 g of each of the polymers (1) to (31), and the solution was filtered by a 0.1-μm Teflon-made filter and applied on a potassium fluoride disk by a spin coater, followed by drying under heating at 120° C. for 5 minutes to obtain a film having a film thickness of 0.1 μm. The resulting coating film was measured for absorption by an Acton CAMS-507 spectrometer, from which was then calculated a transmittance at 157 nm. The results obtained are shown in Table 1.

<Evaluation of Coating Properties>

In 19.6 g of propylene glycol monomethyl ether acetate were dissolved 1.2 g of each of the polymers (1) to (31) and 0.024 g of triphenylsulfonium nonafluorobutanesulfonate, and the solution was filtered by a 0.1-μm Teflon-made filter.

Each of the photosensitive compositions was applied on a hexamethyl disilazane-processed silicone wafer by a spin coater and evaluated in terms of coating properties. A film thickness was measured in any five points in the wafer using interference-type thickness meter, and in the value of a film thickness measured in any five points, the difference (nm) between the maximum value thereof and the minimum value thereof was evaluated as coating properties. The smaller the difference is, the better coating properties are. The results obtained are shown in Table 1.

It can be understood that the coating films using the composition according to the invention have sufficient transparency at 157 nm. Further, it can be understood that the polymer having OH protected after the polymerization has sufficient transparency at 157 nm, too.

Moreover, it can be understood from the foregoing results that the compositions using the resin of the invention exhibit

TABLE 1

| Polymer | Monomer composition | Composition ratio | Weight average molecular weight | Degree of distribution | Transmittance (%) at 157 nm in a film thickness of 0.1 μm | Coating properties (nm) |
|---|---|---|---|---|---|---|
| (1) | (II)-1/(A-3) | 38/62 | 14500 | 1.43 | 65 | 2.8 |
| (2) | (II)-1/(B-1) | 47/53 | 10100 | 1.50 | 63 | 2.5 |
| (3) | (II)-1/(A-1) | 45/55 | 10400 | 1.44 | 62 | 2.6 |
| (4) | (II)-1/(B-4) | 56/44 | 12900 | 1.43 | 67 | 2.7 |
| (5) | (II)-1/(B-1') | 52/48 | 11200 | 1.4 | 66 | 2.5 |
| (6) | (II)-1/(B-7) | 43/57 | 16400 | 1.38 | 67 | 2.6 |
| (7) | (II)-1/(A-19) | 41/59 | 14500 | 1.47 | 69 | 2.9 |
| (8) | (II)-1/(A-19)/(B-1') | 40/42/18 | 12800 | 1.35 | 69 | 2.2 |
| (9) | (II)-1/(A-19)/(B-7') | 37/39/24 | 13900 | 1.50 | 63 | 2.3 |
| (10) | (II)-1/(B-7') | 51/49 | 11400 | 1.46 | 61 | 2.7 |
| (11) | (II)-3/(A-3) | 43/57 | 13400 | 1.31 | 65 | 2.8 |
| (11-2) | (II)-3*/(A-3) | 41/59 | 15900 | 1.48 | 64 | 2.6 |
| (12) | (II)-3/(A-15)/(F-39) | 51/26/23 | 12500 | 1.37 | 63 | 1.8 |
| (13) | (II)-3/(A-19)/(F-29) | 48/24/28 | 12400 | 1.49 | 62 | 1.7 |
| (14) | (II)-4/(A-1) | 57/43 | 12200 | 1.60 | 64 | 2.7 |
| (15) | (II)-4/(A-3)/(B-7') | 41/34/25 | 10800 | 1.49 | 66 | 2.0 |
| (16) | (II)-4/(A-19) | 53/47 | 13100 | 1.46 | 67 | 2.5 |
| (17) | (II)-4/(A-19)/(B-1') | 37/39/24 | 12600 | 1.54 | 61 | 2.2 |
| (18) | (II)-7/(A-1)/(B-1') | 41/47/12 | 14800 | 1.58 | 65 | 2.1 |
| (19) | (II)-7/(A-3) | 67/33 | 14400 | 1.61 | 60 | 2.5 |
| (20) | (II)-7/(B-8') | 47/53 | 15300 | 1.63 | 61 | 2.6 |
| (21) | (II-7/(B-7') | 58/42 | 13400 | 1.41 | 65 | 2.5 |
| (22) | (II)-7/(F-29)/(B-1') | 46/31/23 | 13900 | 1.58 | 63 | 2.4 |
| (23) | (II)-7/(A-19)/(F-39) | 50/32/18 | 15400 | 1.67 | 67 | 2.2 |
| (24) | (II)-18/(A-19) | 64/36 | 16300 | 1.49 | 64 | 2.6 |
| (25) | (II)-18/(A-26) | 58/42 | 15200 | 1.47 | 65 | 2.7 |
| (26) | (II)-18/(A-19)/(B-1') | 48/36/16 | 13900 | 1.51 | 67 | 2.4 |
| (27) | (A-1-8)/(A-19)/(F-39) | 41/37/22 | 15000 | 1.59 | 68 | 2.3 |
| (28) | (II)-29/(A-1)/(F-48) | 45/33/22 | 14400 | 1.56 | 65 | 2.5 |
| (29) | (II)-33/(A-19) | 55/45 | 10900 | 1.43 | 66 | 2.7 |
| (30) | (II)-29/(A-26)/(B-7') | 43/33/24 | 11800 | 1.56 | 68 | 2.4 |
| (31) | (3-5)/(B-7') | 41/59 | 10200 | 1.42 | 63 | 2.8 |
| Comparative polymer (1) | — | — | — | — | 25 | 10.7 |
| Comparative polymer (2) | — | — | — | — | 46 | 10.9 |

*OH was protected by t-butoxycarbonyl (protection rate: 51.3% to the whole OH).

Comparative polymer (1)

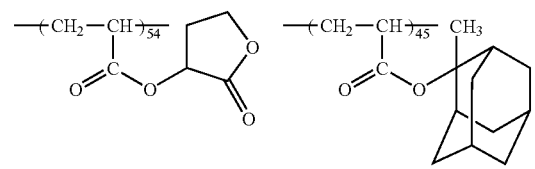

Comparative polymer (2):

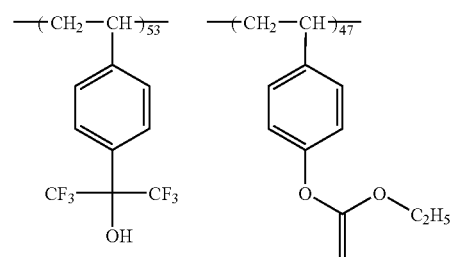

good coating properties. Further, it can be understood that the polymer having OH protected after the polymerization exhibits good coating properties, too.

<Evaluation of Image-forming Properties>

In 19.6 g of propylene glycol monomethyl ether acetate were dissolved 1.2 g of each of the polymers (1) to (31) and 0.024 g of triphenylsulfonium nonafluorobutanesulfonate, and optionally, 0.24 g of the inhibitor (X), 0.006 g of the component (B1) and 0.01 g of the amphoteric ion compound (Y), and the solution was filtered by a 0.1-μm Teflon-made filter. Each of the photosensitive compositions was applied on a hexamethyl disilazane-processed silicone wafer by a spin coater, and the wafer was dried under heating at 120° C. for 60 seconds to form a resist film of 0.1 μm. The resist film was evaluated in the sensitivity and dissolution contrast of exposed areas and unexposed areas by using an exposure system of laser beams of 157 nm and dissolution behavior analyzer, VUVES-4500 (manufactured by Litho Tech Japan Corporation).

The sensitivity as referred to herein means a minimum exposure amount at which the film thickness becomes zero when the exposed wafer is dried under heating at 130° C. for 90 seconds, developed at 23° C. for 60 seconds using an aqueous 2.38 weight % tetramethylammonium hydroxide solution, rinsed with pure water for 30 seconds, dried, and then measured for the film thickness.

Further, the contrast as referred to herein means an inclination (tan θ) of the exposure amount—dissolution rate curve.

The results obtained are shown in Table 2.

TABLE 2

| Example | Polymer | Inhibitor (X) | Component (B2) | Amphoteric ion compound (Y) | Sensitivity (mJ/cm$^2$) | Contrast |
|---|---|---|---|---|---|---|
| (J-1) | (1) | — | — | — | 2.3 | 6.2 |
| (J-2) | (1) | (X-1) | — | — | 1.9 | 6.9 |
| (J-3) | (2) | — | — | — | 2.6 | 6.3 |
| (J-4) | (2) | (X-1) | — | — | 2.0 | 6.7 |
| (J-5) | (2) | — | (PAG4-1) | — | 2.1 | 6.8 |
| (J-6) | (2) | — | — | (Y-1) | 2.2 | 6.8 |
| (J-7) | (3) | — | — | — | 2.8 | 6.3 |
| (J-8) | (3) | (X-1) | — | — | 2.1 | 6.8 |
| (J-9) | (3) | — | (PAG4-34) | — | 2.2 | 6.7 |
| (J-10) | (3) | — | — | (Y-1) | 2.1 | 6.8 |
| (J-11) | (4) | — | — | — | 2.1 | 6.5 |
| (J-12) | (5) | — | — | — | 2.4 | 6.8 |
| (J-13) | (6) | — | — | — | 2.7 | 6.2 |
| (J-14) | (7) | — | — | — | 2.3 | 6.7 |
| (J-15) | (8) | — | — | — | 2.1 | 6.2 |
| (J-16) | (9) | — | — | — | 2.9 | 6.9 |
| (J-17) | (10) | — | — | — | 2.3 | 6.0 |
| (J-18) | (11) | — | — | — | 2.5 | 6.3 |
| (J-18-2) | (11-2) | — | — | — | 2.4 | 6.4 |
| (J-19) | (12) | — | — | — | 2.6 | 5.8 |
| (J-20) | (13) | — | — | — | 2.7 | 5.9 |
| (J-21) | (14) | — | — | — | 1.9 | 6.3 |
| (J-22) | (15) | — | — | — | 1.7 | 6.4 |
| (J-23) | (16) | — | — | — | 2.6 | 6.7 |
| (J-24) | (17) | — | — | — | 2.3 | 6.2 |
| (J-25) | (18) | — | — | — | 2.1 | 5.8 |
| (J-26) | (19) | — | — | — | 2.8 | 6.3 |
| (J-27) | (20) | — | — | — | 2.6 | 6.1 |
| (J-28) | (21) | — | — | — | 2.1 | 6.9 |
| (J-29) | (22) | — | — | — | 2.7 | 6.5 |
| (J-30) | (23) | — | — | — | 1.8 | 6.8 |
| (J-31) | (24) | — | — | — | 1.7 | 6.4 |
| (J-32) | (25) | — | — | — | 2.3 | 6.6 |
| (J-33) | (26) | — | — | — | 2.7 | 6.5 |
| (J-34) | (27) | — | — | — | 2.4 | 6.3 |
| (J-35) | (28) | — | — | — | 2.5 | 6.7 |
| (J-36) | (29) | — | — | — | 2.3 | 6.2 |
| (J-37) | (30)*[1] | — | — | — | 2.6 | 6.0 |
| (J-37-2) | (30-2)*[2] | — | — | — | 2.5 | 6.7 |
| (J-38) | (31) | — | — | — | 2.3 | 6.6 |
| (Jh-1) | Comparative | — | — | — | 8.5 | 5.2 |
| (Jh-2) | Comparative polymer (2) | — | — | — | 5.3 | 5.3 |

*[1]The proportion of polymers having a weight average molecular weight of 1,000 or less is 13.7%.
*[2]One obtained by further fractionating the polymer (30) with hexane, in which the proportion of polymers having a weight average molecular weight of 1,000 or less is 6.5%.

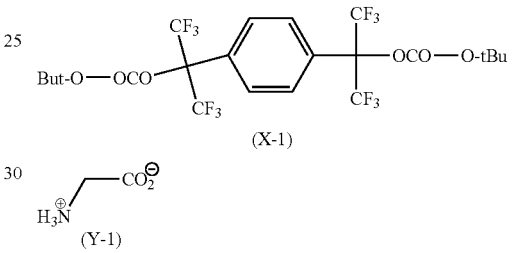

(X-1)

(Y-1)

It can be understood that the compositions of the invention have good sensitivity and contrast to the exposure at 157 nm. Further, it can be understood from Example J-18-2 that the polymer having OH protected after the polymerization exhibits good sensitivity and contrast, too. Moreover, it can be understood from the comparison between J-1 and J-2, the comparison between J-3 and J-4, the comparison between J-3 and J-5, the comparison between J-3 and J-6, the comparison between J-7 and J-8, the comparison between J-7 and J-9, and the comparison between J-7 and J-10 that when the inhibitor (X), the component (B2), or the amphoteric ion compound (Y) is added, the sensitivity or the contrast, or both are more enhanced. Further, it can be understood from the comparison between J-37 and J-37-2 that when the proportion of resins having a weight average molecular weight of 1,000 or less is decreased, the contrast is more enhanced. If the contrast is high, the high resolution can be expected, It is estimated that these effects are related to the mutual action among the polar groups of the polymer or the mutual action between the polar groups of the polymer and the additives, and the change of distribution of the acid generator within the film caused by these actions.

<Evaluation (2) of Coating Properties and Image-forming Properties>

Solutions prepared by further adding 0.006 g of the component (B2) to each of the same formulations as described above were prepared, and then evaluated for the coating properties and image-forming properties in the same manner.

The results obtained are shown in Table 3.

TABLE 3

| Example | Polymer | Component (B2) | Coating properties (nm) | Sensitivity (mJ/cm$^2$) | Contrast |
| --- | --- | --- | --- | --- | --- |
| (J-1') | (1) | (PAG4-1) | 2.7 | 2.3 | 7.5 |
| (J-2') | (2) | (PAG4-1) | 2.6 | 2.0 | 6.8 |
| (J-3') | (3) | (PAG4-34) | 2.8 | 2.2 | 6.7 |
| (J-4') | (4) | (PAG4-34) | 2.5 | 2.1 | 7.0 |
| (J-5') | (5) | (PAG4-35) | 2.6 | 2.4 | 7.2 |
| (J-6') | (6) | (II-4f) | 2.6 | 2.7 | 6.8 |
| (J-7') | (7) | (II-5f) | 2.5 | 2.3 | 6.9 |
| (J-8') | (8) | (II-49f) | 2.8 | 2.1 | 6.7 |
| (J-9') | (9) | (III-3f) | 2.7 | 2.9 | 7.4 |
| (J-10') | (10) | (PAG4-34) | 2.4 | 2.3 | 6.7 |
| (J-11') | (11) | (PAG4-35) | 2.6 | 2.5 | 6.9 |
| (J-11'-2) | (11-2) | (PAG4-35) | 2.7 | 2.4 | 6.7 |
| (J-12') | (12) | (PAG4-1) | 2.8 | 2.6 | 6.5 |
| (J-13') | (13) | (PAG4-34) | 2.6 | 2.7 | 6.6 |
| (J-14') | (14) | (II-4f) | 2.6 | 1.9 | 6.9 |
| (J-15') | (15) | (PAG4-35) | 2.5 | 1.7 | 6.9 |
| (J-16') | (16) | (II-4f) | 2.7 | 2.6 | 7.2 |
| (J-17') | (17) | (PAG4-34) | 2.8 | 2.3 | 7.0 |
| (J-18') | (18) | (II-49f) | 2.7 | 2.1 | 7.3 |
| (J-19') | (19) | (III-3f) | 2.5 | 2.8 | 6.7 |
| (J-20') | (20) | (II-5f) | 2.7 | 2.6 | 6.5 |
| (J-21') | (21) | (PAG4-35) | 2.6 | 2.1 | 7.5 |
| (J-22') | (22) | (PAG4-1) | 2.6 | 2.7 | 6.9 |
| (J-23') | (23) | (II-49f) | 2.5 | 1.8 | 7.3 |
| (J-24') | (24) | (II-5f) | 2.7 | 1.7 | 6.8 |
| (J-25') | (25) | (PAG4-1) | 2.7 | 2.3 | 7.1 |
| (J-26') | (26) | (PAG4-35) | 2.8 | 2.7 | 6.9 |
| (J-27') | (27) | (II-4f) | 2.7 | 2.4 | 6.8 |
| (J-28') | (28) | (PAG4-1) | 2.5 | 2.5 | 7.6 |
| (J-29') | (29) | (PAG4-34) | 2.5 | 2.3 | 6.7 |
| (J-30') | (30) | (II-4f) | 2.7 | 2.6 | 6.8 |

It can be understood from the foregoing results that when the component (B2) is further added, the coating properties and contrast are further enhanced. It is estimated that these effects are related to the mutual action among the polar groups of the polymer or the mutual action between the polar groups of the polymer and the component (B2), and the change of distribution of the acid generator within the film caused by these actions.

EXAMPLE 2

<Synthesis 2 of Polymer>

Polymers (32) to (40) having varied acid value, molecular weight, degree of distribution and amount of residual non-reacted monomers were obtained under the same synthesis conditions as in the synthesis of the polymer (1), except for using the monomers (II)-1, (II)-3 and (A-19) as the monomers and changing the amount of initiator, the amount of solvent, the heating temperature, the heating time, the amount of hexane during purification, and the number of purification.

Table 4 shows the composition ratio, acid value, molecular weight, degree of distribution and amount of residual non-reacted monomers of each of the polymers.

<Measurement of Transmittance>

In 8.5 g of propylene glycol monomethyl ether acetate was dissolved 1.36 g of each of the polymers (32) to (40), and the solution was filtered by a 0.1-µm Teflon-made filter and applied on a potassium fluoride disk by a spin coater, followed by drying under heating at 120° C. for 5 minutes to obtain a film having a film thickness of 0.1 µm. The resulting coating film was measured for absorption by an Acton CAMS-507 spectrometer, from which was then calculated a transmittance at 157 nm.

The results obtained are shown in Table 4.

TABLE 4

| Polymer | Composition ratio (II)-1/(II)-3/(A-19) | Acid value × 10$^{-3}$ (mole/g) | Weight average molecular weight | Degree of distribution | Amount of residual non-reacted monomers (wt %) | Transmittance (%) at 157 nm in a film thickness of 0.1 µm |
| --- | --- | --- | --- | --- | --- | --- |
| (32) | 2/56/42 | 0.091 | 14100 | 1.72 | 5.3 | 64 |
| (33) | 6/46/48 | 0.297 | 11000 | 1.71 | 5.5 | 66 |
| (34) | 20/27/53 | 1.135 | 11000 | 1.74 | 5.3 | 65 |
| (35) | 4/44/52 | 0.206 | 2900 | 1.76 | 5.1 | 63 |
| (36) | 5/43/52 | 0.258 | 64000 | 1.73 | 5.2 | 64 |
| (37) | 4/47/49 | 0.199 | 12800 | 1.92 | 5.4 | 65 |
| (38) | 4/46/50 | 0.199 | 12800 | 1.57 | 4.2 | 66 |
| (39) | 23/27/50 | 1.277 | 15200 | 1.69 | 5.7 | 63 |
| (40) | 21/28/51 | 1.277 | 15200 | 1.43 | 1.4 | 71 |

The polymer (38) is one prepared by further purifying the polymer (37) by re-precipitation with hexane.
The polymer (40) is one prepared by further purifying the polymer (39) by re-precipitation with hexane.

As shown in Table 4, it can be understood that when the proportion of the residual non-reacted monomers is reduced, the transmittance is enhanced.

<Evaluation of Coating Properties>

In 19.6 g of propylene glycol monomethyl ether acetate were dissolved 1.2 g of each of the polymers (32) to (40) and 0.024 g of triphenylsulfonium nonafluorobutanesulfonate, and optionally, 100 ppm of Megafac F176 (a fluorine-based surfactant made by Dainippon Ink and Chemicals, Incorporated) or Megafac F-472 (a fluorine-based surfactant of telomer type made by Dainippon Ink and Chemicals, Incorporated), and the solution was filtered by a 0.1-μm Teflon-made filter.

Each of the photosensitive compositions was applied on a hexamethyl disilazane-processed silicone wafer by a spin coater in the same manner as Example 1 and evaluated in terms of coating properties. The results obtained are shown in Table 5.

<Evaluation of Image-forming Properties>

In 19.6 g of propylene glycol monomethyl ether acetate were dissolved 1.2 g of each of the polymers (32) to (40) and 0.024 g of triphenylsulfonium nonafluorobutanesulfonate, and optionally, 100 ppm of Megafac $F_{176}$ (a fluorine-based surfactant made by Dainippon Ink and Chemicals, Incorporated) or Megafac F-472 (a fluorine-based surfactant of telomer type made by Dainippon Ink and Chemicals, Incorporated), and the solution was filtered by a 0.1-μm Teflon-made filter. Each of the photosensitive compositions was applied on a hexamethyl disilazane-processed silicone wafer by a spin coater, and the wafer was dried under heating at 120° C. for 60 seconds to form a resist film of 0.1 μm. The resist film was evaluated in the sensitivity and dissolution contrast of exposed areas and unexposed areas by using an exposure system of laser beams of 157 nm and dissolution behavior analyzer, VUVES-4500 (manufactured by Litho Tech Japan Corporation). The results obtained are shown in Table 5.

The sensitivity as referred to herein means a minimum exposure amount at which the film thickness becomes zero when the exposed wafer is dried under heating at 130° C. for 90 seconds, developed at 23° C. for 60 seconds using an aqueous 2.38 weight % tetramethylammonium hydroxide solution, rinsed with pure water for 30 seconds, dried, and then measured for the film thickness.

Further, the contrast as referred to herein means an inclination (tan θ) of the exposure amount—dissolution rate curve.

TABLE 5

| Example | Polymer | Surfactant (D) | Coating properties (nm) | Sensitivity (mJ/cm$^2$) | Contrast |
|---------|---------|----------------|-------------------------|-------------------------|----------|
| TM-1"   | (32)    | —              | 2.6                     | 2.8                     | 6.3      |
| TM-2"   | (33)    | —              | 2.7                     | 2.0                     | 6.7      |
| TM-3"   | (33)    | D-1            | 2.8                     | 1.7                     | 6.9      |
| TM-4"   | (34)    | —              | 2.7                     | 1.9                     | 6.4      |
| TM-5"   | (34)    | D-1            | 2.7                     | 1.5                     | 6.8      |
| TM-6"   | (35)    | —              | 2.5                     | 1.3                     | 5.4      |
| TM-7"   | (36)    | —              | 2.6                     | 4.3                     | 5.7      |
| TM-8"   | (37)    | —              | 2.6                     | 2.4                     | 5.8      |
| TM-9"   | (38)    | —              | 2.8                     | 2.3                     | 6.8      |
| TM-10"  | (39)    | —              | 2.7                     | 2.1                     | 6.2      |
| TM-11"  | (40)    | —              | 2.6                     | 1.6                     | 6.9      |

D-1: Megafac F176
D-2: Megafac F-472

It can be understood from the comparison between TM-1" and TM-2", the comparison between TM-2" and TM-3", the comparison between TM-4" and TM-5", the comparison between TM-2" and TM-6", the comparison between TM-2" and TM-7", the comparison between TM-8" and TM-9", and the comparison between TM-10" and TM-11" that when the acid value, the weight average molecular weight, the degree of distribution, and the amount of residual non-reacted monomers in the resin are regulated, the coating properties, the sensitivity and the contrast are enhanced. Further, it can be understood that the addition of the surfactant also enhances the coating properties, the sensitivity and the contrast. It is estimated that these effects are related to the mutual action among the polar groups of the polymer or the mutual action between the polar groups of the polymer and the surfactant, and the change of distribution of the acid generator within the film caused by these actions.

EXAMPLE 3

In 19.6 g of propylene glycol monomethyl ether acetate were dissolved 1.2 g of each of the polymer (10) and 0.024 g of triphenylsulfonium nonafluorobutanesulfonate, and the solution was filtered by a 0.1-μm Teflon-made filter, to prepare a resist solution.

A resist solution was prepared in the same manner as described above, except for changing the solvent to a mixed solvent of 13.07 g of propylene glycol monomethyl ether acetate (PGMEA) and 6.53 g of propylene glycol monomethyl ether (PGME).

The number of particles in each of the resist solutions was measured using a particle counter made by Rion Co., Ltd. Further, each of the resist compositions was applied on a hexamethyl disilazane-processed silicone water by a spin coater, and the wafer was dried under heating at 120° C. for 60 seconds to form a resist film of 0.1 μm. The film was measured for contact angle with an aqueous 2.38 weight % tetramethylammonium hydroxide solution. The results obtained are shown in Table 6.

TABLE 6

| Polymer | Solvent | Number of particles | Contact angle (degree) |
|---------|---------|---------------------|------------------------|
| (10)    | PGMEA   | 167                 | 63                     |
| (10)    | PGMEA/PGME | 36               | 41                     |

It can be understood from the foregoing results that when the solvent is changed to the mixed solvent, the number of particles can be reduced, and the contact angle of the developing liquid is reduced, whereby an enhancement of the developing properties can be expected. It is estimated that this effect is related to an affinity between the polar groups of the polymer and the solvent and the proportion of the residual solvent after the application and drying.

EXAMPLE 4

The content of metals of the polymer (34) was measured using ICP-MS. This polymer was treated with an ion-exchange resin to lower the metals. The polymer after lowering the metals is designated as polymer (34)-2. The content of metals of the polymer (34)-2 was measured in the same manner.

In 19.6 g of propylene glycol monomethyl ether acetate were dissolved 1.2 g of each of the polymers (34) and (34)-2 and 0.024 g of triphenylsulfonium nonafluorobutanesulfonate, and the solution was filtered by a 0.1-μm Teflon-made filter, to prepare a resist solution. The number of particles in each of the resist solutions was measured using a particle counter made by Rion Co., Ltd.

The results obtained are shown in Table 7.

TABLE 7

| Polymer | Metal content Na (ppb) | Metal content K (ppb) | Metal content Ca (ppb) | Metal content Fe (ppb) | Metal content Mg (ppb) | Number of particles |
|---|---|---|---|---|---|---|
| (34) | 124 | 136 | 140 | 112 | 360 | 253 |
| (34)-2 | 25 | 34 | 47 | 36 | 41 | 24 |

*The content of other metals than those as described in the table was 50 ppb or less in any of the polymers (34) and (34)-2.

It can be understood from the foregoing results that when the metal content of the polymer is lowered, the number of particles in the solution is reduced. It is estimated that this effect is related to a mutual action between the polar groups of the polymer and the metals.

This application is based on Japanese patent application No. 2002-50031 filed on Feb. 26, 2002, the entire content of which is incorporated herein by reference.

What is claimed is:

1. A photosensitive resin composition comprising:
   (A) a resin containing (A1) a repeating unit having at least two groups represented by the following general formula (Z),
   wherein the resin is alkali-soluble, or the resin is decomposed by the action of an acid to increase its solubility in an alkaline aqueous solution; and
   (B) a compound capable of generating an acid by the action with one of an actinic ray and a radiation:

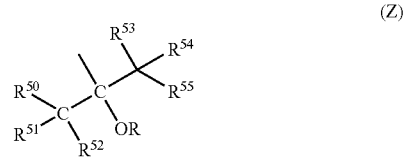

(Z)

wherein $R^{50}$ to $R^{55}$ each independently represents a hydrogen atom, a fluorine atom, or an optionally substituted alkyl group, provided that at least one of $R^{50}$ to $R^{55}$ represents a fluorine atom or an alkyl group in which at least one hydrogen atom is substituted with a fluorine atom; and R represents an organic group,
wherein the repeating unit (A1) is represented by the following general formula (1), (2) or (3):

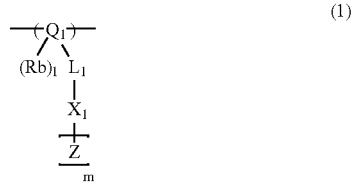

(1)

wherein $Q_1$ represents an alicyclic hydrocarbon group; $L_1$ represents a single bond or a connecting group; $X_1$ represents a connecting group having a valence of (m+1); $R_b$ represents a hydrogen atom, an optionally substituted organic group, or a halogen atom; l represents an integer of from 0 to 3; m represents an integer of 2 or more; and Z represents the group represented by the general formula (Z):

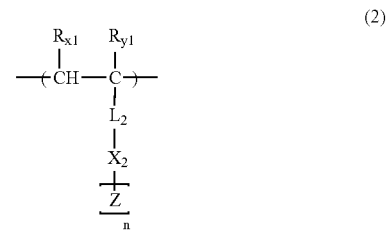

(2)

wherein, $R_{x1}$ and $R_{y1}$ each independently represents a hydrogen atom, a halogen atom, a cyano group, or an optionally substituted alkyl group; $L_2$ represents a single bond or a connecting group; $X_2$ represents a connecting group having a valence of (n+1); n represents an integer of 2 or more; and Z represents the group represented by the general formula (Z):

(3)

wherein, $Q_1$, Rb and l have the same meaning as shown in the general formula (1); $L_3$ represents a connecting group; p represents an integer of 2 or more; and Z represents the group represented by the general formula (Z).

2. The photosensitive resin composition according to claim 1, wherein the repeating unit (A1) is represented by the following general formula (2a):

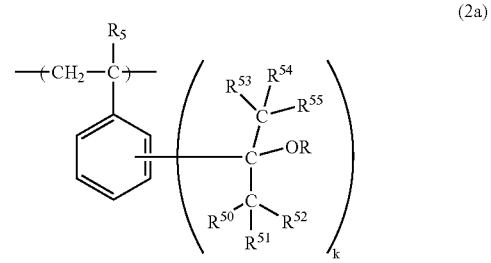

(2a)

wherein $R_5$ represents a hydrogen atom, a halogen atom, a cyano group, or an optionally substituted alkyl group; $R^{50}$ to $R^{55}$ each independently represents a hydrogen atom, a fluorine atom, or an optionally substituted alkyl group, provided that at least one of $R^{50}$ to $R^{55}$ represents a fluorine atom or an alkyl group in which at least one hydrogen atom is substituted with a fluorine atom; R independently represents an organic group; and k represents an integer of from 2 to 5.

3. The photosensitive resin composition according to claim 2, wherein in the general formula (2a), at least one of the groups represented by R is an acid-decomposable group.

4. The photosensitive resin composition according to claim 1, further comprising:
   (X) a non-polymer type dissolution inhibitor;
   wherein the compound (B) is (B1) a compound capable of generating an aliphatic or aromatic sulfonic acid by the action with one of an actinic ray and a radiation, in which the aliphatic or aromatic sulfonic acid is substituted with at least one fluorine atom.

5. The photosensitive resin composition according to claim 1, wherein the resin (A) is a resin that is decomposed by the action of an acid to increase its solubility in an alkaline developing liquid, and the resin contains the repeating unit (A1) and a repeating unit having a group that is decomposed by the action of an acid to become alkali-soluble; and wherein the compound (B) is (B1) a compound capable of generating an aliphatic or aromatic sulfonic acid by the action with one of an actinic ray and a radiation, in which the aliphatic or aromatic sulfonic acid is substituted with at least one fluorine atom.

6. The photosensitive resin composition according to claim 3, wherein the compound (B) is (B1) a compound capable of generating an aliphatic or aromatic sulfonic acid by the action with one of an actinic ray and a radiation, in which the aliphatic or aromatic sulfonic acid is substituted with at least one fluorine atom.

7. The photosensitive resin composition according to claim 1, further comprising (C) a solvent.

8. The photosensitive resin composition according to claim 4, wherein the resin (A) is a resin containing a repeating unit represented by the following general formula (2a) and at least one of repeating units represented by the following general formulae (I) and (VI):

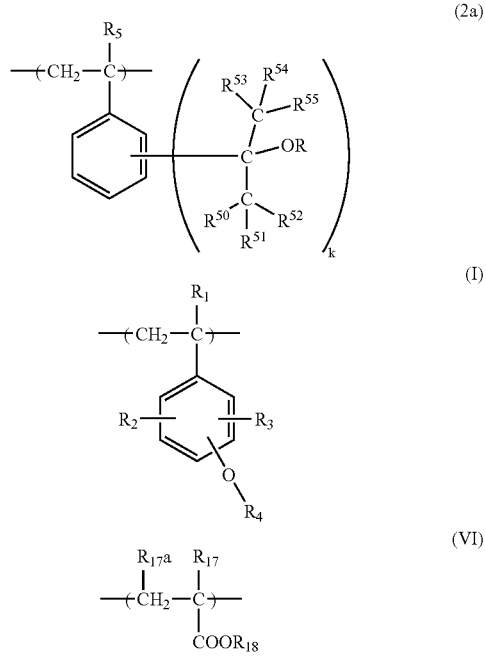

wherein $R_5$ represents a hydrogen atom, a halogen atom, a cyano group, or an optionally substituted alkyl group; $R^{50}$ to $R^{55}$ each independently represents a hydrogen atom, a fluorine atom, or an optionally substituted alkyl group, provided that at least one of $R^{50}$ to $R^{55}$ represents a fluorine atom or an alkyl group in which at least one hydrogen atom is substituted with a fluorine atom; R independently represents an organic group; and k represents an integer of from 2 to 5, $R_1$ represents a hydrogen atom, a halogen atom, a cyano group, or an optionally substituted alkyl group; $R_2$ and $R_3$ each independently represents a hydrogen atom, a halogen atom, a cyano group, a hydroxyl group, an optionally substituted alkyl group, an optionally substituted cycloalkyl group, an optionally substituted alkoxy group, an optionally substituted acyl group, an optionally substituted acyloxy group, an optionally substituted alkenyl group, an optionally substituted aryl group, or an optionally substituted aralkyl group; and $R_4$ represents a group of the following general formula (IV) or (V):

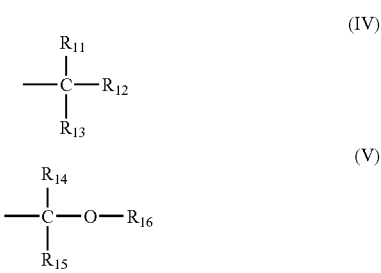

wherein $R_{11}$, $R_{12}$, and $R_{13}$ each independently represents an optionally substituted alkyl group, an optionally substituted cycloalkyl group, an optionally substituted alkenyl group, an optionally substituted aralkyl group, or an optionally substituted aryl group; $R_{14}$ and $R_{15}$ each independently represents a hydrogen atom or an optionally substituted alkyl group; $R_{16}$ represents an optionally substituted alkyl group, an optionally substituted cycloalkyl group, an optionally substituted aralkyl group, or an optionally substituted aryl group; and two of $R_{14}$ to $R_{16}$ may be combined together to form a ring, wherein, $R_{17}$ and $R_{17a}$ each independently represents a hydrogen atom, a halogen atom, or an optionally substituted alkyl group; $R_{18}$ represents —$C(R_{18d})(R_{18e})(R_{18f})$ or —$C(R_{18d'})(R_{18e'})(OR_{18g})$; $R_{18d}$ to $R_{18f}$ each independently represents an optionally substituted alkyl group, an optionally substituted cycloalkyl group, an optionally substituted alkenyl group, an optionally substituted aralkyl group, or an optionally substituted aryl group; $R_{18d'}$ and $R_{18e'}$ each represents a hydrogen atom, an optionally substituted alkyl group, an optionally substituted cycloalkyl group, an optionally substituted alkenyl group, an optionally substituted aralkyl group, or an optionally substituted aryl group; $R_{18g}$ represents an optionally substituted alkyl group, an optionally substituted cycloalkyl group, an optionally substituted aralkyl group, or an optionally substituted aryl group; and two of $R_{18d}$, $R_{18e}$ and $R_{18f}$ or two of $R_{18d'}$, $R_{18e'}$ and $R_{18g}$, may be combined together to form a ring.

9. The photosensitive resin composition according to claim 8, wherein in the general formula (2a), at least of the groups represented by R is represented by —$C(CH_3)_3$, —$C(=O)$—O—$C(CH_3)_3$, —$CH_2$—$C(=O)$—O—$C(CH_3)_3$, —$CH_2$—$OR_{16}$, or —$CH(CH_3)$—$OR_{16}$, wherein $R_{16}$ represents an optionally substituted alkyl group, an optionally substituted cycloalkyl group, an optionally substituted aralkyl group, or an optionally substituted aryl group.

10. The photosensitive resin composition according to claim 4, wherein the resin (A) further comprises at least one repeating unit represented by the following general formula (III) and (VII):

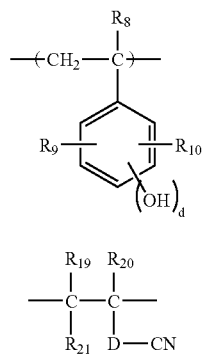

(III)

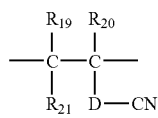

(VII)

wherein $R_8$ represents a hydrogen atom, a halogen atom, a cyano group, or an optionally substituted alkyl group; $R_9$ and $R_{10}$ each independently represents a hydrogen atom, a halogen atom, a cyano group, an optionally substituted alkyl group, an optionally substituted cycloalkyl group, an optionally substituted alkoxy group, an optionally substituted acyl group, an optionally substituted acyloxy group, an optionally substituted alkenyl group, an optionally substituted aryl group, or an optionally substituted aralkyl group; and d represents 0 or 1, wherein $R_{19}$ and $R_{20}$ each independently represents a hydrogen atom, a halogen atom, a cyano group, or an optionally substituted alkyl group; $R_{21}$ represents a hydrogen atom, a halogen atom, a cyano group, an optionally substituted alkyl group, or a -D-CN group; and D represents a single bond or a divalent connecting group.

11. The photosensitive resin composition according to claim 4, wherein the resin (A) further comprises at least one of repeating units represented by the following general formulae (VIII) to (XVII):

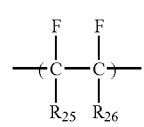

(VIII)

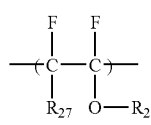

(IX)

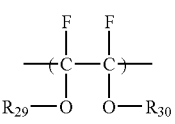

(X)

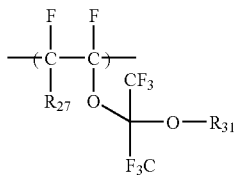

(XI)

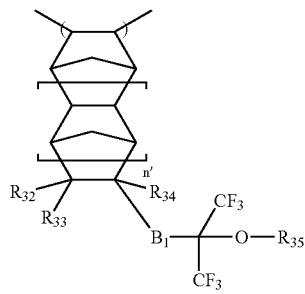

(XII)

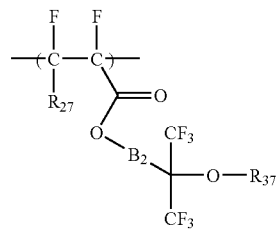

(XIII)

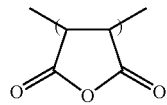

(XIV)

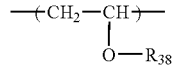

(XV)

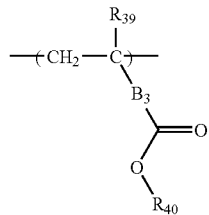

(XVI)

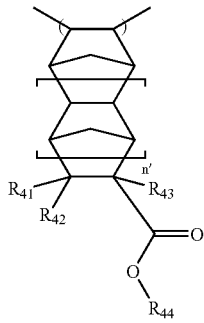

(XVII)

wherein $R_{25}$, $R_{26}$, and $R_{27}$ each independently represents a hydrogen atom, a fluorine atom, an optionally substituted alkyl group, an optionally substituted cycloalkyl group, or an optionally substituted aryl group; $R_{28}$, $R_{29}$, and $R_{30}$ each independently represents an optionally substituted alkyl group, an optionally substituted cycloalkyl group, or an optionally substituted aryl group; $R_{25}$ and $R_{26}$, $R_{27}$ and $R_{28}$, and $R_{29}$ and $R_{30}$ may be respectively taken together to form a ring; $R_{31}$, $R_{35}$, $R_{37}$, $R_{40}$, and $R_{44}$ each independently represents a hydrogen atom, an optionally substituted alkyl group, an optionally substituted cycloalkyl group, an optionally substituted acyl group, or an optionally substituted alkoxycarbonyl group; $R_{32}$, $R_{33}$, $R_{34}$, $R_{41}$, $R_{42}$, and $R_{43}$ each independently represents a hydrogen atom, a halogen atom, an optionally substituted alkyl group, or an optionally substituted alkoxy group; $R_{39}$ represents a hydrogen atom, a halogen atom, a cyano group, or an optionally substituted alkyl group; $R_{38}$ represents an optionally substituted alkyl group, an optionally substituted cycloalkyl group, an optionally substituted aralkyl group, or an optionally substituted aryl group; $B_1$ and $B_2$ each represents a single bond or a divalent connecting group; $B_3$ represents a divalent connecting group; and n' represents 0 or 1.

12. The photosensitive resin composition according to claim 1, wherein a metal content in the resin is 100 ppb or less with respect to each metal.

13. The photosensitive resin composition according to claim 4, wherein the component (B1) is a compound capable of generating an aliphatic or aromatic sulfonic acid having from 3 to 12 carbon atoms upon irradiation with one of an actinic ray and a radiation, in which the aliphatic or aromatic sulfonic acid is substituted with at least one fluorine atom.

14. The photosensitive resin composition according to claim 4, further comprising (B2) a compound capable of generating a fluorine atom-free aliphatic or aromatic sulfonic acid, or an aliphatic or aromatic carboxylic acid upon irradiation with one of an actinic ray and a radiation.

15. The photosensitive resin composition according to claim 4, further comprising (Y) an amphoteric ion compound.

16. The photosensitive resin composition according to claim 1, wherein the resin has an acid value of from $0.2 \times 10^{-3}$ to $4.4 \times 10^{-3}$ mol/g.

17. The photosensitive resin composition according to claim 1, wherein the resin has a weight average molecular weight of from 3,000 to 50,000.

18. The photosensitive resin composition according to claim 1, wherein the resin has a degree of distribution of 1.7 or less.

19. The photosensitive resin composition according to claim 1, wherein the resin contains residual non-reacted monomers in an amount of 5% by weight or less.

20. The photosensitive resin composition according to claim 1, wherein the resin has a resin of a molecular weight of 1,000 or less in an amount of 10% or less.

21. The photosensitive resin composition according to claim 4, further comprising (D) a surfactant.

22. The photosensitive resin composition according to claim 5, wherein the resin (A) is a resin containing a repeating unit represented by the following general formula (2a) and at least one of repeating units represented by the following general formulae (I) and (VI):

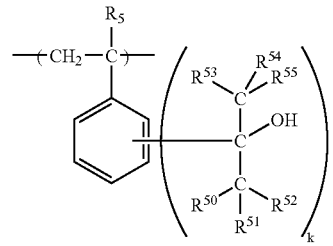

(2a)

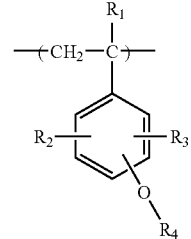

(I)

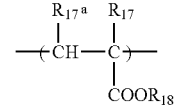

(VI)

wherein $R_5$ represents a hydrogen atom, a halogen atom, a cyano group, or an optionally substituted alkyl group; $R^{50}$ to $R^{55}$ each independently represents a hydrogen atom, a fluorine atom, or an optionally substituted alkyl group, provided that at least one of $R^{50}$ to $R^{55}$ represents a fluorine atom or an alkyl group in which at least one hydrogen atom is substituted with a fluorine atom; R independently represents an organic group; and k represents an integer of from 2 to 5, $R_1$ represents a hydrogen atom, a halogen atom, a cyano group, or an optionally substituted alkyl group; $R_2$ and $R_3$ each independently represents a hydrogen atom, a halogen atom, a cyano group, a hydroxyl group, an optionally substituted alkyl group, an optionally substituted cycloalkyl group, an optionally substituted alkoxy group, an optionally substituted acyl group, an optionally substituted acyloxy group, an optionally substituted alkenyl group, an optionally substituted aryl group, or an optionally substituted aralkyl group; and $R_4$ represents a group of the following general formula (IV) or (V):

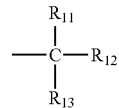

(IV)

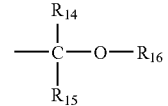

(V)

wherein $R_{11}$, $R_{12}$, and $R_{13}$ each independently represents an optionally substituted alkyl group, an optionally substituted cycloalkyl group, an optionally substituted alkenyl group, an optionally substituted aralkyl group, or an optionally substituted aryl group; $R_{14}$ and $R_{15}$ each independently represents a hydrogen atom or an optionally substituted alkyl group; $R_{16}$ represents an optionally substituted alkyl group, an optionally substituted cycloalkyl group, an optionally substituted aralkyl group, or an optionally substituted aryl group; and two of $R_{14}$ to $R_{16}$ may be combined together to form a ring, wherein, $R_{17}$ and $R_{17a}$ each independently represents a hydrogen atom, a halogen atom, or an optionally substituted alkyl group; $R_{18}$ represents —$C(R_{18d})(R_{18e})(R_{18f})$ or —$C(R_{18d'})(R_{18e'})(OR_{18g})$ $R_{18d}$ to $R_{18f}$ each independently represents an optionally substituted alkyl group, an optionally substituted cycloalkyl group, an optionally substituted alkenyl group, an optionally substituted aralkyl group, or an optionally substituted aryl group; $R_{18d'}$ and $R_{18e'}$ each represents a hydrogen atom, an optionally substituted alkyl group, an optionally substituted cycloalkyl group, an optionally substituted alkenyl group, an optionally substituted aralkyl group, or an optionally substituted aryl group; $R_{18g}$ represents an optionally substituted alkyl group, an optionally substituted cycloalkyl group, an optionally substituted aralkyl group, or an optionally substituted aryl group; and two of $R_{18d}$, $R_{18e}$ and $R_{18f}$, or two of $R_{18d'}$, $R_{18e'}$ and $R_{18g}$, may be combined together to form a ring.

23. The photosensitive resin composition according to claim 22, wherein in the general formula (2a), at least one of the groups represented by R is represented by —$C(CH_3)_3$, —$C(=O)$—$O$—$C(CH_3)_3$, —$CH_2$—$C(O)$—$O$—$C(CH_3)_3$, —$CH_2$—$OR_{16}$, or —$CH(CH_3)$—$OR_{16}$, wherein $R_{16}$ represents an optionally substituted alkyl group, an optionally substituted cycloalkyl group, an optionally substituted aralkyl group, or an optionally substituted aryl group.

24. The photosensitive resin composition according to claim 5, wherein the resin (A) further has at least one selected from the group consisting of repeating units represented by the following general formulae (III) and (VII):

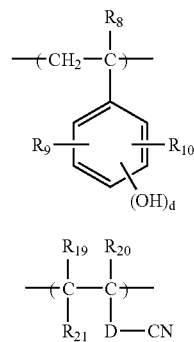

wherein $R_8$ represents a hydrogen atom, a halogen atom, a cyano group, or an optionally substituted alkyl group; $R_9$ and $R_{10}$ each independently represents a hydrogen atom, a halogen atom, a cyano group, an optionally substituted alkyl group, an optionally substituted cycloalkyl group, an optionally substituted alkoxy group, an optionally substituted acyl group, an optionally substituted acyloxy group, an optionally substituted alkenyl group, an optionally substituted aryl group, or an optionally substituted aralkyl group; and d represents 0 or 1, wherein $R_{19}$ and $R_{20}$ each independently represents a hydrogen atom, a halogen atom, a cyano group, or an optionally substituted alkyl group; $R_{21}$ represents a hydrogen atom, a halogen atom, a cyano group, an optionally substituted alkyl group, or a -D-CN group; and D represents a single bond or a divalent connecting group.

25. The photosensitive resin composition according to claim 5, wherein the resin (A) further comprises at least one of repeating units represented by the following general formulae (VIII) to (XVII):

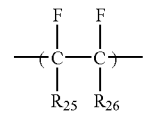

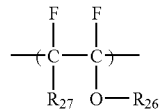

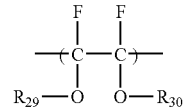

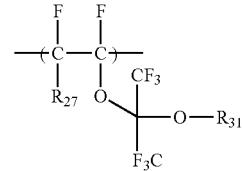

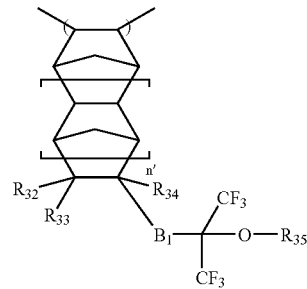

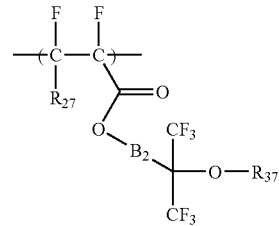

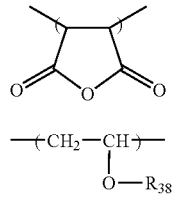

-continued

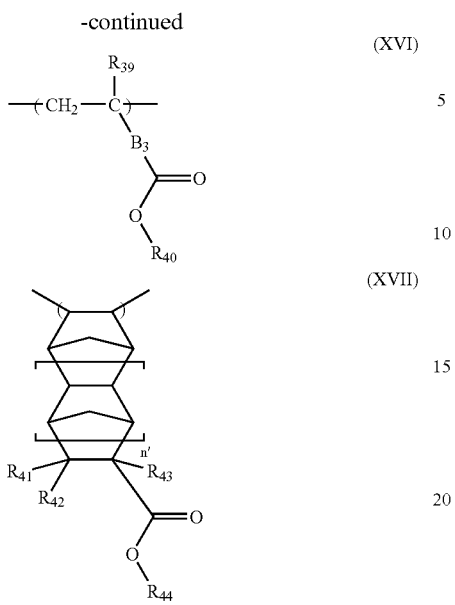

wherein $R_{25}$, $R_{26}$, and $R_{27}$ each independently represents a hydrogen atom, a fluorine atom, an optionally substituted alkyl group, an optionally substituted cycloalkyl group, or an optionally substituted aryl group; $R_{28}$, $R_{29}$, and $R_{30}$ each independently represents an optionally substituted alkyl group, an optionally substituted cycloalkyl group, or an optionally substituted aryl group; $R_{25}$ and $R_{26}$, $R_{27}$ and $R_{28}$, and $R_{29}$ and $R_{30}$ may be respectively taken together to form a ring; $R_{31}$, $R_{35}$, $R_{37}$, $R_{40}$, and $R_{44}$ each independently represents a hydrogen atom, an optionally substituted alkyl group, an optionally substituted cycloalkyl group, an optionally substituted acyl group, or an optionally substituted alkoxycarbonyl group; $R_{32}$, $R_{33}$, $R_{34}$, $R_{41}$, $R_{42}$, and $R_{43}$ each independently represents a hydrogen atom, a halogen atom, an optionally substituted alkyl group, or an optionally substituted alkoxy group; $R_{39}$ represents a hydrogen atom, a halogen atom, a cyano group, or an optionally substituted alkyl group; $R_{38}$ represents an optionally substituted alkyl group, an optionally substituted cycloalkyl group, an optionally substituted aralkyl group, or an optionally substituted aryl group; $B_1$ and $B_2$ each represents a single bond or a divalent connecting group; $B_3$ represents a divalent connecting group; and n' represents 0 or 1.

26. The photosensitive resin composition according to claim 5, wherein a metal content in the resin is 100 ppb or less with respect to each metal.

27. The photosensitive resin composition according to claim 5, wherein the component (B1) is a compound capable of generating an aliphatic or aromatic sulfonic acid having from 3 to 12 carbon atoms upon irradiation with one of an actinic ray and a radiation, in which the aliphatic or aromatic sulfonic acid is substituted with at least one fluorine atom.

28. The photosensitive resin composition according to claim 5, further comprising (B2) a compound capable of generating a fluorine atom-free aliphatic or aromatic sulfonic acid, or an aliphatic or aromatic carboxylic acid upon irradiation with one of an actinic ray and a radiation.

29. The photosensitive resin composition according to claim 5, further comprising (Y) an amphoteric ion compound.

30. The photosensitive resin composition according to claim 5, further comprising (D) a surfactant.

31. A photosensitive resin composition comprising:
(A) a resin containing a repeating unit having at least two groups represented by the following formula (Z'),
wherein the resin is alkali-soluble, or the resin is decomposed by the action of an acid to increase its solubility in an alkaline aqueous solution, and
wherein the repeating unit is derived from a vinyl group and the at least two groups represented by formula (Z') are contained per one vinyl group;
(B1) a compound capable of generating an aliphatic or aromatic sulfonic acid by the action with one of an actinic ray and a radiation, in which the aliphatic or aromatic sulfonic acid is substituted with at least one fluorine atom; and
(B2) a compound capable of generating a fluorine atom-free aliphatic or aromatic sulfonic acid, or an aliphatic or aromatic carboxylic acid upon irradiation with one of an actinic ray and a radiation:

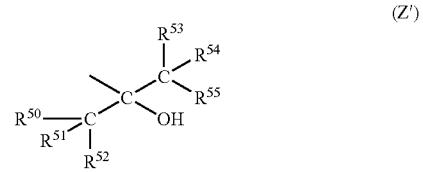

wherein $R^{50}$ to $R^{55}$ each independently represents a hydrogen atom, a fluorine atom, or an optionally substituted alkyl group, provided that at least one of $R^{50}$ to $R^{55}$ represents a fluorine atom or an alkyl group in which at least one hydrogen atom is substituted with a fluorine atom.

32. The photosensitive resin composition according to claim 31, wherein the repeating unit is represented by the following general formula (2a'):

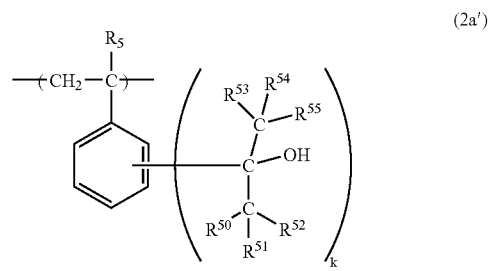

wherein, $R_5$ represents a hydrogen atom, a halogen atom, a cyano group, or an optionally substituted alkyl group; $R^{50}$ to $R^{55}$ each independently represents a hydrogen atom, a fluorine atom, or an optionally substituted alkyl group, provided that at least one of $R^{50}$ to $R^{55}$ represents a fluorine atom or an alkyl group in which at least one hydrogen atom is substituted with a fluorine atom; and k represents an integer of from 2 to 5.

33. The photosensitive resin composition according to claim 31, further comprising:
(X) a non-polymer type dissolution inhibitor.

34. The photosensitive resin composition according to claim 31, wherein the resin (A) further comprises a repeating unit having a group that is decomposed by the action of an acid to become alkali-soluble.

35. The photosensitive resin composition according to claim 31, further comprising (C) a solvent.

36. The photosensitive resin composition according to claim 31, wherein the resin (A) is a resin containing at least one repeating unit represented by the following general formula (2a'), at least one repeating unit represented by the following general formula (I) and at least one repeating unit represented by the following general formula (VI):

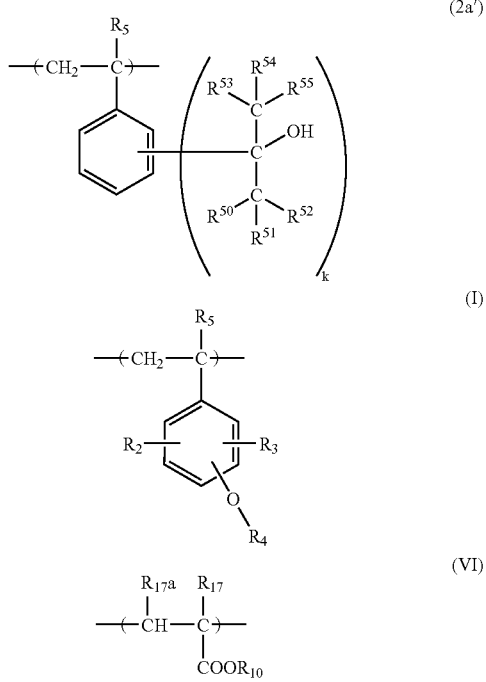

(VI)

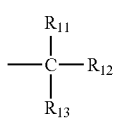

wherein $R_5$ represents a hydrogen atom, a halogen atom, a cyano group, or an optionally substituted alkyl group; $R^{50}$ to $R^{55}$ each independently represents a hydrogen atom, a fluorine atom, or an optionally substituted alkyl group, provided that at least one of $R^{50}$ to $R^{55}$ represents a fluorine atom or an alkyl group in which at least one hydrogen atom is substituted with a fluorine atom; and k represents an integer of from 2 to 5, wherein $R_1$ represents a hydrogen atom, a halogen atom, a cyano group, or an optionally substituted alkyl group; $R_2$ and $R_3$ each independently represents a hydrogen atom, a halogen atom, a cyano group, a hydroxyl group, an optionally substituted alkyl group, an optionally substituted cycloalkyl group, an optionally substituted alkoxy group, an optionally substituted acyl group, an optionally substituted acyloxy group, an optionally substituted alkenyl group, an optionally substituted aryl group, or an optionally substituted aralkyl group; and $R_4$ represents a group of the following general formula (IV) or (V):

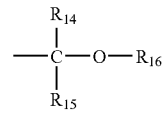

-continued

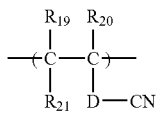

wherein $R_{11}$, $R_{12}$, and $R_{13}$ each independently represents an optionally substituted alkyl group, an optionally substituted cycloalkyl group, an optionally substituted alkenyl group, an optionally substituted aralkyl group, or an optionally substituted aryl group, wherein $R_{14}$ and $R_{15}$ each independently represents a hydrogen atom or an optionally substituted alkyl group; $R_{16}$ represents an optionally substituted alkyl group, an optionally substituted cycloalkyl group, an optionally substituted aralkyl group, or an optionally substituted aryl group; and two of $R_{14}$ to $R_{16}$ may be combined together to form a ring, wherein $R_{17}$ and $R_{17a}$ each independently represents a hydrogen atom, a halogen atom, a cyano group, or an optionally substituted alkyl group; $R_{18}$ represents $-C(R_{18d})(R_{18e})(R_{18f})$ or $-C(R_{18d'})(R_{18e'})(OR_{18g})$; $R_{18d}$ to $R_{18f}$ each independently represents an optionally substituted alkyl group, an optionally substituted cycloalkyl group, an optionally substituted alkenyl group, an optionally substituted aralkyl group, or an optionally substituted aryl group; $R_{18d'}$ and $R_{18e'}$ each represents a hydrogen atom, an optionally substituted alkyl group, an optionally substituted cycloalkyl group, an optionally substituted alkenyl group, an optionally substituted aralkyl group, or an optionally substituted aryl group; $R_{18g}$ represents an optionally substituted alkyl group, an optionally substituted cycloalkyl group, an optionally substituted aralkyl group, or an optionally substituted aryi group; and two of $R_{18d}$, $R_{18e}$ and $R_{18f}$, or two of $R_{18d'}$, $R_{18e'}$ and $R_{18g'}$ may be combined together to form a ring.

37. The photosensitive resin composition according to claim 31, wherein the resin (A) further comprises at least one repeating unit represented by the following general formula (III) and (VII):

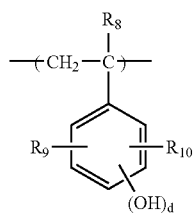

wherein $R_8$ represents a hydrogen atom, a halogen atom, a cyano group, or an optionally substituted alkyl group; $R_9$ and $R_{10}$ each independently represents a hydrogen atom, a halogen atom, a cyano group, an optionally substituted alkyl group, an optionally substituted cycloalkyl group, an optionally substituted alkoxy group, an optionally substituted acyl group, an optionally substituted acyloxy group, an optionally substituted alkenyl group, an optionally substituted aryl group, or an optionally substituted aralkyl group; and d represents 0 or 1, wherein $R_{19}$ and $R_{20}$ each independently represents a hydrogen atom, a halogen atom, a cyano group, or an optionally substituted alkyl group; $R_{21}$ represents a hydrogen atom, a halogen atom, a cyano group, an optionally substituted alkyl group, or a -D-CN group; and D represents a single bond or a divalent connecting group.

38. The photosensitive resin composition according to claim 31, wherein the resin (A) further comprises at least one of repeating units represented by the following general formulae (VIII) to (XVII):

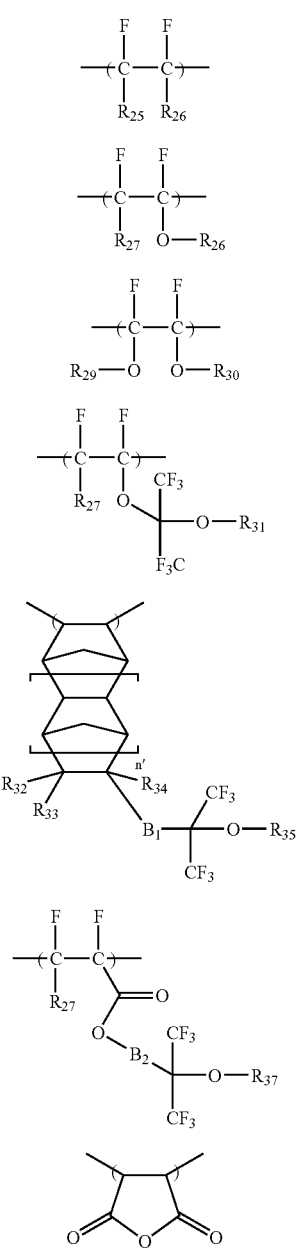

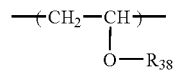

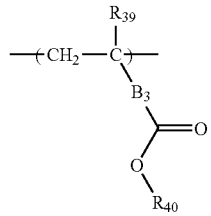

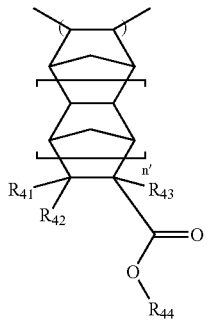

wherein $R_{25}$, $R_{26}$, and $R_{27}$ each independently represents a hydrogen atom, a fluorine atom, an optionally substituted alkyl group, an optionally substituted cycloalkyl group, or an optionally substituted aryl group; $R_{28}$, $R_{29}$, and $R_{30}$ each independently represents an optionally substituted alkyl group, an optionally substituted cycloalkyl group, or an optionally substituted aryl group; $R_{25}$ and $R_{26}$, $R_{27}$ and $R_{28}$, and $R_{29}$ and $R_{30}$ may be respectively taken together to form a ring; $R_{31}$, $R_{35}$, $R_{37}$, $R_{40}$, and $R_{44}$ each independently represents a hydrogen atom, an optionally substituted alkyl group, an optionally substituted cycloalkyl group, an optionally substituted acyl group, or an optionally substituted alkoxycarbonyl group; $R_{32}$, $R_{33}$, $R_{34}$, $R_{41}$, $R_{42}$, and $R_{43}$ each independently represents a hydrogen atom, a halogen atom, an optionally substituted alkyl group, or an optionally substituted alkoxy group; $R_{39}$ represents a hydrogen atom, a halogen atom, a cyano group, or an optionally substituted alkyl group; $R_{38}$ represents an optionally substituted alkyl group, an optionally substituted cycloalkyl group, an optionally substituted aralkyl group, or an optionally substituted aryl group; $B_1$ and $B_2$ each represents a single bond or a divalent connecting group; $B_3$ represents a divalent connecting group; and n' represents 0 or 1.

39. The photosensitive resin composition according to claim 31, wherein a metal content in the resin is 100 ppb or less with respect to each metal.

40. The photosensitive resin composition according to claim 31, wherein the resin has an acid value of from $0.2 \times 10^{-3}$ to $4.4 \times 10^{-3}$ mol/g.

41. The photosensitive resin composition according to claim 31, wherein the resin has a weight average molecular weight of from 3,000 to 50,000.

42. The photosensitive resin composition according to claim 31, wherein the resin has a degree of distribution of 1.7 or less.

43. The photosensitive resin composition according to claim 31, wherein the resin has a resin of a molecular weight of 1,000 or less in an amount of 10% or less.

44. A photosensitive resin composition comprising:
(A) a resin containing a repeating unit having at least two groups represented by the following formula (Z'),
wherein the resin is alkali-soluble, or the resin is decomposed by the action of an acid to increase its solubility in an alkaline aqueous solution, and
wherein the repeating unit is derived from a vinyl group and the at least two groups represented by formula (Z') are contained per one vinyl group;
(B) a compound capable of generating an acid by the action with one of an actinic ray and a radiation; and
(Y) an amphoteric ion compound:

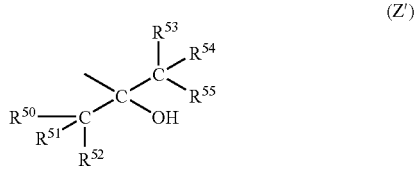

wherein $R^{50}$ to $R^{55}$ each independently represents a hydrogen atom, a fluorine atom, or an optionally substituted alkyl group, provided that at least one of $R^{50}$ to $R^{55}$ represents a fluorine atom or an alkyl group in which at least one hydrogen atom is substituted with a fluorine atom.

45. A photosensitive resin composition comprising:
(A) a resin containing a repeating unit having at least two groups represented by the following formula (Z'),
wherein the resin is alkali-soluble, or the resin is decomposed by the action of an acid to increase its solubility in an alkaline aqueous solution,
wherein the resin contains residual non-reacted monomers in an amount of 5% by weight or less, and
wherein the repeating unit is derived from a vinyl group and the at least two groups represented by formula (Z') are contained per one vinyl group; and
(B) a compound capable of generating an acid by the action with one of an actinic ray and a radiation:

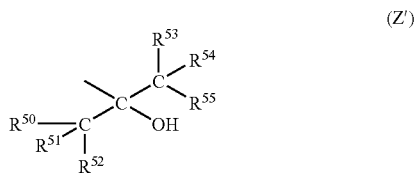

wherein $R^{50}$ to $R^{55}$ each independently represents a hydrogen atom, a fluorine atom, or an optionally substituted alkyl group, provided that at least one of $R^{50}$ to $R^{55}$ represents a fluorine atom or an alkyl group in which at least one hydrogen atom is substituted with a fluorine atom.

46. A photosensitive resin composition comprising:
(A) a resin containing a repeating unit having at least two groups represented by the following formula (Z'),
wherein the resin is alkali-soluble, or the resin is decomposed by the action of an acid to increase its solubility in an alkaline aqueous solution, and
wherein the repeating unit is derived from a vinyl group and the at least two groups represented by formula (Z') are contained per one vinyl group;
(B) a compound capable of generating an acid by the action with one of an actinic ray and a radiation; and
(D) a surfactant:

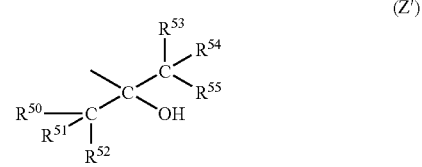

wherein $R^{50}$ to $R^{55}$ each independently represents a hydrogen atom, a fluorine atom, or an optionally substituted alkyl group, provided that at least one of $R^{50}$ to $R^{55}$ represents a fluorine atom or an alkyl group in which at least one hydrogen atom is substituted with a fluorine atom.

47. A photosensitive resin composition comprising:
(A) a resin containing a repeating unit having at least two groups represented by the following formula (Z'),
wherein the resin is alkali-soluble, or the resin is decomposed by the action of an acid to increase its solubility in an alkaline aqueous solution;
(B) a compound capable of generating an acid by the action with one of an actinic ray and a radiation; and
(C) a solvent including a mixture of propylene glycol monomethyl ether acetate and propylene glycol monomethyl ether:

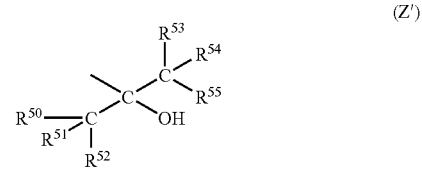

wherein $R^{50}$ to $R^{55}$ each independently represents a hydrogen atom, a fluorine atom, or an optionally substituted alkyl group, provided that at least one of $R^{50}$ to $R^{55}$ represents a fluorine atom or an alkyl group in which at least one hydrogen atom is substituted with a fluorine atom.

48. The photosensitive resin composition according to any one of claims 44 to 47, wherein the repeating unit is represented by the following general formula (2a'):

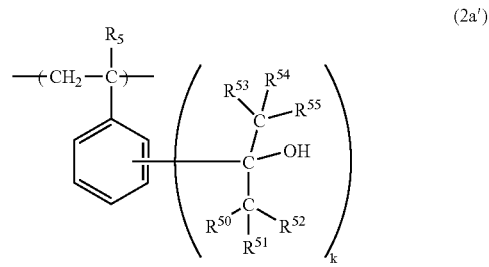

wherein, $R_5$ represents a hydrogen atom, a halogen atom, a cyano group, or an optionally substituted alkyl group;

$R^{50}$ to $R^{55}$ each independently represents a hydrogen atom, a fluorine atom, or an optionally substituted alkyl group, provided that at least one of $R^{50}$ to $R^{55}$ represents a fluorine atom or an alkyl group in which at least one hydrogen atom is substituted with a fluorine atom; and k represents an integer of from 2 to 5.

49. The photosensitive resin composition according to any one of claims 44 to 47, further comprising:
(X) a non-polymer type dissolution inhibitor;
wherein the compound (B) is (B1) a compound capable of generating an aliphatic or aromatic sulfonic acid by the action with one of an actinic ray and a radiation, in which the aliphatic or aromatic sulfonic acid is substituted with at least one fluorine atom.

50. The photosensitive resin composition according to any one of claims 44 to 47, wherein the resin (A) further comprises a repeating unit having a group that is decomposed by the action of an acid to become alkali-soluble.

51. The photosensitive resin composition according to any one of claims 44 to 46, further comprising (C) a solvent.

52. The photosensitive resin composition according to any one of claims 44 to 47, wherein the resin (A) is a resin containing at least one repeating unit represented by the following general formula (2a'), at least one repeating unit represented by the following general formula (I) and at least one repeating unit represented by the following general formula (VI):

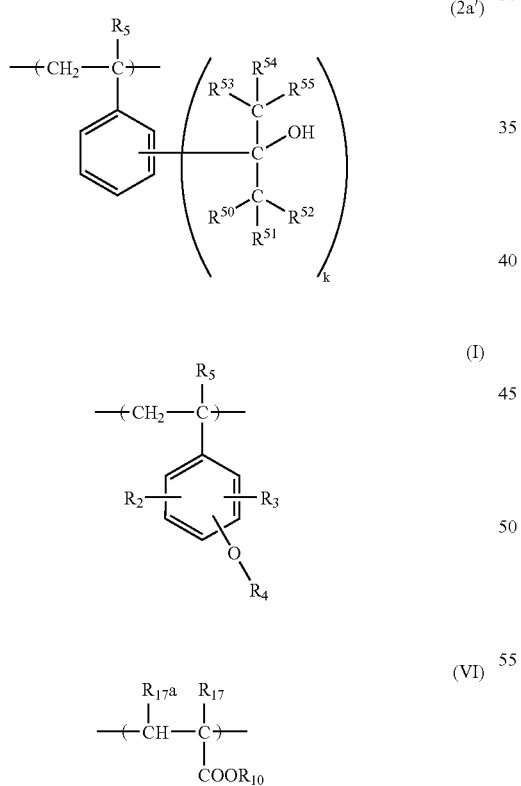

wherein $R_5$ represents a hydrogen atom, a halogen atom, a cyano group, or an optionally substituted alkyl group; $R^{50}$ to $R^{55}$ each independently represents a hydrogen atom, a fluorine atom, or an optionally substituted alkyl group, provided that at least one of $R^{50}$ to $R^{55}$ represents a fluorine atom or an alkyl group in which at least one hydrogen atom is substituted with a fluorine atom; and k represents an integer of from 2 to 5, wherein $R_1$ represents a hydrogen atom, a halogen atom, a cyano group, or an optionally substituted alkyl group; $R_2$ and $R_3$ each independently represents a hydrogen atom, a halogen atom, a cyano group, a hydroxyl group, an optionally substituted alkyl group, an optionally substituted cycloalkyl group, an optionally substituted alkoxy group, an optionally substituted acyl group, an optionally substituted acyloxy group, an optionally substituted alkenyl group, an optionally substituted aryl group, or an optionally substituted aralkyl group; and $R_4$ represents a group of the following general formula (IV) or (V):

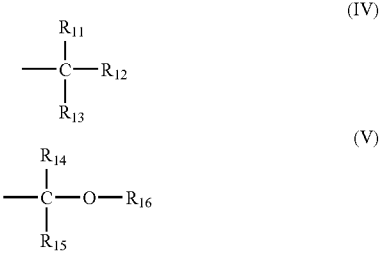

wherein $R_{11}$, $R_{12}$, and $R_{13}$ each independently represents an optionally substituted alkyl group, an optionally substituted cycloalkyl group, an optionally substituted alkenyl group, an optionally substituted aralkyl group, or an optionally substituted aryl group, wherein $R_{14}$ and $R_{15}$ each independently represents a hydrogen atom or an optionally substituted alkyl group; $R_{16}$ represents an optionally substituted alkyl group, an optionally substituted cycloalkyl group, an optionally substituted aralkyl group, or an optionally substituted aryl group; and two of $R_{14}$ to $R_{16}$ may be combined together to form a ring, wherein $R_{17}$ and $R_{17a}$ each independently represents a hydrogen atom, a halogen atom, a cyano group, or an optionally substituted alkyl group; $R_{18}$ represents —$C(R_{18d})(R_{18e})(R_{18f})$ or —$C(R_{18d'})(R_{18e'})(OR_{18g})$; $R_{18d}$ to $R_{18f}$ each independently represents an optionally substituted alkyl group, an optionally substituted cycloalkyl group, an optionally substituted alkenyl group, an optionally substituted aralkyl group, or an optionally substituted aryl group; $R_{18d'}$ and $R_{18e'}$ each represents a hydrogen atom, an optionally substituted alkyl group, an optionally substituted cycloalkyl group, an optionally substituted alkenyl group, an optionally substituted aralkyl group, or an optionally substituted aryl group; $R_{18g}$ represents an optionally substituted alkyl group, an optionally substituted cycloalkyl group, an optionally substituted aralkyl group, or an optionally substituted aryl group; and two of $R_{18d}$, $R_{18e}$ and $R_{18f}$, or two of $R_{18d'}$, $R_{18e'}$ and $R_{18g}$, may be combined together to form a ring.

53. The photosensitive resin composition according to any one of claims 44 to 47, wherein the resin (A) further comprises at least one repeating unit represented by the following general formula (III) and (VII):

(III)

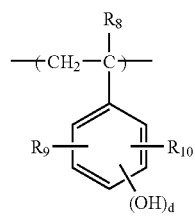

(VII)

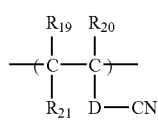

wherein $R_8$ represents a hydrogen atom, a halogen atom, a cyano group, or an optionally substituted alkyl group; $R_9$ and $R_{10}$ each independently represents a hydrogen atom, a halogen atom, a cyano group, an optionally substituted alkyl group, an optionally substituted cycloalkyl group, an optionally substituted alkoxy group, an optionally substituted acyl group, an optionally substituted acyloxy group, an optionally substituted alkenyl group, an optionally substituted aryl group, or an optionally substituted aralkyl group; and d represents 0 or 1, wherein $R_{19}$ and $R_{20}$ each independently represents a hydrogen atom, a halogen atom, a cyano group, or an optionally substituted alkyl group; $R_{21}$ represents a hydrogen atom, a halogen atom, a cyano group, an optionally substituted alkyl group, or a -D-CN group; and D represents a single bond or a divalent connecting group.

54. The photosensitive resin composition according to any one of claims 44 to 47, wherein the resin (A) further comprises at least one of repeating units represented by the following general formulae (VIII) to (XVII):

(VIII)

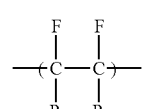

(IX)

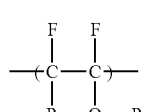

(X)

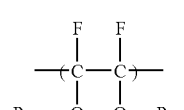

(XI)

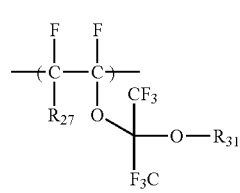

-continued (XII)

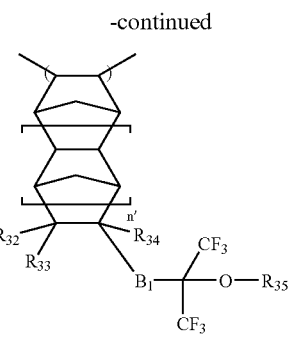

(XIII)

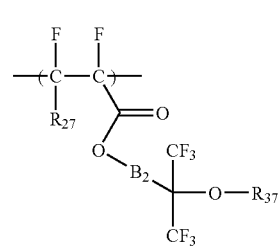

(XIV)

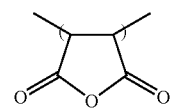

(XV)

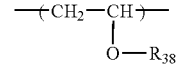

(XVI)

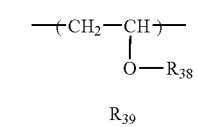

(XVII)

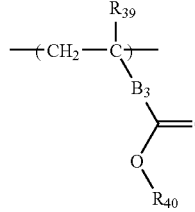

wherein $R_{25}$, $R_{26}$, and $R_{27}$ each independently represents a hydrogen atom, a fluorine atom, an optionally substituted alkyl group, an optionally substituted cycloalkyl group, or an optionally substituted aryl group; $R_{28}$, $R_{29}$, and $R_{30}$ each independently represents an optionally substituted alkyl group, an optionally substituted cycloalkyl group, or an optionally substituted aryl group; $R_{25}$ and $R_{26}$, $R_{27}$ and $R_{28}$, and $R_{29}$ and $R_{30}$ may be respectively taken together to form a ring; $R_{31}$, $R_{35}$, $R_{37}$, $R_{40}$, and $R_{44}$ each independently represents a hydrogen atom, an optionally substituted alkyl group, an optionally substituted cycloalkyl group, an optionally substituted acyl group, or an optionally substituted alkoxycarbonyl group; $R_{32}$, $R_{33}$, $R_{34}$, $R_{41}$, $R_{42}$, and $R_{43}$ each independently represents a hydrogen atom, a halogen atom, an optionally substituted alkyl group, or an optionally substituted alkoxy group; $R_{39}$ represents a hydrogen atom, a halogen atom, a cyano group, or an optionally substituted alkyl group; $R_{38}$ represents an optionally substituted alkyl group, an optionally substituted cycloalkyl group, an optionally substituted aralkyl group, or an optionally substituted aryl group; $B_1$ and $B_2$ each represents a single bond or a divalent connecting group; $B_3$ represents a divalent connecting group; and n' represents 0 or 1.

55. The photosensitive resin composition according to any one of claims 44 to 47, wherein a metal content in the resin is 100 ppb or less with respect to each metal.

56. The photosensitive resin composition according to any one of claims 44 to 47, wherein the resin has an acid value of from $0.2 \times 10^{-3}$ to $4.4 \times 10^{-3}$ mol/g.

57. The photosensitive resin composition according to any one of claims 44 to 47, wherein the resin has a weight average molecular weight of from 3,000 to 50,000.

58. The photosensitive resin composition according to any one of claims 44 to 47, wherein the resin has a degree of distribution of 1.7 or less.

59. The photosensitive resin composition according to any one of claims 44 to 47, wherein the resin has a resin of a molecular weight of 1,000 or less in an amount of 10% or less.

* * * * *

UNITED STATES PATENT AND TRADEMARK OFFICE
CERTIFICATE OF CORRECTION

PATENT NO. : 7,108,951 B2
APPLICATION NO. : 10/373170
DATED : September 19, 2006
INVENTOR(S) : Tomoya Sasaki et al.

Page 1 of 1

It is certified that error appears in the above-identified patent and that said Letters Patent is hereby corrected as shown below:

IN THE CLAIMS:

Claim 1, column 128, lines 20-28, delete the following formula (3):

(3)

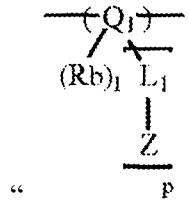

" "

and insert the following corrected formula (3)

(3)

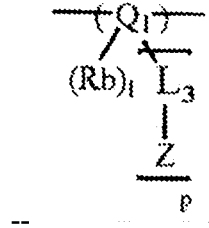

-- --

Signed and Sealed this
Seventh Day of February, 2012

David J. Kappos
*Director of the United States Patent and Trademark Office*